US012641936B2

(12) United States Patent
Yamazaki et al.

(10) Patent No.: US 12,641,936 B2
(45) Date of Patent: May 26, 2026

(54) DISPLAY UNIT, DISPLAY MODULE, ELECTRONIC DEVICE, AND METHOD FOR MANUFACTURING THE DISPLAY UNIT

(71) Applicant: SEMICONDUCTOR ENERGY LABORATORY CO., LTD., Atsugi (JP)

(72) Inventors: Shunpei Yamazaki, Tokyo (JP); Koji Kusunoki, Isehara (JP); Shingo Eguchi, Atsugi (JP); Takayuki Ikeda, Atsugi (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 888 days.

(21) Appl. No.: 17/773,929

(22) PCT Filed: Oct. 29, 2020

(86) PCT No.: PCT/IB2020/060127
§ 371 (c)(1),
(2) Date: May 3, 2022

(87) PCT Pub. No.: WO2021/094862
PCT Pub. Date: May 20, 2021

(65) Prior Publication Data
US 2022/0367775 A1     Nov. 17, 2022

(30) Foreign Application Priority Data

Nov. 12, 2019   (JP) ................................. 2019-205030
Dec. 5, 2019   (JP) ................................. 2019-220314

(51) Int. Cl.
*H10H 20/857*      (2025.01)
*H10H 20/01*      (2025.01)
(Continued)

(52) U.S. Cl.
CPC .......... *H10H 20/857* (2025.01); *H10H 20/01* (2025.01); *H10H 20/8514* (2025.01);
(Continued)

(58) Field of Classification Search
CPC .. H10H 20/857; H10H 20/851; H10H 20/824; H10H 20/0364; H10H 20/0361;
(Continued)

(56) References Cited

U.S. PATENT DOCUMENTS 8,780,023 B2   7/2014   Ootorii
9,530,856 B2   12/2016   Miyairi
(Continued)

FOREIGN PATENT DOCUMENTS

CN       102737578 A      10/2012
CN       109004078 A      12/2018
(Continued)

OTHER PUBLICATIONS

Taiwanese Office Action (Application No. 109138173) Dated Jun. 25, 2024.
(Continued)

*Primary Examiner* — Matthew C Landau
(74) *Attorney, Agent, or Firm* — Fish & Richardson P.C.

(57) ABSTRACT

A display unit with high resolution is provided. A display unit with high display quality is provided. A display unit includes a transistor, a light-emitting diode, a first conductive layer over the transistor and electrically connected to the transistor, a second conductive layer over the first conductive layer and electrically connected to the light-emitting diode, a first insulating layer over the transistor, and a second insulating layer over the first insulating layer. The top surface of the first conductive layer is substantially level with the top surface of the first insulating layer, and the bottom surface of the second conductive layer is substan-
(Continued)

tially level with the bottom surface of the second insulating layer. The first insulating layer and the second insulating layer are bonded to each other, and the first conductive layer and the second conductive layer are bonded to each other.

6 Claims, 21 Drawing Sheets

(51) Int. Cl.

| | |
|---|---|
| *H10H 20/851* | (2025.01) |
| *H10H 29/14* | (2025.01) |
| *H10H 29/45* | (2025.01) |
| *H10K 59/127* | (2023.01) |

(52) U.S. Cl.

CPC ....... *H10H 29/142* (2025.01); *H10H 20/0361* (2025.01); *H10H 20/0364* (2025.01); *H10H 29/45* (2025.01); *H10K 59/127* (2023.02)

(58) Field of Classification Search

CPC .. H10H 29/142; H10H 20/8514; H10H 20/01; H10H 29/24; H10H 29/30; H10H 29/39; H10H 29/45; H10D 86/451; H10D 86/441; H10D 86/021; H10D 86/60; H10D 86/423; H10D 30/6757; H10D 30/6734; G06F 3/0412; H01L 25/167; H01L 25/0753; H10K 59/127

See application file for complete search history.

(56) References Cited

U.S. PATENT DOCUMENTS

| | | | | |
|---|---|---|---|---|
| 10,068,888 | B2 * | 9/2018 | Zhang et al. | |
| 10,693,013 | B2 | 6/2020 | Toriumi et al. | |
| 10,984,703 | B2 | 4/2021 | Iwaki et al. | |
| 11,217,703 | B2 | 1/2022 | Toriumi et al. | |
| 11,222,583 | B2 | 1/2022 | Takahashi et al. | |
| 11,417,687 | B2 | 8/2022 | Yamazaki et al. | |
| 2012/0256814 | A1 * | 10/2012 | Ootorii | G09G 3/3208 |
| | | | | 345/82 |
| 2013/0092930 | A1 | 4/2013 | Kimura | |
| 2014/0306260 | A1 | 10/2014 | Yamazaki et al. | |
| 2014/0367705 | A1 | 12/2014 | Bibl et al. | |

| | | | | |
|---|---|---|---|---|
| 2015/0014716 | A1 | 1/2015 | von Malm | |
| 2016/0218219 | A1 | 7/2016 | Asami et al. | |
| 2016/0372514 | A1 | 12/2016 | Chang et al. | |
| 2017/0338818 | A1 * | 11/2017 | Harada | H10D 86/423 |
| 2018/0019233 | A1 | 1/2018 | Chang et al. | |
| 2018/0095559 | A1 | 4/2018 | Yamazaki et al. | |
| 2018/0277528 | A1 | 9/2018 | Hasegawa et al. | |
| 2019/0123096 | A1 | 4/2019 | Fu et al. | |
| 2019/0148611 | A1 | 5/2019 | He et al. | |
| 2019/0326329 | A1 | 10/2019 | Fan et al. | |
| 2019/0371868 | A1 * | 12/2019 | Chaji | H01L 21/6835 |
| 2020/0403028 | A1 | 12/2020 | Kusunoki et al. | |
| 2021/0050500 | A1 | 2/2021 | Kusunoki et al. | |
| 2021/0118855 | A1 | 4/2021 | Kusunoki et al. | |
| 2021/0143209 | A1 | 5/2021 | Yamazaki et al. | |
| 2021/0158747 | A1 | 5/2021 | Kusunoki et al. | |
| 2021/0159222 | A1 | 5/2021 | Yamazaki et al. | |
| 2021/0217805 | A1 | 7/2021 | Kusunoki et al. | |
| 2021/0327865 | A1 | 10/2021 | Yamazaki et al. | |
| 2021/0366368 | A1 | 11/2021 | Watanabe et al. | |
| 2022/0005790 | A1 | 1/2022 | Watanabe et al. | |
| 2022/0037532 | A1 | 2/2022 | Toriumi et al. | |
| 2022/0045039 | A1 | 2/2022 | Tsukamoto et al. | |
| 2024/0322046 | A1 | 9/2024 | Toriumi. et al. | |

FOREIGN PATENT DOCUMENTS

| | | |
|---|---|---|
| EP | 3557618 A | 10/2019 |
| JP | 2012-227514 A | 11/2012 |
| JP | 2015-144251 A | 8/2015 |
| JP | 2018-074561 A | 5/2018 |
| KR | 2017-0137125 A | 12/2017 |
| KR | 2019-0079147 A | 7/2019 |
| KR | 2019-0122150 A | 10/2019 |
| TW | 201303832 | 1/2013 |
| TW | I505249 | 10/2015 |
| TW | 201937254 | 9/2019 |
| WO | WO-2015/097633 | 7/2015 |
| WO | WO-2016/166628 | 10/2016 |

OTHER PUBLICATIONS

International Search Report (Application No. PCT/IB2020/060127) Dated Feb. 9, 2021.
Written Opinion (Application No. PCT/IB2020/060127) Dated Feb. 9, 2021.

* cited by examiner

FIG. 14A
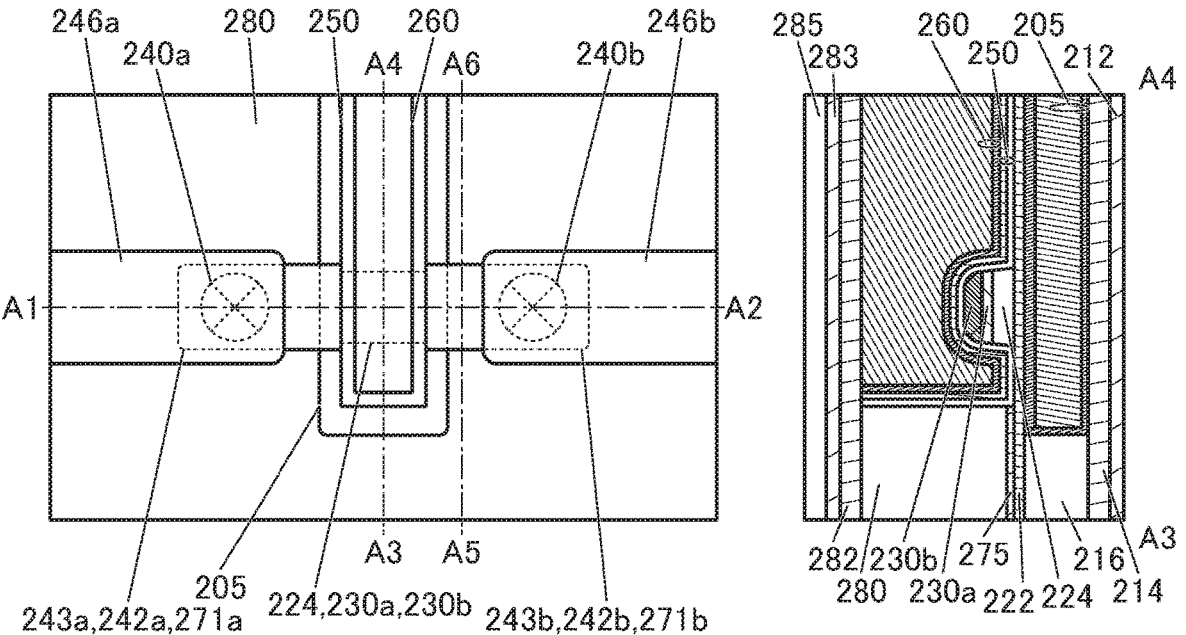
FIG. 14C
FIG. 14B
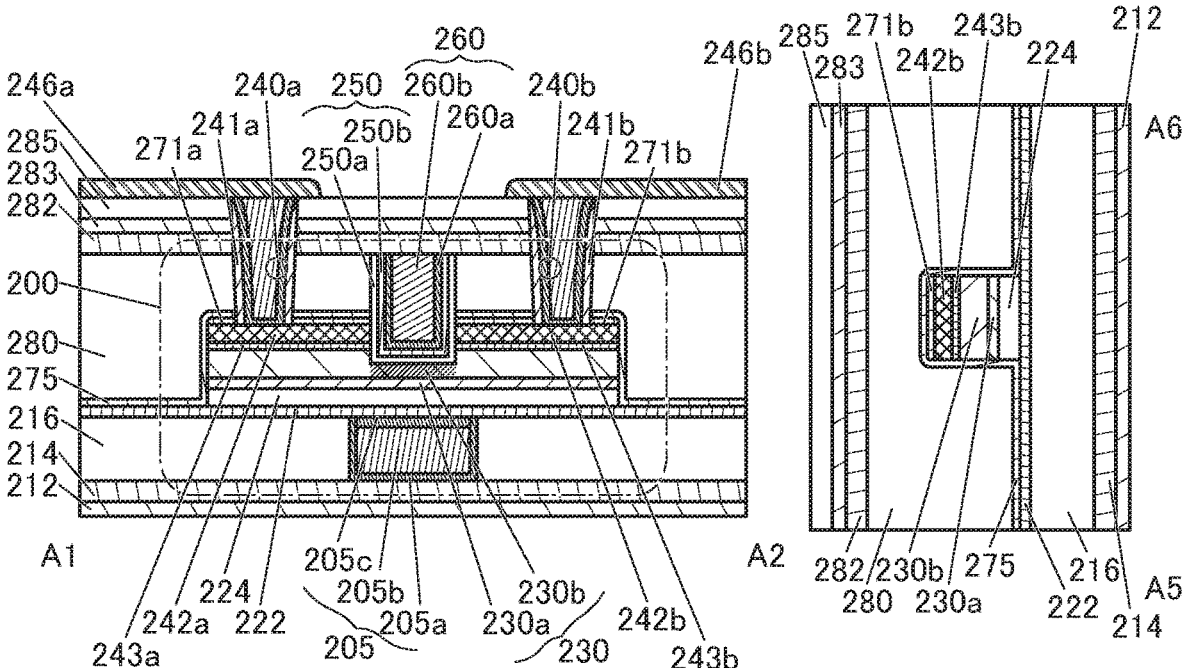
FIG. 14D

FIG. 21A
9101
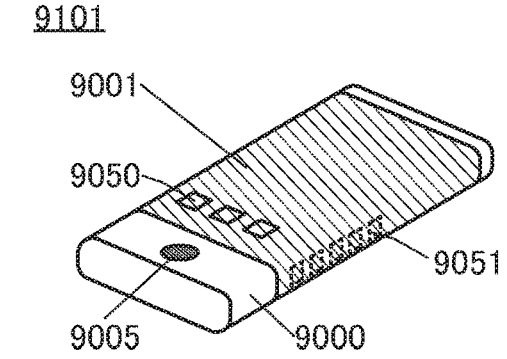
FIG. 21C
9200
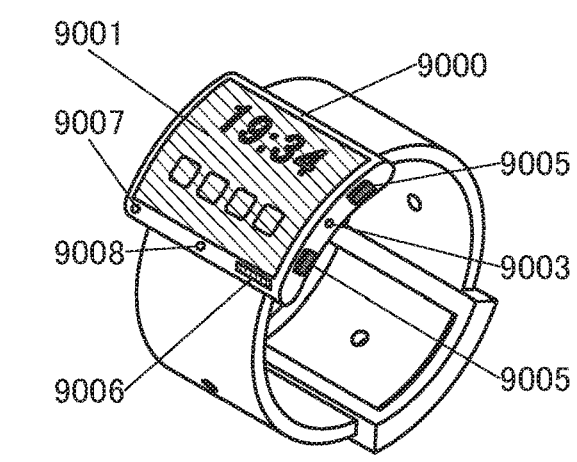
FIG. 21B
9102
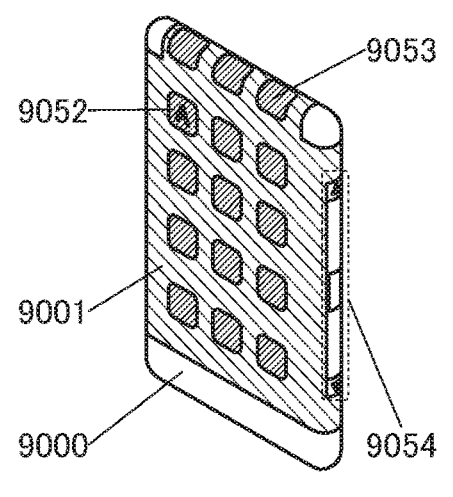
FIG. 21D
9201
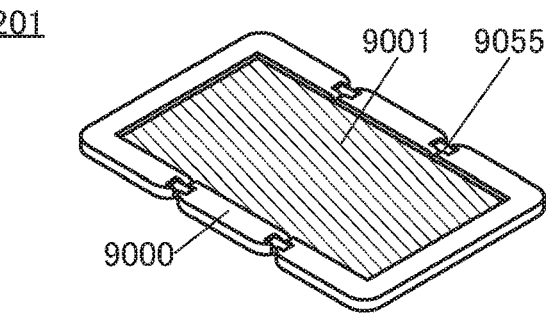
FIG. 21E
9201
FIG. 21F
9201
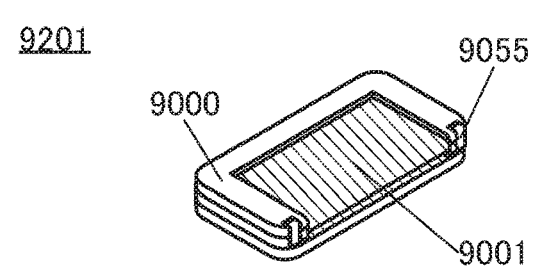

DISPLAY UNIT, DISPLAY MODULE, ELECTRONIC DEVICE, AND METHOD FOR MANUFACTURING THE DISPLAY UNIT

CROSS REFERENCE TO RELATED APPLICATIONS

This application is a U.S. National Phase Application under 35 U.S.C. § 371 of International Application PCT/IB2020/060127, filed on Oct. 29, 2020, which is incorporated by reference and claims the benefit of foreign priority applications filed in Japan on Nov. 12, 2019, as Application No. 2019-205030 and on Dec. 5, 2019, as Application No. 2019-220314.

TECHNICAL FIELD

One embodiment of the present invention relates to a display unit, a display module, an electronic device, and a manufacturing method thereof.

Note that one embodiment of the present invention is not limited to the above technical field. Examples of the technical field of one embodiment of the present invention include a semiconductor device, a display unit, a light-emitting unit, a power storage device, a memory device, an electronic device, a lighting device, an input device (e.g., a touch sensor), an input/output device (e.g., a touch panel), a method for driving any of them, and a method for manufacturing any of them.

BACKGROUND ART

In recent years, a display unit including a micro light-emitting diode (micro LED) as a display device (also referred to as a display element) has been proposed (e.g., Patent Document 1). The display unit including micro LEDs as display devices has advantages of high luminance, high contrast, a long lifetime, and the like, and has been actively developed as a next-generation display device.

REFERENCE

[Patent Document 1] United States Patent Application Publication No. 2014/0367705

DISCLOSURE OF INVENTION

The time taken to mount LED chips on a display unit including micro LEDs as display devices is extremely long, so that manufacturing cost reduction is needed. In a pick-and-place method, for example, red (R), green (G), and blue (B) LEDs are formed on respective wafers, and the LEDs are cut out one by one and mounted on a circuit board. Therefore, as the number of pixels of the display unit increases, the number of LEDs to be mounted increases and thus the time taken for mounting becomes longer. Moreover, as the resolution of the display unit becomes higher, it becomes more difficult to mount LEDs.

An object of one embodiment of the present invention is to provide a display unit with high resolution. An object of one embodiment of the present invention is to provide a display unit with high resolution. An object of one embodiment of the present invention is to provide a display unit with high display quality. An object of one embodiment of the present invention is to provide a display unit with low power consumption. An object of one embodiment of the present invention is to provide a highly reliable display unit.

An object of one embodiment of the present invention is to reduce manufacturing cost of a display unit including micro LEDs as display devices. An object of one embodiment of the present invention is to manufacture a display unit including micro LEDs as display devices with a high yield.

Note that the descriptions of these objects does not preclude the existence of other objects. One embodiment of the present invention does not need to achieve all of these objects. Other objects can be derived from the description of the specification, the drawings, and the claims.

A display unit one embodiment of the present invention includes a transistor, a light-emitting diode, a first conductive layer, a second conductive layer, a first insulating layer, and a second insulating layer. The transistor is electrically connected to the first conductive layer. The light-emitting diode is electrically connected to the second conductive layer. The first conductive layer is positioned over the transistor. The first insulating layer is positioned over the transistor. The second conductive layer is positioned over the first conductive layer. The second insulating layer is positioned over the first insulating layer. The light-emitting diode is positioned over the second insulating layer. A surface of the first conductive layer on the second conductive layer side is substantially level with a surface of the first insulating layer on the second insulating layer side. A surface of the second conductive layer on the first conductive layer side is substantially level with a surface of the second insulating layer on the first insulating layer side. The first insulating layer and the second insulating layer are directly bonded to each other. The first conductive layer and the second conductive layer are directly bonded to each other.

The display unit of one embodiment of the present invention preferably further includes a third insulating layer and a fourth insulating layer. The third insulating layer is preferably positioned between the transistor and the first insulating layer. The fourth insulating layer is preferably positioned between the light-emitting diode and the second insulating layer. Each of the first insulating layer and the second insulating layer preferably includes a silicon oxide film. Each of the third insulating layer and the fourth insulating layer preferably includes at least one of an aluminum oxide film, a hafnium oxide film, and a silicon nitride film.

An angle between a surface of the first conductive layer on the transistor side and a side surface of the first conductive layer is preferably greater than 0° and less than or equal to 90° or greater than 0° and less than 90°. An angle between a surface of the second conductive layer on the transistor side and a side surface of the second conductive layer is preferably greater than or equal to 90° and less than 180° or greater than 90° and less than 180°. Note that a boundary between the two conductive layers can be presumed to be a boundary surface of the bonding by cross-sectional observation of the display unit of one embodiment of the present invention because of the different tapered shapes of the two conductive layers.

The display unit of one embodiment of the present invention preferably further includes a fifth insulating layer. The transistor preferably includes a metal oxide layer and a gate electrode. The metal oxide layer preferably includes a channel formation region. A top surface of the gate electrode is preferably substantially level with a top surface of the fifth insulating layer.

In the case where the display unit of one embodiment of the present invention includes the fifth insulating layer, the transistor preferably includes a metal oxide layer, a gate insulating layer, a gate electrode, a third conductive layer, and a fourth conductive layer. The metal oxide layer preferably includes a channel formation region. The metal oxide layer preferably includes a first region overlapping with the third conductive layer, a second region overlapping with the fourth conductive layer, and a third region between the first region and the second region. The third conductive layer and the fourth conductive layer are preferably positioned over the metal oxide layer and apart from each other. The fifth insulating layer is preferably positioned over the third conductive layer and the fourth conductive layer. The fifth insulating layer preferably includes an opening overlapping with the third region. The gate insulating layer is preferably positioned inside the opening and overlaps with a side surface of the fifth insulating layer and a top surface of the third region. The gate electrode is preferably positioned inside the opening and overlaps with the side surface of the fifth insulating layer and the top surface of the third region with the gate insulating layer therebetween.

The display unit of one embodiment of the present invention preferably further includes a driving circuit. The driving circuit preferably includes a circuit transistor. The circuit transistor preferably includes a channel formation region in a semiconductor substrate. It is preferable that the transistor, the light-emitting diode, the first conductive layer, the second conductive layer, the first insulating layer, and the second insulating layer be positioned over the semiconductor substrate.

A display unit of one embodiment of the present invention includes a first transistor, a second transistor, a light-emitting diode, a first conductive layer, a second conductive layer, a first insulating layer, and a second insulating layer. The first transistor includes a channel formation region in a semiconductor substrate. The second transistor includes a metal oxide layer. The metal oxide layer includes a channel formation region. The second transistor is electrically connected to the first conductive layer. The light-emitting diode is electrically connected to the second conductive layer. The second transistor is positioned over the first transistor. The first conductive layer is positioned over the second transistor. The first insulating layer is positioned over the second transistor. The second conductive layer is positioned over the first conductive layer. The second insulating layer is positioned over the first insulating layer. The light-emitting diode is positioned over the second insulating layer. A surface of the first conductive layer on the second conductive layer side is substantially level with a surface of the first insulating layer on the second insulating layer side. A surface of the second conductive layer on the first conductive layer side is substantially level with a surface of the second insulating layer on the first insulating layer side. The first insulating layer and the second insulating layer are directly bonded to each other. The first conductive layer and the second conductive layer are directly bonded to each other.

The first conductive layer and the second conductive layer preferably contain the same metal. The metal is preferably gold, aluminum, tungsten, or copper.

The light-emitting diode is preferably a micro light-emitting diode. In addition, the light-emitting diode preferably includes a compound containing a Group 13 element and a Group 15 element. In addition, the light-emitting diode preferably contains gallium nitride.

The display unit of one embodiment of the present invention may include a first light-emitting diode and a second light-emitting diode that emit light of different colors. In that case, a transistor electrically connected to the first light-emitting diode and a transistor electrically connected to the second light-emitting diode may have different channel lengths and/or different channel widths.

Alternatively, the display unit of one embodiment of the present invention may include a plurality of light-emitting diodes that emit light of the same color in the pixels of each color.

The display unit of one embodiment of the present invention preferably further includes a functional layer. The functional layer is preferably positioned over the light-emitting diode. Light emitted from the light-emitting diode is preferably extracted to the outside of the display unit through the functional layer. The functional layer preferably includes one or both of a coloring layer and a color conversion layer. The color conversion layer preferably includes a quantum dot.

One embodiment of the present invention is a display module including the display unit of any of the above structures. The display module may be provided with a connector such as a flexible printed circuit board (hereinafter referred to as an FPC) or a tape carrier package (TCP). In addition, an integrated circuit (IC) may be mounted on the display module by a chip on glass (COG) method, a chip on film (COF) method, or the like.

One embodiment of the present invention is an electronic device that includes the display module and at least one of an antenna, a battery, a housing, a camera, a speaker, a microphone, and an operation button.

One embodiment of the present invention is an electronic device that includes the display unit, an optical member, a frame, and a housing. The housing includes a touch sensor.

One embodiment of the present invention is a method for manufacturing a display unit, including the steps of: forming a plurality of transistors in a matrix over a first substrate; forming a plurality of first conductive layers each of which is electrically connected to at least one of the plurality of transistors, over the plurality of transistors; forming a plurality of light-emitting diodes in a matrix over a second substrate; forming a plurality of second conductive layers each of which is electrically connected to at least one of the plurality of light-emitting diodes, over the plurality of light-emitting diodes; and bonding the first substrate and the second substrate by directly bonding each of the plurality of first conductive layers to at least one of the plurality of second conductive layers so that each of the plurality of transistors is electrically connected to at least one of the plurality of light-emitting diodes. Planarization treatment is preferably performed at least once in the step of forming the plurality of transistors.

In the method for manufacturing a display unit of one embodiment of the present invention, at least one of a coloring layer, a color conversion layer, and a touch sensor may be formed over a third substrate, the first substrate and the second substrate may be bonded to each other, then the second substrate may be separated, and the third substrate may be bonded to a surface exposed by the separation of the second substrate.

Alternatively, in the method for manufacturing a display unit of one embodiment of the present invention, at least one of a coloring layer, a color conversion layer, and a touch sensor may be formed over a third substrate, the second substrate may be polished to reduce a thickness of the second substrate after the first substrate and the second substrate are bonded to each other, and the third substrate may be bonded to a polished surface of the second substrate.

One embodiment of the present invention is a method for manufacturing a display unit, including the steps of: forming a plurality of first transistors each of which comprises a channel formation region in a first substrate; forming a plurality of second transistors in a matrix over the plurality of first transistors; forming a plurality of first conductive layers each of which is electrically connected to at least one of the plurality of second transistors, over the plurality of second transistors; forming a plurality of light-emitting diodes in a matrix over a second substrate; forming a plurality of second conductive layers each of which is electrically connected to at least one of the plurality of light-emitting diodes, over the plurality of light-emitting diodes; bonding the first substrate and the second substrate by directly bonding each of the plurality of first conductive layers to at least one of the plurality of second conductive layers so that each of the plurality of second transistors is electrically connected to at least one of the plurality of light-emitting diodes; then separating the second substrate; and forming at least one of a coloring layer, a color conversion layer, and a light-blocking layer over a surface exposed by the separation of the second substrate. Planarization treatment is preferably performed at least once in the step of forming the plurality of second transistors.

At least one of the plurality of light-emitting diodes is preferably a micro light-emitting diode. At least one of the plurality of transistors preferably includes metal oxide in a channel formation region.

According to one embodiment of the present invention, a display unit with high resolution can be provided. According to one embodiment of the present invention, a display unit with high resolution can be provided. According to one embodiment of the present invention, a display unit with high display quality can be provided. According to one embodiment of the present invention, a display unit with low power consumption can be provided. According to one embodiment of the present invention, a highly reliable display unit can be provided.

According to one embodiment of the present invention, manufacturing cost of a display unit including micro LEDs as display devices can be reduced. According to one embodiment of the present invention, a display unit including micro LEDs as display devices with a high yield can be manufactured.

Note that the descriptions of these effects do not preclude the existence of other effects. One embodiment of the present invention does not necessarily have all of these effects. Other effects can be derived from the description of the specification, the drawings, and the claims.

BRIEF DESCRIPTION OF DRAWINGS

FIG. 8 is a cross-sectional view illustrating an example of a display unit.

FIG. 9 is a cross-sectional view illustrating an example of a display unit.

FIGS. 14A to 14D are a top view and cross-sectional views illustrating an example of a transistor.

FIGS. 21A to 21F each illustrate an example of an electronic device.

BEST MODE FOR CARRYING OUT THE INVENTION

Figure 1:
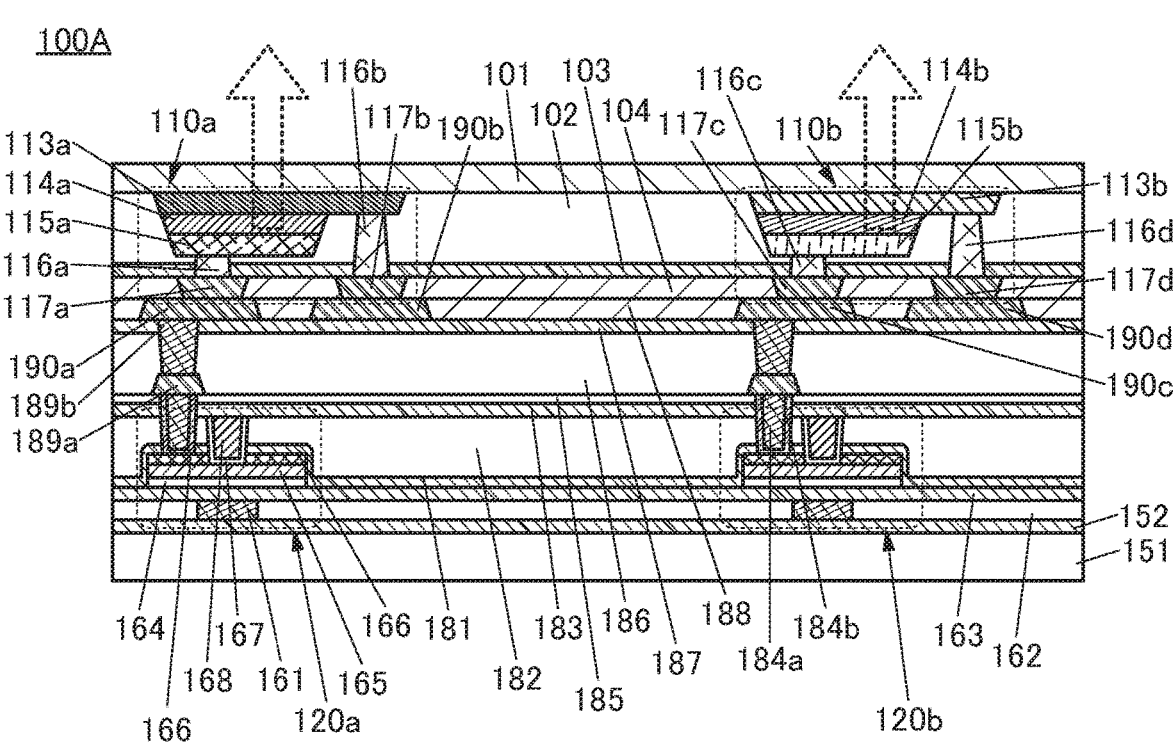
FIG. 1 is a cross-sectional view illustrating an example of a display unit.

Embodiments will be described in detail with reference to the drawings. Note that the present invention is not limited to the following description, and it will be readily appreciated by those skilled in the art that modes and details of the present invention can be modified in various ways without departing from the spirit and scope of the present invention. Therefore, the present invention should not be construed as being limited to the description in the following embodiments and examples.

Note that in structures of the present invention described below, the same portions or portions having similar functions are denoted by the same reference numerals in different drawings, and the description thereof is not repeated. The same hatching pattern is used for portions having similar functions, and the portions are not denoted by specific reference numerals in some cases.

The position, size, range, or the like of each component illustrated in drawings does not represent the actual position, size, range, or the like in some cases for easy understanding. Therefore, the disclosed invention is not necessarily limited to the position, size, range, or the like disclosed in the drawings.

Note that the term "film" and the term "layer" can be interchanged with each other depending on the case or circumstances. For example, the term "conductive layer" can be replaced with the term "conductive film". As another example, the term "insulating film" can be replaced with the term "insulating layer".

Embodiment 1

In this embodiment, a display unit of one embodiment of the present invention will be described with reference to FIG. 1, FIGS. 2A and 2B, FIG. 3, FIG. 4, FIGS. 5A and 5B, FIGS. 6A and 6B, and FIG. 7.

The display unit of this embodiment includes a plurality of light-emitting diodes that are display devices, and a plurality of transistors for driving the display devices. The plurality of light-emitting diodes are disposed in a matrix over a substrate having a transmitting property with respect to visible light. Each of the plurality of transistors is electrically connected to at least one of the plurality of light-emitting diodes. The plurality of light-emitting diodes are positioned closer to the substrate than the plurality of transistors. The plurality of light-emitting diodes emit light to the substrate side.

The display unit of this embodiment is formed by bonding a plurality of transistors formed over a substrate and a plurality of light-emitting diodes formed over a different substrate.

Since the plurality of light-emitting diodes and the plurality of transistors are bonded to each other at one time in the method for manufacturing the display unit of this embodiment, even when the display unit is manufactured so as to have a large number of pixels or high definition, the manufacturing time of the display unit can be shortened and the degree of difficulty in the manufacture can be lowered as compared to those in the case of a method in which light-emitting diodes are mounted on a circuit board one by one.

As the method for manufacturing the display unit of one embodiment of the present invention, first, a plurality of transistors are formed in a matrix over a first substrate, and a first insulating layer and a plurality of first conductive layers are formed over the plurality of transistors. Each of the plurality of first conductive layers is electrically connected to at least one of the plurality of transistors. Here, the first insulating layer and the first conductive layers are formed so that the top surface of the first insulating layer and the top surfaces of the first conductive layers are level with each other. A plurality of light-emitting diodes are formed in a matrix over a second substrate, and a second insulating layer and a plurality of second conductive layers are formed over the plurality of light-emitting diodes. Each of the plurality of second conductive layers is electrically connected to at least one of the plurality of light-emitting diodes. Here, the second insulating layer and the second conductive layers are formed so that the top surface of the second insulating layer and the top surfaces of the second conductive layers are level with each other.

The first substrate and the second substrate are bonded to each other so that each of the plurality of transistors is electrically connected to at least one of the plurality of light-emitting diodes. By bonding the first substrate and the second substrate, the plurality of light-emitting diodes and the plurality of transistors can be bonded to each other at one time. Specifically, each of the plurality of first conductive layers is directly bonded to at least one of the plurality of second conductive layers. Thus, the transistor can be electrically connected to the light-emitting diode through the first conductive layer and the second conductive layer. The first conductive layer and the second conductive layer preferably contain the same metal element as their main components, and further preferably, the first conductive layer and the second conductive layer are formed using the same material. Accordingly, the bonding strength between the first conductive layer and the second conductive layer can be increased. The first insulating layer is directly bonded to the second insulating layer. The first insulating layer and the second insulating layer are preferably formed using the same material, and in particular, a silicon oxide film is preferably used as each of the first insulating layer and the second insulating layer. The bonding strength between the first insulating layer and the second insulating layer can be increased because of hydrophilic bonding through a hydroxyl group (OH group).

In the manufactured display unit, a surface of the first conductive layer on the second conductive layer side is substantially level with a surface of the first insulating layer on the second insulating layer side. A surface of the second conductive layer on the first conductive layer side is substantially level with a surface of the second insulating layer on the first insulating layer side. Note that in this specification and the like, "A is substantially level with B" includes the case where A is level with B and the case where the levels of A and B are different owing to an manufacturing error although A and B are formed so as to be level with each other.

It is preferable that the display unit of one embodiment of the present invention further include a third insulating layer and a fourth insulating layer. The third insulating layer is preferably positioned between the transistor and the first insulating layer. The fourth insulating layer is preferably positioned between the light-emitting diode and the second insulating layer. As each of the third and fourth insulating layers, it is preferable to use a film in which one or both of hydrogen and oxygen are less likely to be diffused than in the first and second insulating layers. Each of the third and fourth insulating layers preferably includes at least one of an aluminum oxide film, a hafnium oxide film, and a silicon nitride film. With the use of a film in which one or both of hydrogen and oxygen are less likely to be diffused than in a silicon oxide film, diffusion or the like of impurities from one of the stacked structure on the first substrate side and the stacked structure on the second substrate side into the other thereof can be inhibited.

The angle between a side surface and a surface on the transistor side of the first conductive layer is preferably greater than 0° and less than or equal to 90° , or greater than 0° and less than 90°. The angle between a side surface and a surface on the transistor side of the second conductive layer is preferably greater than or equal to 90° and less than 180° or greater than 90° and less than 180°. In the case where both the first conductive layer and the second conductive layer are formed over the same substrate as the transistor, the first conductive layer and the second conductive layer are often formed so that the angle between the side surface and the surface on the transistor side of each of the first conductive layer and the second conductive layer is less than or equal to 90°. Therefore, a boundary between the two conductive layers can be presumed to be a boundary surface of the bonding by cross-sectional observation of the display unit by a scanning electron microscope (SEM), a scanning transmission electron microscope (STEM), or the like because of the different tapered shapes of the two conductive layers.

The display unit of this embodiment has a function of displaying an image with the use of light-emitting diodes. In the case where a light-emitting diode, which is a self-luminous device, is used as a display device, a backlight is unnecessary and a polarizing plate is not necessarily provided in the display unit. Therefore, the display unit can have reduced power consumption and can be thin and lightweight. A display unit using light-emitting diodes as display devices can have high display quality because of its high luminance (e.g., higher than or equal to 5000 cd/m², preferably higher than or equal to 10000 cd/m²), high contrast, and large viewing angle. Furthermore, with the use of an inorganic material as a light-emitting material, the display unit can have a long lifetime and improved reliability.

In this embodiment, in particular, an example in which a micro LED is used as a light-emitting diode is described. A micro LED having a double heterojunction is described in this embodiment. Note that there is no particular limitation on the light-emitting diode, and for example, a micro LED having a quantum well junction or a nanocolumn LED may be used.

The area of a light-emitting region of the light-emitting diode is preferably less than or equal to 1 mm$^2$, further preferably less than or equal to 10000 μm$^2$, still further preferably less than or equal to 3000 μm$^2$, even further preferably less than or equal to 700 μm$^2$. The area of the region is preferably greater than or equal to 1 μm$^2$, further preferably greater than or equal to 10 μm$^2$, and still further preferably greater than or equal to 100 μm$^2$. Note that in this specification and the like, a light-emitting diode including a light-emitting region whose area is less than or equal to 10000 μm$^2$ is referred to as a micro LED in some cases.

The transistor included in the display unit preferably contains metal oxide in a channel formation region. A transistor containing metal oxide consumes less power. Thus, a combination with a micro LED can achieve a display unit with extremely reduced power consumption.

In particular, the display unit of this embodiment preferably includes a transistor in which the top surface of a gate electrode and the top surface of an insulating layer are substantially level with each other. By planarization treatment employing a chemical mechanical polishing (CMP) method or the like, for example, the top surfaces of the gate electrode and the insulating layer are planarized, whereby the top surfaces become level with each other.

A transistor with such a structure can be easily reduced in size. When the size of a transistor is reduced, the size of a pixel can be reduced, so that the resolution of the display unit can be increased.

The display unit of this embodiment can have a high resolution, and thus can be favorably used for an electronic device having a relatively small display portion. Examples of such an electronic device include a watch-type or bracelet-type information terminal device (wearable device) and a wearable device capable of being worn on a head, such as a virtual reality (VR) device such as a head mounted display, a glasses-type augmented reality (AR) device, and a mixed reality (MR) device.

[Structure Example 1 of Display Unit]

Figure 2A:
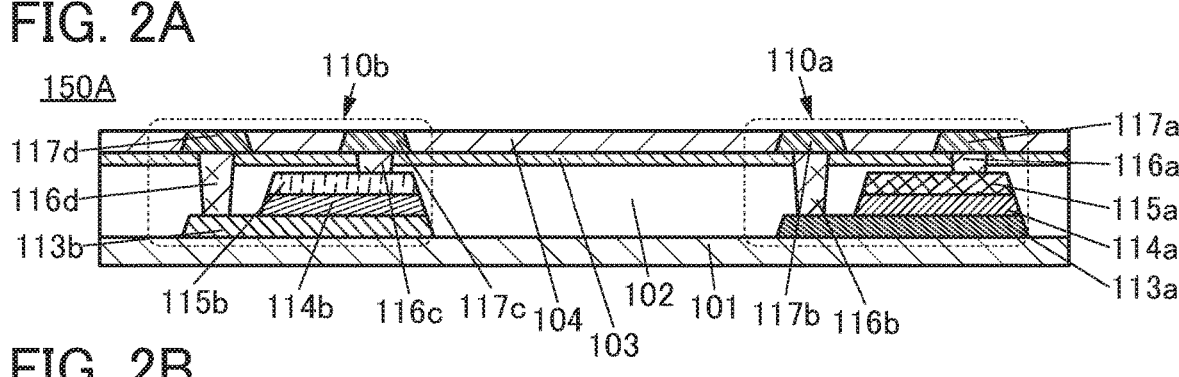
FIGS. 2A to 2C are cross-sectional views illustrating an example of a method for manufacturing a display unit.
Figure 2B:
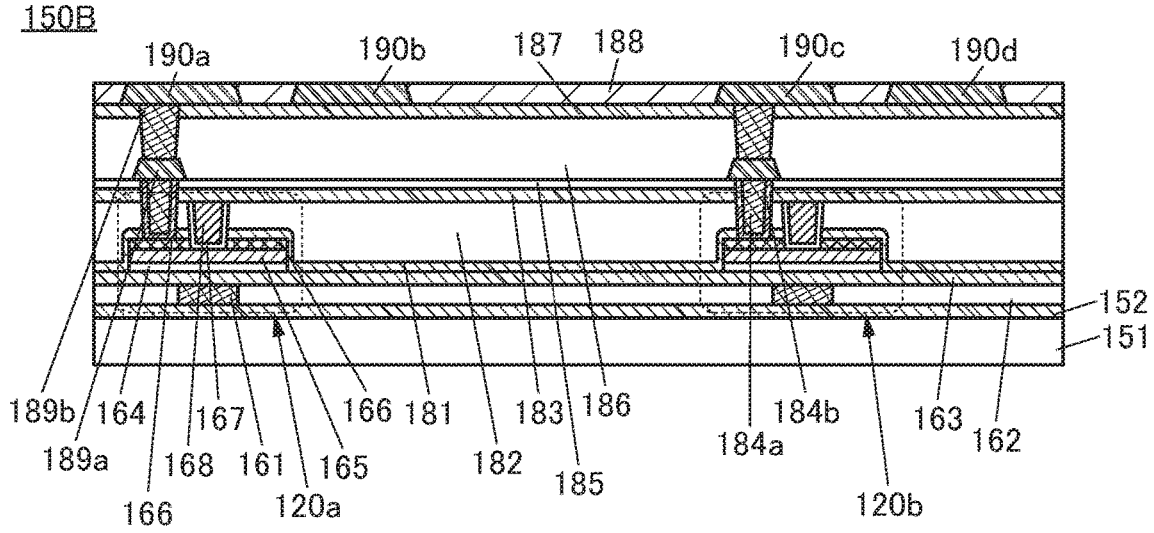
Figure 2C:
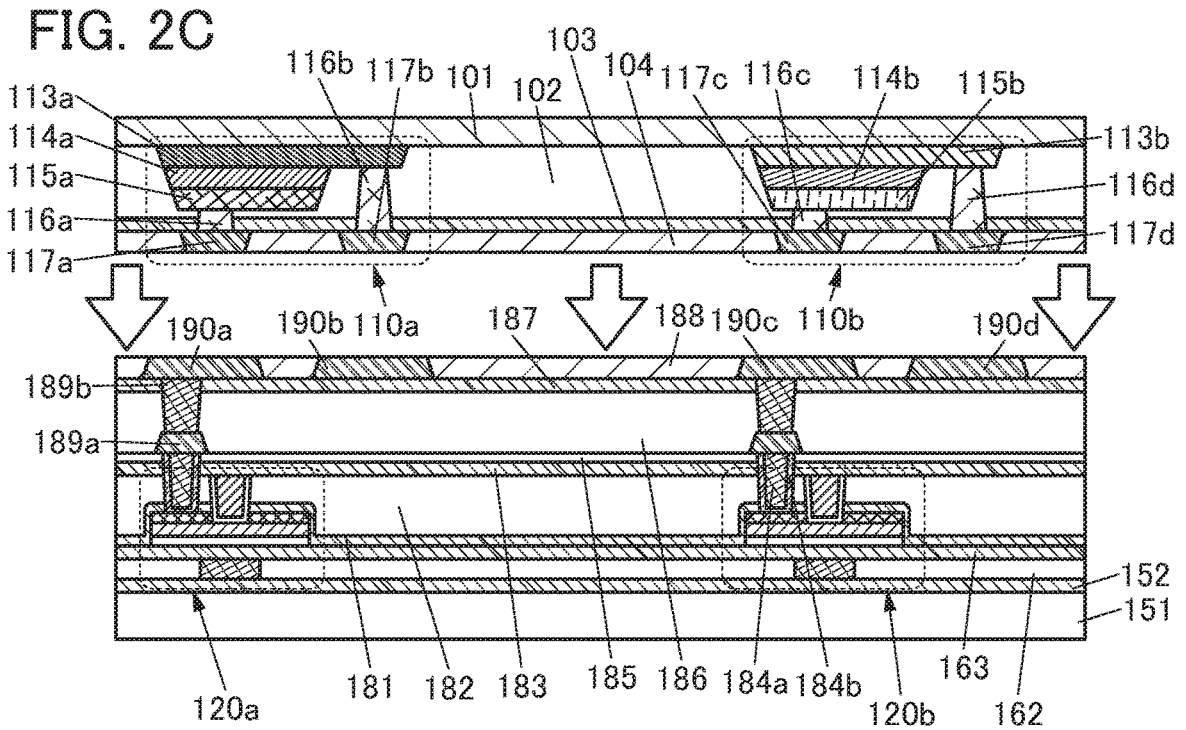

FIG. 1 is a cross-sectional view of a display unit 100A. FIGS. 2A, 2B, and 2C are cross-sectional views illustrating a method for manufacturing the display unit 100A.

The display unit 100A in FIG. 1 is formed by bonding an LED substrate 150A illustrated in FIG. 2A and a circuit board 150B illustrated in FIG. 2B to each other (see FIG. 2C).

FIG. 2A is a cross-sectional view of the LED substrate 150A.

The LED substrate 150A includes a substrate 101, a light-emitting diode 110a, a light-emitting diode 110b, an insulating layer 102, an insulating layer 103, and an insulating layer 104. Each of the insulating layers 102, 103, and 104 may have a single-layer structure or a stacked-layer structure.

The light-emitting diode 110a includes a semiconductor layer 113a, a light-emitting layer 114a, a semiconductor layer 115a, a conductive layer 116a, a conductive layer 116b, an electrode 117a, and an electrode 117b. The light-emitting diode 110b includes a semiconductor layer 113b, a light-emitting layer 114b, a semiconductor layer 115b, a conductive layer 116c, a conductive layer 116d, an electrode 117c, and an electrode 117d. Each of the layers included in the light-emitting diode may have a single-layer structure or a stacked-layer structure.

The semiconductor layer 113a is provided over the substrate 101, the light-emitting layer 114a is provided over the semiconductor layer 113a, and the semiconductor layer 115a is provided over the light-emitting layer 114a. The electrode 117a is electrically connected to the semiconductor layer 115a through the conductive layer 116a. The electrode 117b is electrically connected to the semiconductor layer 113a through the conductive layer 116b.

The semiconductor layer 113b is provided over substrate 101, the light-emitting layer 114b is provided over the semiconductor layer 113b, and the semiconductor layer 115b is provided over the light-emitting layer 114b. The electrode 117c is electrically connected to the semiconductor layer 115b through the conductive layer 116c. The electrode 117d is electrically connected to the semiconductor layer 113b through the conductive layer 116d.

The insulating layer 102 is provided to cover the substrate 101, the semiconductor layers 113a and 113b, the light-emitting layers 114a and 114b, and the semiconductor layers 115a and 115b. The insulating layer 102 preferably has a planarization function. The insulating layer 103 is provided over the insulating layer 102. The conductive layers 116a, 116b, 116c, and 116d are provided so as to fill openings formed in the insulating layers 102 and 103. It is preferable that the top surfaces of the conductive layers 116a, 116b, 116c, and 116d be substantially level with the top surface of the insulating layer 103. The insulating layer 104 is provided over the conductive layers 116a, 116b, 116c, and 116d and the insulating layer 103. The electrodes 117a, 117b, 117c, and 117d are provided to fill openings formed in the insulating layer 104. It is preferable that the top surfaces of the electrodes 117a, 117b, 117c, and 117d be substantially level with the top surface of the insulating layer 104.

The display unit of this embodiment includes at least one structure in which the top surface of the insulating layer is substantially level with the top surface of the conductive layer. An example of a method for manufacturing the structure is a method in which an insulating layer is formed, an opening is provided in the insulating layer, and a conductive layer is formed so as to fill the opening, and then, planarization treatment is performed by a CMP method or the like. Thus, the top surface of the conductive layer can be level with the top surface of the insulating layer.

The insulating layer 102 is preferably formed using an inorganic insulating material such as silicon oxide, silicon oxynitride, silicon nitride oxide, silicon nitride, aluminum oxide, hafnium oxide, or titanium nitride.

In this specification and the like, silicon oxynitride contains more oxygen than nitrogen. Silicon nitride oxide contains more nitrogen than oxygen.

As the insulating layer 103, for example, a film in which one or both of hydrogen and oxygen are less likely to be diffused than in a silicon oxide film can be used. Examples of such a film include an aluminum oxide film, a hafnium oxide film, and a silicon nitride film. The insulating layer 103 preferably functions as a barrier layer that prevents diffusion of impurities from the LED substrate 150A into the circuit board 150B.

It is particularly preferable to use an oxide insulating film as the insulating layer 104. The insulating layer 104 is a layer that is directly bonded to the insulating layer included in the circuit board 150B. The oxide insulating films are directly bonded to each other, whereby the bonding strength (attachment strength) can be increased.

Examples of materials that can be used for the conductive layers 116*a* to 116*d* include metal such as aluminum (Al), titanium, chromium, nickel, copper (Cu), yttrium, zirconium, tin (Sn), zinc (Zn), silver (Ag), platinum (Pt), gold (Au), molybdenum, tantalum, and tungsten (W), and an alloy containing the metal as its main component (e.g., an alloy of silver, palladium (Pd), and copper (Ag—Pd—Cu (APC))). Alternatively, oxide such as tin oxide or zinc oxide may be used.

As the electrodes 117*a* to 117*d*, for example, Cu, Al, Sn, Zn, W, Ag, Pt, Au, or the like can be used. The electrodes 117*a* to 117*d* are layers that are directly bonded to the conductive layers included in the circuit board 150B. Preferably, Cu, Al, W, or Au is used for easy bonding.

The light-emitting layer 114*a* is positioned between the semiconductor layer 113*a* and the semiconductor layer 115*a*. The light-emitting layer 114*b* is positioned between the semiconductor layer 113*b* and the semiconductor layer 115*b*. In the light-emitting layers 114*a* and 114*b*, electrons and holes are combined to emit light. The semiconductor layers 113*a* and 113*b* or the semiconductor layers 115*a* and 115*b* are n-type semiconductor layers, and the others are p-type semiconductor layers.

The stacked-layer structure including the semiconductor layer 113*a*, the light-emitting layer 114*a*, and the semiconductor layer 115*a* and the stacked-layer structure including the semiconductor layer 113*b*, the light-emitting layer 114*b*, and the semiconductor layer 115*b* are each formed to emit light of red, yellow, green, blue, or the like. Any of the stacked-layer structures may be formed to emit ultraviolet light. It is preferable that the two stacked-layer structures emit light of different colors. For these stacked-layer structures, for example, a compound containing a Group 13 element and a Group 15 element (also referred to as a Group III-V compound) can be used. Examples of the Group 13 element include aluminum, gallium, and indium. Examples of the Group 15 element include nitrogen, phosphorus, arsenic, and antimony. The light-emitting diode can be formed using, for example, a compound of gallium and phosphorus, a compound of gallium and arsenic, a compound of gallium, aluminum, and arsenic, a compound of aluminum, gallium, indium, and phosphorus, gallium nitride (GaN), a compound of indium and gallium nitride, or a compound of selenium and zinc.

When the light-emitting diode 110*a* and the light-emitting diode 110*b* are formed to emit light of different colors, a step of forming a color conversion layer is not necessary. Accordingly, the manufacturing cost of the display unit can be reduced.

Alternatively, the two stacked-layer structures may emit light of the same color. At this time, light emitted from the light-emitting layers 114*a* and 114*b* may be extracted to the outside of the display unit through a color conversion layer and/or a coloring layer. Note that the structure in which pixels of each color include light-emitting diodes emitting light of the same color will be described later in Structure example 2 of display unit.

The display unit of this embodiment may include a light-emitting diode emitting infrared light. The light-emitting diode emitting infrared light can be used as a light source of an infrared light sensor, for example.

A compound semiconductor substrate may be used as the substrate 101; for example, a compound semiconductor substrate containing a Group 13 element and a Group 15 element may be used. As the substrate 101, for example, a single crystal substrate of sapphire ($Al_2O_3$), silicon carbide (SiC), silicon (Si), or gallium nitride (GaN) can be used.

As illustrated in FIG. 1, light from the light-emitting diodes 110*a* and 110*b* is emitted to the substrate 101 side. Therefore, the substrate 101 preferably has a transmitting property with respect to visible light. The transmitting property with respect to visible light of the substrate 101 may be increased by reduction in the thickness by polishing or the like, for example.

FIG. 2B is a cross-sectional view of the circuit board 150B.

The circuit board 150B includes a substrate 151, an insulating layer 152, a transistor 120*a*, a transistor 120*b*, a conductive layer 184*a*, a conductive layer 184*b*, a conductive layer 189*a*, a conductive layer 189*b*, an insulating layer 186, an insulating layer 187, an insulating layer 188, a conductive layer 190*a*, a conductive layer 190*b*, a conductive layer 190*c*, and a conductive layer 190*d*. The circuit board 150B further includes insulating layers such as insulating layers 162, 181, 182, 183, and 185. One or more of the insulating layers are sometimes considered as components of a transistor, but are not included as components of a transistor in the description in this embodiment. Note that each of the conductive layers and the insulating layers included in the circuit board 150B may have a single-layer structure or a stacked-layer structure.

An insulating substrate such as a glass substrate, a quartz substrate, a sapphire substrate, or a ceramic substrate; a single crystal semiconductor substrate or a polycrystalline semiconductor substrate including silicon, silicon carbide, or the like as a material; a compound semiconductor substrate of silicon germanium or the like; or a semiconductor substrate such as an silicon on insulator (SOI) substrate can be used as the substrate 151.

The substrate 151 preferably blocks visible light (has a non-transmitting property with respect to visible light). When the substrate 151 blocks visible light, entry of light from the outside into the transistors 120*a* and 120*b* formed over the substrate 151 can be inhibited. However, one embodiment of the present invention is not limited thereto, and the substrate 151 may have a transmitting property with respect to visible light.

The insulating layer 152 is provided over the substrate 151. The insulating layer 152 functions as a barrier layer that prevents diffusion of impurities such as water and hydrogen from the substrate 151 into the transistors 120*a* and 120*b* and release of oxygen from a metal oxide layer 165 to the insulating layer 152 side. As the insulating layer 152, for example, a film in which one or both of hydrogen and oxygen are less likely to be diffused than in a silicon oxide film can be used. Examples of such a film include an aluminum oxide film, a hafnium oxide film, and a silicon nitride film.

The transistors 120*a* and 120*b* each include a conductive layer 161, an insulating layer 163, an insulating layer 164, the metal oxide layer 165, a pair of conductive layers 166, an insulating layer 167, a conductive layer 168, and the like. A specific example of a transistor that can be used in the display unit of one embodiment of the present invention will be described in detail in Embodiment 3.

The metal oxide layer 165 includes a channel formation region. The metal oxide layer 165 includes a first region overlapping with one of the pair of conductive layers 166, a second region overlapping with the other of the pair of conductive layers 166, and a third region between the first region and the second region.

The conductive layer 161 and the insulating layer 162 are provided over the insulating layer 152, and the insulating layers 163 and 164 are provided to cover the conductive layer 161 and the insulating layer 162. The metal oxide layer 165 is provided over the insulating layer 164. The conductive layer 161 functions as a gate electrode, and the insulating layers 163 and 164 function as gate insulating layers. The conductive layer 161 overlaps with the metal oxide layer 165 with the insulating layers 163 and 164 therebetween. The insulating layer 163 preferably functions as a barrier layer like the insulating layer 152. As the insulating layer 164 in contact with the metal oxide layer 165, an oxide insulating film such as a silicon oxide film is preferably used.

Here, the top surface of the conductive layer 161 is substantially level with the top surface of the insulating layer 162. Accordingly, the size of the transistors 120a and 120b can be reduced.

The pair of conductive layers 166 is provided over the metal oxide layer 165 so that the conductive layers 166 are apart from each other. The pair of conductive layers 166 functions as a source and a drain. The insulating layer 181 is provided to cover the metal oxide layer 165 and the pair of conductive layers 166, and the insulating layer 182 is provided over the insulating layer 181. An opening reaching the metal oxide layer 165 is provided in the insulating layers 181 and 182, and the insulating layer 167 and the conductive layer 168 are provided to fill the opening. The opening overlaps with the third region. The insulating layer 167 overlaps with the side surfaces of the insulating layers 181 and 182. The conductive layer 168 overlaps with the side surfaces of the insulating layers 181 and 182 with the insulating layer 167 therebetween. The conductive layer 168 functions as a gate electrode, and the insulating layer 167 functions as a gate insulating layer. The conductive layer 168 overlaps with the metal oxide layer 165 with the insulating layer 167 therebetween.

Here, the top surface of the conductive layer 168 is substantially level with the top surface of the insulating layer 182. Accordingly, the size of the transistors 120a and 120b can be reduced.

The insulating layers 183 and 185 are provided to cover the top surfaces of the insulating layers 182 and 167 and the conductive layer 168. The insulating layers 181 and 183 each preferably function as a barrier layer like the insulating layer 152. When the pair of conductive layers 166 is covered with the insulating layer 181, oxidation of the pair of conductive layers 166 due to oxygen contained in the insulating layer 182 can be inhibited.

A plug electrically connected to one of the pair of conductive layers 166 and the conductive layer 189a is provided to fill an opening provided in the insulating layers 181, 182, 183, and 185. The plug preferably includes the conductive layer 184b in contact with the side surface of the opening and the top surface of one of the pair of conductive layers 166, and the conductive layer 184a embedded inside the conductive layer 184b. Here, a conductive material in which hydrogen and oxygen are less likely to be diffused is preferably used as the conductive layer 184b.

The conductive layer 189a and the insulating layer 186 are provided over the insulating layer 185, the conductive layer 189b is provided over the conductive layer 189a, and the insulating layer 187 is provided over the insulating layer 186. The insulating layer 186 preferably has a planarization function. Here, the top surface of the conductive layer 189b is substantially level with the top surface of the insulating layer 187. An opening reaching the conductive layer 189a is provided in the insulating layers 187 and 186, and the conductive layer 189b is provided to fill the opening. The conductive layer 189b functions as a plug for electrically connecting the conductive layer 189a and the conductive layer 190a or 190c.

One of the pair of conductive layers 166 of the transistor 120a is electrically connected to the conductive layer 190a through the conductive layers 184a, 184b, 189a, and 189b.

Similarly, one of the pair of conductive layers 166 of the transistor 120b is electrically connected to the conductive layer 190c through the conductive layers 184a, 184b, 189a, and 189b.

The insulating layer 186 is preferably formed using an inorganic insulating material such as silicon oxide, silicon oxynitride, silicon nitride oxide, silicon nitride, aluminum oxide, hafnium oxide, or titanium nitride.

As the insulating layer 187, for example, a film in which one or both of hydrogen and oxygen are less likely to be diffused than in a silicon oxide film can be used. Examples of such a film include an aluminum oxide film, a hafnium oxide film, and a silicon nitride film. The insulating layer 187 preferably functions as a barrier layer that prevents diffusion of impurities (e.g., hydrogen and water) from the LED substrate 150A into the transistor. The insulating layer 187 preferably functions as a barrier layer that prevents diffusion of impurities from the circuit board 150B into the LED substrate 150A.

The insulating layer 188 is a layer that is directly bonded to the insulating layer 104 included in the LED substrate 150A. The insulating layer 188 is preferably formed using the same material as the insulating layer 104. An oxide insulating film is preferably used as the insulating layer 188. The oxide insulating films are directly bonded to each other, whereby the bonding strength (attachment strength) can be increased. Note that in the case where one or both of the insulating layers 104 and 188 have a stacked-layer structure, layers (including a surface layer and a bonding surface) that are in contact with each other are preferably formed using the same material.

The conductive layers 190a to 190d are layers that are directly bonded to the electrodes 117a to 117d of the LED substrate 150A. It is preferable that the main components of the conductive layers 190a to 190d and the main components of the electrodes 117a to 117d be the same metal element, and further preferable that the conductive layers 190a to 190d and the electrodes 117a to 117d be formed using the same material. For the conductive layers 190a to 190d, for example, Cu, Al, Sn, Zn, W, Ag, Pt, Au, or the like can be used. Preferably, Cu, Al, W, or Au is used for easy bonding. Note that in the case where one or both of a conductive layer 190 (the conductive layers 190a to 190d) and an electrode 117 (the electrodes 117a to 117d) have a stacked-layer structure, layers (including a surface layer and a bonding surface) that are in contact with each other are preferably formed using the same material.

Note that the circuit board 150B may include one or both of a reflective layer that reflects light of a light-emitting diode and a light-blocking layer that blocks the light.

As illustrated in FIG. 1, the electrodes 117a, 117b, 117c, and 117d, which are provided in the LED substrate 150A, are respectively bonded to and electrically connected to the conductive layers 190a, 190b, 190c, and 190d, which are provided in the circuit board 150B.

For example, the electrode 117a and the conductive layer 190a are connected to each other, whereby the transistor 120a and the light-emitting diode 110a can be electrically connected to each other. The electrode 117a functions as a pixel electrode of the light-emitting diode 110a. The electrode 117b and the conductive layer 190b are connected to each other. The electrode 117b functions as a common electrode of the light-emitting diode 110a.

Similarly, the electrode 117c and the conductive layer 190c are connected to each other, whereby the transistor 120b and the light-emitting diode 110b can be electrically connected to each other. The electrode 117c functions as a pixel electrode of the light-emitting diode 110b. The electrode 117d and the conductive layer 190d are connected to each other. The electrode 117d functions as a common electrode of the light-emitting diode 110b.

It is preferable that the main components of the electrodes 117a, 117b, 117c, and 117d and the main components of the conductive layers 190a, 190b, 190c, and 190d be the same metal element.

The insulating layer 104 provided in the LED substrate 150A and the insulating layer 188 provided in the circuit board 150B are directly bonded to each other. The insulating layers 104 and 188 are preferably formed of the same main component or formed using the same material.

The layers formed using the same material are in contact with each other at the bonding surface between the LED substrate 150A and the circuit board 150B, whereby connection with mechanical strength can be obtained.

For bonding the metal layers to each other, surface activated bonding and diffusion bonding can be used. Surface activated bonding is a method in which an oxide film and a layer adsorbing impurities over the surface of the metal layer are removed by sputtering treatment or the like and the cleaned and activated surfaces of the metal layers are made to be in contact with and bonded to each other. Diffusion bonding is a method in which the surfaces of the metal layers are bonded to each other by adjusting temperature and pressure together. Both methods can cause bonding at an atomic level and therefore the bonding with excellent electric and mechanical strength can be achieved.

For bonding the insulating layers to each other, hydrophilic bonding or the like can be used after high planarity is obtained by polishing or the like. Hydrophilic bonding is a method in which the surfaces of the insulating layers are subjected to hydrophilicity treatment with oxygen plasma or the like, arranged in contact with and bonded to each other temporarily, and then dehydrated by heat treatment to perform final bonding. The hydrophilic bonding can also cause bonding at an atomic level; thus, bonding with excellent mechanical strength can be obtained. In the case of using an oxide insulating film, hydrophilicity treatment is preferably used, in which case the bonding strength can be further increased. Note that when an oxide insulating film is used, hydrophilicity treatment is not necessarily performed.

A combination of two or more of bonding methods may be used for the bonding because both the insulating layer and the metal layer exist at the bonding surface between the LED substrate 150A and the circuit board 150B. For example, a combination of surface activated bonding and hydrophilic bonding can be performed.

For example, the following method can be used: the surfaces of the metal layers are made clean after polishing, the surfaces of the metal layers are subjected to antioxidant treatment and hydrophilicity treatment, and then bonding is performed. Alternatively, hydrophilicity treatment may be performed on the surfaces of the metal layers with the use of hardly oxidizable metal such as Au. In the case where hydrophilicity treatment is not performed, antioxidant treatment can be omitted and there is no limitation on the kinds of the materials, so that the manufacturing cost and the number of manufacturing steps can be reduced. Note that a bonding method other than the above methods may be used.

Note that the bonding between the LED substrate 150A and the circuit board 150B is not necessarily direct bonding over the entire surfaces of the substrates; the substrates may be connected to each other in at least part of the substrates with a conductive paste of silver, carbon, copper, or the like, or a bump of gold, solder, or the like.

Note that a plurality of light-emitting diodes may be electrically connected to one transistor.

Figure 3:
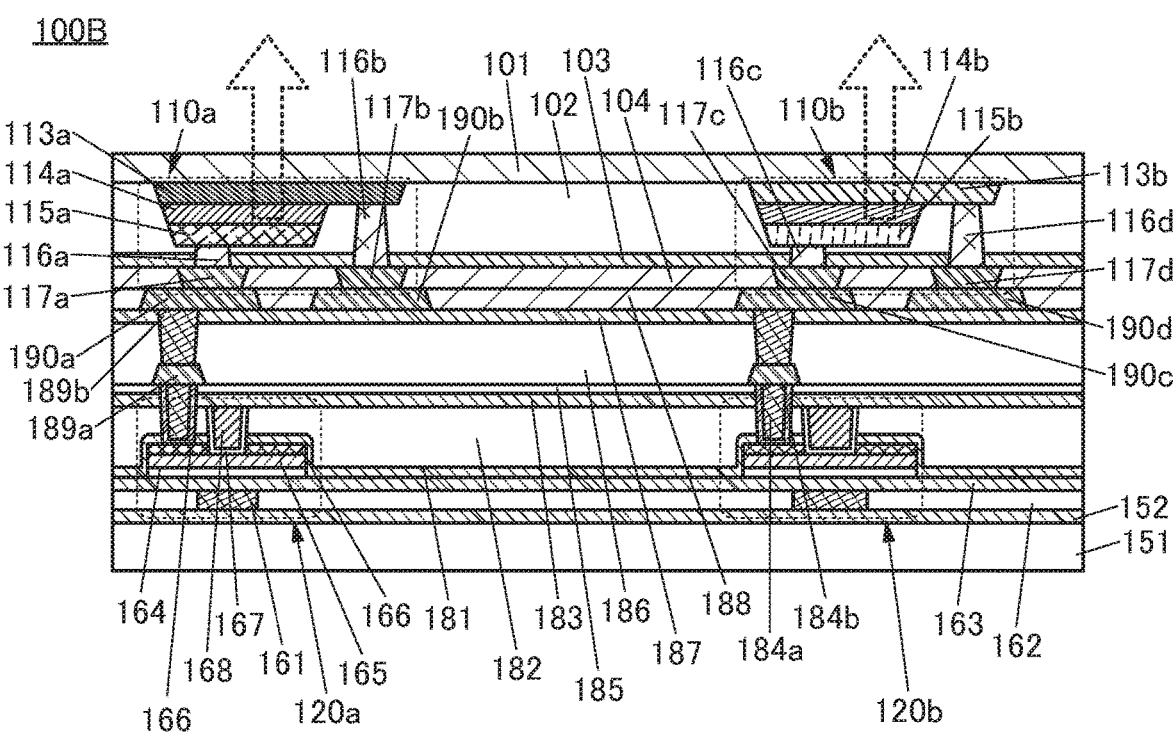
FIG. 3 is a cross-sectional view illustrating an example of a display unit.

Next, FIG. 3 illustrates a cross-sectional view of a display unit 100B.

An example is shown in which the transistor 120a and the transistor 120b of the display unit 100B have different channel lengths. Other components are similar to those of the display unit 100A.

The transistor 120a for driving the light-emitting diode 110a and the transistor 120b for driving the light-emitting diode 110b may be different from each other in at least one of a transistor size, a channel length, a channel width, a structure, and the like. For example, in the case where the light-emitting diode 110a and the light-emitting diode 110b emit light of different colors, the structure of the transistor may be changed for each color. Specifically, depending on the amount of current required for light emission with desired luminance, one or both of the channel length and the channel width of the transistor may be changed for each color.

Figure 4:
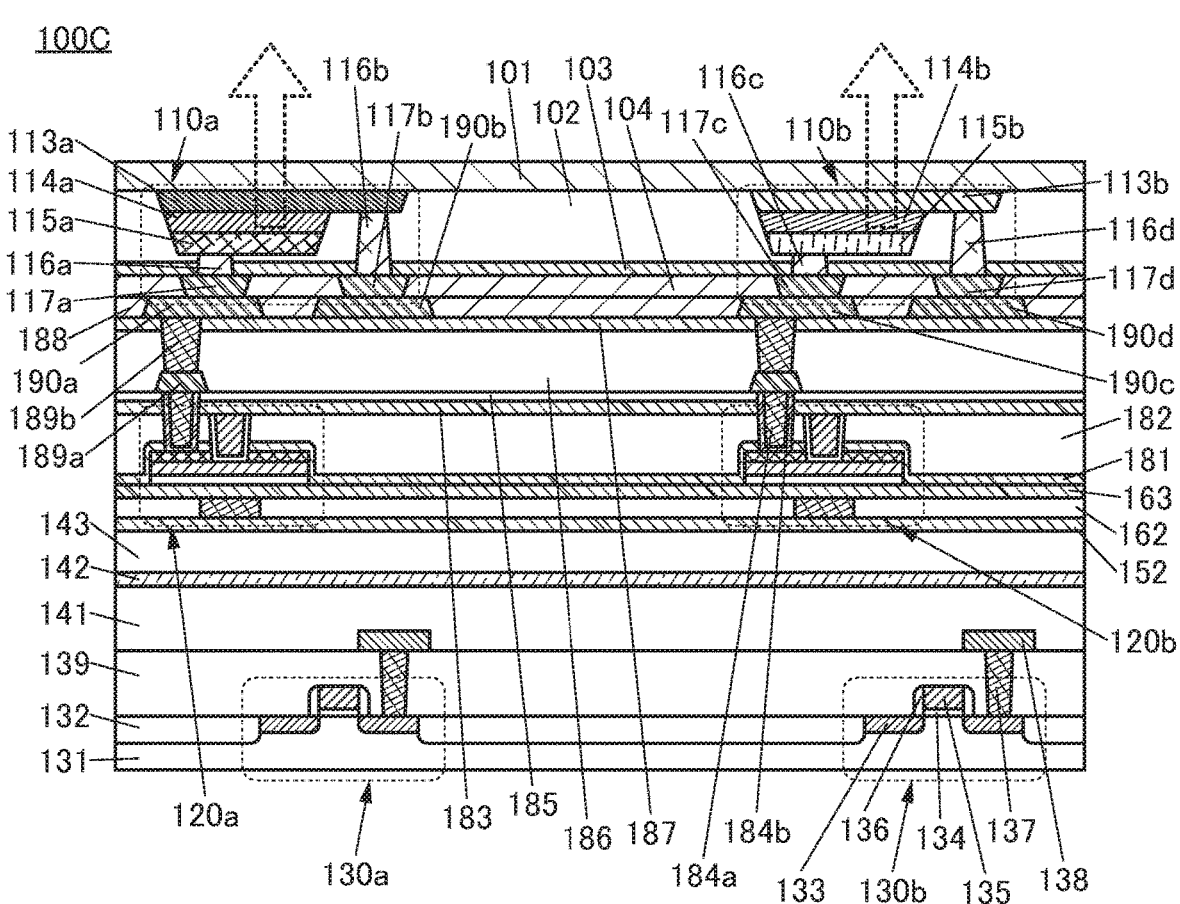
FIG. 4 is a cross-sectional view illustrating an example of a display unit.

Next, FIG. 4 is a cross-sectional view of a display unit 100C.

The display unit 100C has a stacked-layer structure that includes transistors each including a channel formation region in a substrate 131 (transistors 130a and 130b) and transistors each including a channel formation region in a metal oxide layer (the transistors 120a and 120b).

As the substrate 131, a single crystal silicon substrate is favorably used. The transistors 130a and 130b each include a conductive layer 135, an insulating layer 134, an insulating layer 136, and a pair of low-resistance regions 133. The conductive layer 135 functions as a gate. The insulating layer 134 is positioned between the conductive layer 135 and the substrate 131 and functions as a gate insulating layer. The insulating layer 136 is provided to cover the side surface of the conductive layer 135 and functions as a sidewall. The pair of low-resistance regions 133 in the substrate 131 is doped with an impurity; one of the pair of low-resistance regions 133 functions as a source of a transistor and the other functions as a drain of the transistor.

An element isolation layer 132 is provided between two adjacent transistors to be embedded in the substrate 131.

An insulating layer 139 is provided to cover the transistors 130a and 130b, and a conductive layer 138 is provided over the insulating layer 139. The conductive layer 138 is electrically connected to one of the pair of low-resistance regions 133 through a conductive layer 137 provided to fill an opening in the insulating layer 139. An insulating layer 141 is provided to cover the conductive layer 138, and a conductive layer 142 is provided over the insulating layer 141. The conductive layer 138 and the conductive layer 142 each function as a wiring. An insulating layer 143 and the insulating layer 152 are provided to cover the conductive layer 142, and the transistors 120a and 120b are provided over the insulating layer 152. A stacked-layer structure from the insulating layer 152 to the substrate 101 is the same as that of the display unit 100A; thus, detailed description thereof is omitted.

The transistors 120a and 120b can be used as transistors included in a pixel circuit. Each of the transistors 130a and 130b can be used as a transistor included in a pixel circuit or a transistor included in a driver circuit (one or both of a gate driver and a source driver) for driving the pixel circuit. The transistors 120a, 120b, 130a, and 130b can also be used as transistors included in a variety of circuits such as an arithmetic circuit and a memory circuit.

With such a structure, not only the pixel circuit but also the driver circuit or the like can be formed directly under the light-emitting diode; thus, the display unit can be downsized as compared with the case where the driver circuit is provided outside a display portion. In addition, the display unit can have a narrow frame (narrow non-display region).

[Structure Example 2 of Display Unit]

Figure 5A:
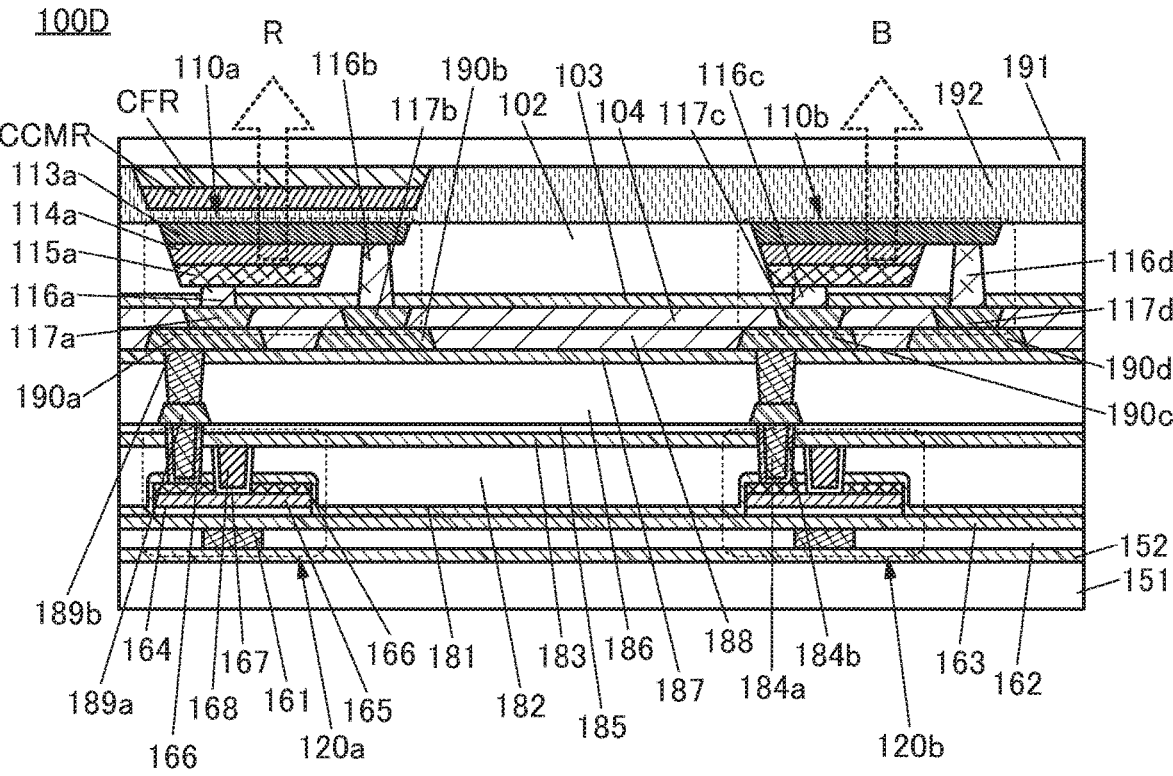
FIGS. 5A and 5B are cross-sectional views each illustrating an example of a display unit.
Figure 5B:
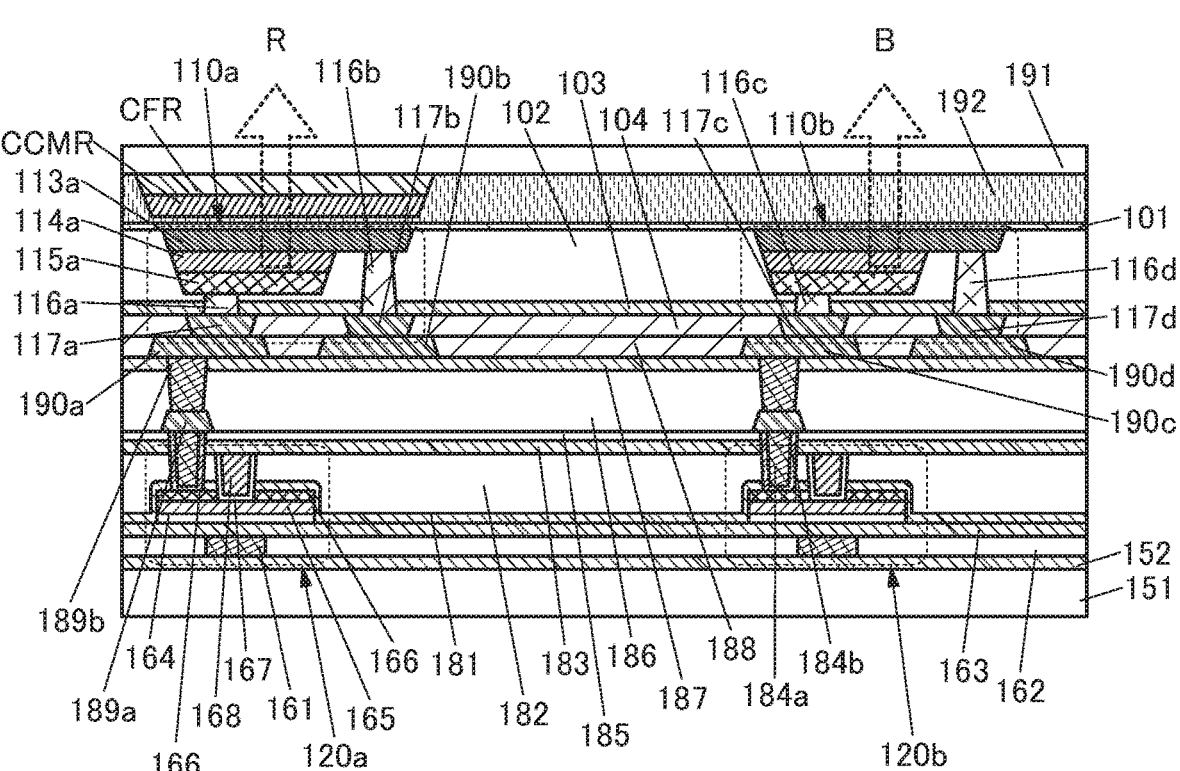

FIG. 5A is a cross-sectional view of a display unit 100D, and FIG. 5B is a cross-sectional view of a display unit 100E.

In each of the display units 100D and 100E, the pixels of each color include light-emitting diodes that emit light of the same color.

The display units 100D and 100E each include a substrate 191 provided with a coloring layer CFR and a color conversion layer CCMR.

Specifically, the substrate 191 includes the coloring layer CFR and the color conversion layer CCMR in a region overlapping with the light-emitting diode 110a of a red pixel. The color conversion layer CCMR has a function of converting blue light into red light.

In FIGS. 5A and 5B, light emitted from the light-emitting diode 110a of the red pixel is converted from blue light into red light by the color conversion layer CCMR, the purity of the red light is improved by the coloring layer CFR, and the red light is emitted to the outside of the display unit 100D or 100E.

Similarly, although not illustrated, the substrate 191 includes a green coloring layer and a color conversion layer that converts blue light into green light in a region overlapping with a light-emitting diode of a green pixel. Thus, light emitted from the light-emitting diode of the green pixel is converted from blue light into green light by the color conversion layer, the purity of the green light is improved by the coloring layer, and the green light is emitted to the outside of the display unit.

On the other hand, a color conversion layer is not provided in a region of the substrate 191 that overlaps with the light-emitting diode 110b of a blue pixel. The substrate 191 may include a blue coloring layer in the region overlapping with the light-emitting diode 110b of the blue pixel. When a blue coloring layer is provided, the purity of blue light can be improved. In the case where a blue coloring layer is not provided, the manufacturing process can be simplified.

Blue light emitted from the light-emitting diode 110b is emitted to the outside of the display unit 100D or 100E through an adhesive layer 192 and the substrate 191.

In manufacturing a display unit in which the pixels of each color include light-emitting diodes having the same structures, since only light-emitting diodes of the same kind are formed over a substrate, a manufacturing apparatus and manufacturing process can be simplified compared to the case where a plurality of kinds of light-emitting diodes are formed.

Since the substrate 191 is positioned on a light extraction side of the light-emitting diode, a material having a high transmitting property with respect to visible light is preferably used as the substrate 191. Examples of a material that can be used for the substrate 191 include glass, quartz, sapphire, and a resin. A film such as a resin film may be used as the substrate 191. In that case, the display unit can be reduced in weight and thickness.

As the color conversion layer, a phosphor or a quantum dot (QD) is preferably used. In particular, a quantum dot has an emission spectrum with a narrow peak, so that emission with high color purity can be obtained. Accordingly, the display quality of the display unit can be improved.

The color conversion layer can be formed by a droplet discharge method (e.g., an inkjet method), a coating method, an imprinting method, a variety of printing methods (screen printing or offset printing), or the like. A color conversion film such as a quantum dot film may also be used.

For processing a film to be the color conversion layer, a photolithography method is preferably employed. Examples of a photolithography method include a method in which a resist mask is formed over a thin film to be processed, the thin film is processed by etching or the like, and the resist mask is removed, and a method in which a photosensitive thin film is formed, and the photosensitive thin film is exposed to light and developed to be processed into a desired shape. For example, a thin film is formed using a material in which a quantum dot is mixed with a photoresist, and the thin film is processed by a photolithography method, whereby an island-shaped color conversion layer can be formed.

There is no limitation on a material of a quantum dot, and examples include a Group 14 element, a Group 15 element, a Group 16 element, a compound of a plurality of Group 14 elements, a compound of an element belonging to any of Groups 4 to 14 and a Group 16 element, a compound of a Group 2 element and a Group 16 element, a compound of a Group 13 element and a Group 15 element, a compound of a Group 13 element and a Group 17 element, a compound of a Group 14 element and a Group 15 element, a compound of a Group 11 element and a Group 17 element, iron oxides, titanium oxides, spinel chalcogenides, and semiconductor clusters.

Specific examples include, but are not limited to, cadmium selenide; cadmium sulfide; cadmium telluride; zinc selenide; zinc oxide; zinc sulfide; zinc telluride; mercury sulfide; mercury selenide; mercury telluride; indium arsenide; indium phosphide; gallium arsenide; gallium phosphide; indium nitride; gallium nitride; indium antimonide; gallium antimonide; aluminum phosphide; aluminum arsenide; aluminum antimonide; lead selenide; lead telluride; lead sulfide; indium selenide; indium telluride; indium sulfide; gallium selenide; arsenic sulfide; arsenic selenide; arsenic telluride; antimony sulfide; antimony selenide; antimony telluride; bismuth sulfide; bismuth selenide; bismuth telluride; silicon; silicon carbide; germanium; tin; selenium; tellurium; boron; carbon; phosphorus; boron nitride; boron phosphide; boron arsenide; aluminum nitride; aluminum sulfide; barium sulfide; barium selenide; barium telluride; calcium sulfide; calcium selenide; calcium telluride; beryllium sulfide; beryllium selenide; beryllium telluride; magnesium sulfide; magnesium selenide; germanium sulfide; germanium selenide; germanium telluride; tin sulfide; tin selenide; tin telluride; lead oxide; copper fluoride; copper chloride; copper bromide; copper iodide; copper oxide; copper selenide; nickel oxide; cobalt oxide; cobalt sulfide; iron oxide; iron sulfide; manganese oxide; molybdenum sulfide; vanadium oxide; tungsten oxide; tantalum oxide; titanium oxide; zirconium oxide; silicon nitride; germanium nitride; aluminum oxide; barium titanate; a compound of selenium, zinc, and cadmium; a compound of indium, arsenic, and phosphorus; a compound of cadmium, selenium, and sulfur; a compound of cadmium, selenium, and tellurium; a compound of indium, gallium, and arsenic; a compound of indium, gallium, and selenium; a compound of indium, selenium, and sulfur; a compound of copper, indium, and sulfur; and combinations thereof. What is called an alloyed quantum dot, whose composition is represented by a given ratio, may be used.

Examples of the quantum dot include a core-type quantum dot, a core-shell quantum dot, and a core-multishell quantum dot. Quantum dots have a high proportion of surface atoms and thus have high reactivity and easily cohere together. For this reason, it is preferable that a protective agent be attached to, or a protective group be provided at the surfaces of quantum dots. The attachment of the protective agent or the provision of the protective group can prevent cohesion and increase solubility in a solvent. It can also reduce reactivity and improve electrical stability.

Since band gaps of quantum dots are increased as their size is decreased, the size is adjusted as appropriate so that light with a desired wavelength can be obtained. Light emission from the quantum dots is shifted to a blue color side, i.e., a high energy side, as the crystal size is decreased; thus, emission wavelengths of the quantum dots can be adjusted over a wavelength range of a spectrum of an ultraviolet region, a visible light region, and an infrared region by changing the size of quantum dots. The range of size (diameter) of quantum dots is, for example, greater than or equal to 0.5 nm and less than or equal to 20 nm, preferably greater than or equal to 1 nm and less than or equal to 10 nm. The emission spectra are narrowed as the size distribution of the quantum dots gets smaller, and thus light can be obtained with high color purity. The shape of the quantum dots is not particularly limited and may be a spherical shape, a rod shape, a circular shape, or the like. A quantum rod, which is a rod-shaped quantum dot, has a function of emitting directional light.

The coloring layer is a colored layer that transmits light in a specific wavelength range. For example, a color filter for transmitting light in a red, green, blue, or yellow wavelength range can be used. Examples of a material that can be used for the coloring layer include a metal material, a resin material, and a resin material containing a pigment or dye.

The display unit 100D can be manufactured in the following manner: first, the circuit board and the LED substrate are bonded to each other as in the case of the display unit 100A, the substrate 101 of the LED substrate is separated, and then the substrate 191 provided with the coloring layer CFR, the color conversion layer CCMR, and the like is bonded to the surface exposed by the separation with the use of the adhesive layer 192.

Figure 6A:
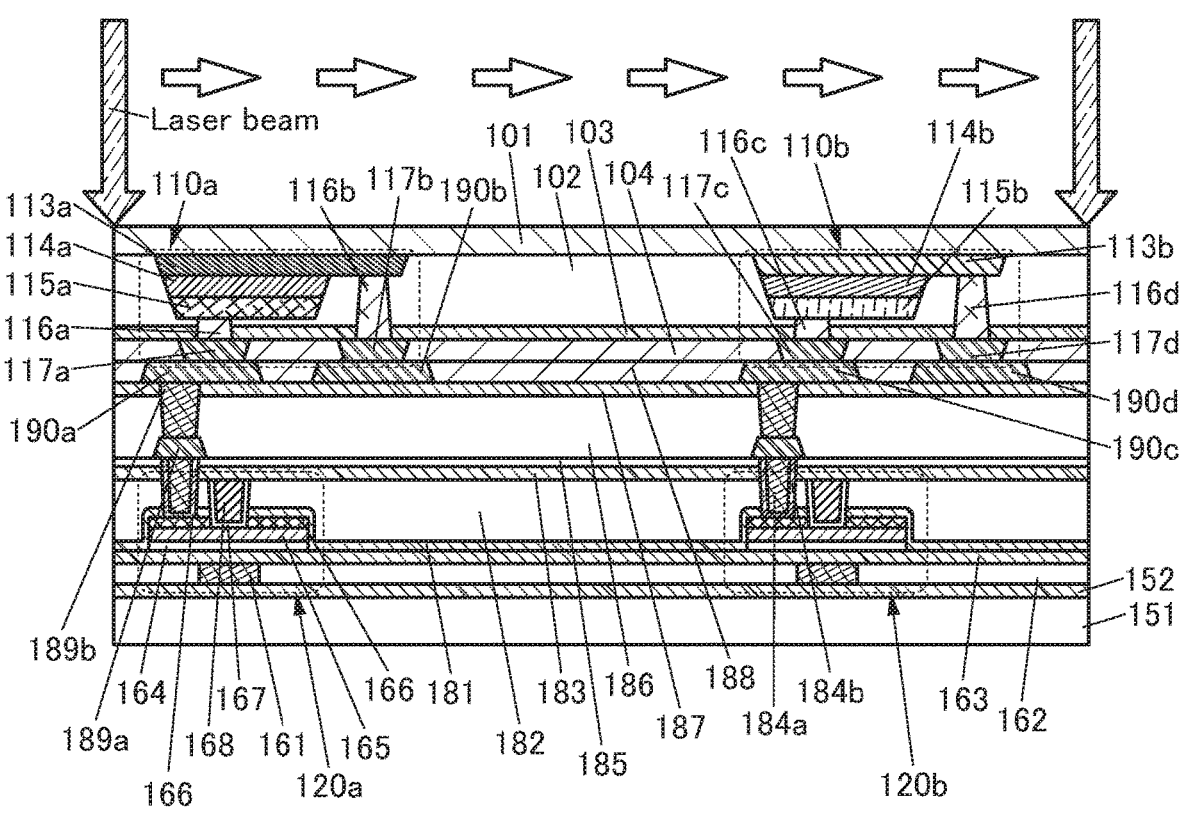
FIGS. 6A and 6B are cross-sectional views illustrating an example of a method for manufacturing a display unit.
Figure 6B:
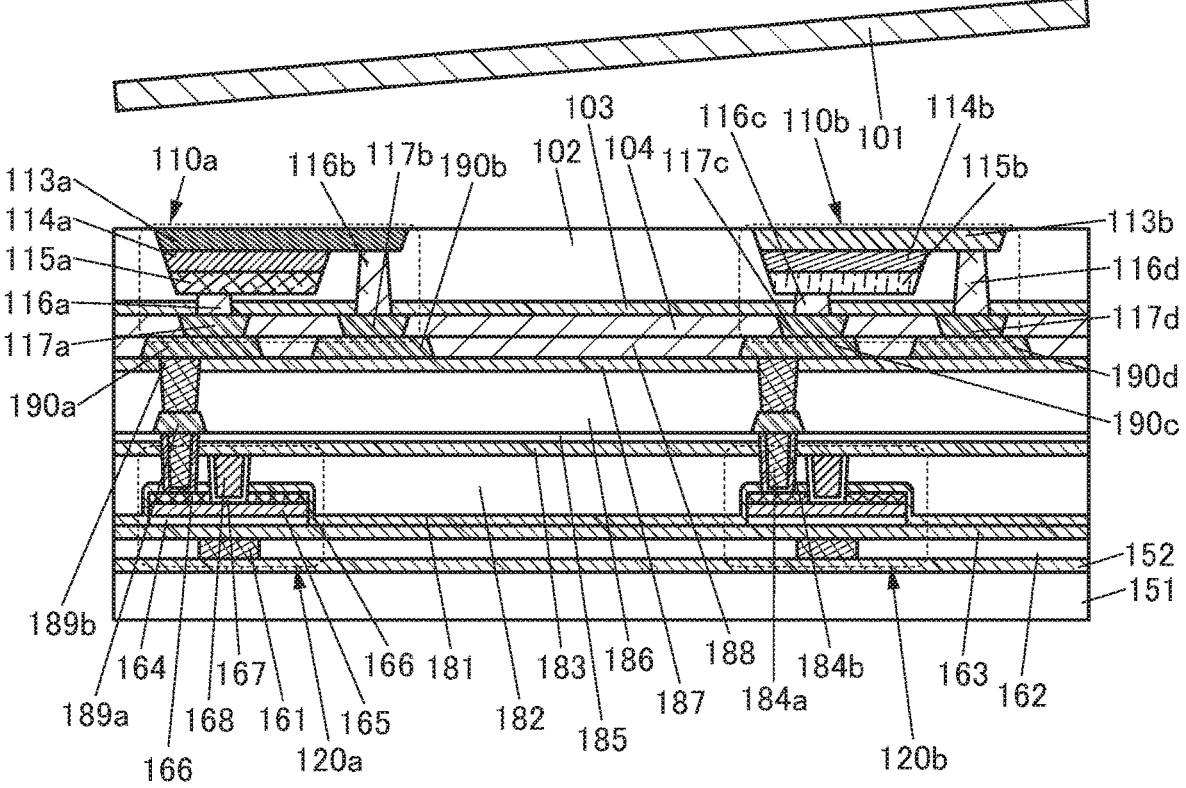

There is no limitation on the method for separating the substrate 101; for example, a method in which the entire surface of the substrate 101 is irradiated with a laser beam as illustrated in FIG. 6A may be used. Thus, the substrate 101 can be separated, and the insulating layer 102 and the light-emitting diodes 110a and 110b can be exposed (FIG. 6B).

As the laser, an excimer laser, a solid laser, or the like can be used. For example, a diode-pumped solid-state laser (DPSS) may be used.

A separation layer may be provided between the substrate 101 and the light-emitting diodes 110a and 110b.

The separation layer can be formed using an organic material or an inorganic material.

Examples of an organic material that can be used for the separation layer include a polyimide resin, an acrylic resin, an epoxy resin, a polyamide resin, a polyimide-amide resin, a siloxane resin, a benzocyclobutene-based resin, and a phenol resin.

Examples of an inorganic material that can be used for the separation layer include a metal containing an element selected from tungsten, molybdenum, titanium, tantalum, niobium, nickel, cobalt, zirconium, zinc, ruthenium, rhodium, palladium, osmium, iridium, and silicon, an alloy containing the element, and a compound containing the element. A crystal structure of a layer containing silicon may be amorphous, microcrystal, or polycrystal.

As the adhesive layer 192, any of a variety of curable adhesives such as a reactive curable adhesive, a thermosetting adhesive, an anaerobic adhesive, and a photocurable adhesive such as an ultraviolet curable adhesive can be used. An adhesive sheet or the like may be used.

Alternatively, as in the display unit 100E, the substrate 191 provided with the coloring layer CFR, the color conversion layer CCMR, and the like may be bonded to the substrate 101 with the use of the adhesive layer 192. In other words, the substrate 101 is not necessarily separated.

At this time, the substrate 101 is preferably thinned by polishing or the like. This can increase the extraction efficiency of light emitted from the light-emitting diode. In addition, the display unit can be thin and lightweight.

The display unit 100E can be manufactured in the following manner: first, the circuit board and the LED substrate are bonded to each other as in the case of the display unit 100A, the substrate 101 of the LED substrate is polished, and the substrate 191 provided with the coloring layer CFR, the color conversion layer CCMR, and the like is bonded to the polished surface of the substrate 101 with the use of the adhesive layer 192.

[Structure Example 3 of Display Unit]

Figure 7:
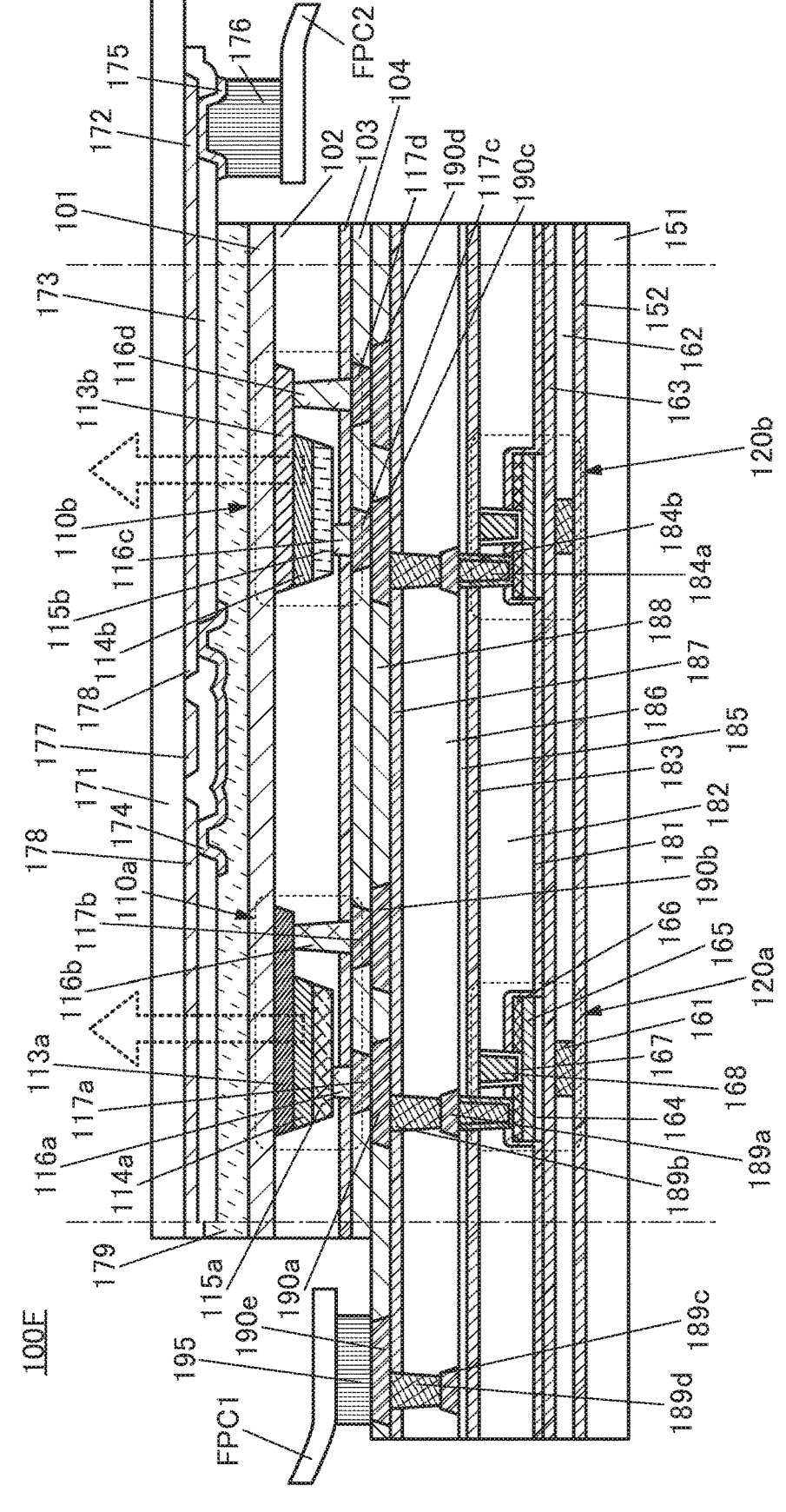
FIG. 7 is a cross-sectional view illustrating an example of a display unit.

FIG. 7 is a cross-sectional view of a display unit 100F.

The display unit of one embodiment of the present invention may be a display unit in which a touch sensor is implemented (such a display unit is also referred to as an input/output device or a touch panel). Any of the structures of the display units described above can be applied to the touch panel. The display unit 100F is an example in which a touch sensor is provided in the display unit 100A.

There is no particular limitation on a sensing device (also referred to as a sensor device, a sensing element, or a sensor element) included in the touch panel of one embodiment of the present invention. A variety of sensors that can sense proximity or touch of a sensing target such as a finger or a stylus can be used as the sensing device.

For example, a variety of types such as a capacitive type, a resistive type, a surface acoustic wave type, an infrared type, an optical type, and a pressure-sensitive type can be used for the sensor.

In this embodiment, a touch panel including a capacitive sensing device will be described as an example.

Examples of the capacitive touch sensing device include a surface capacitive touch sensing device and a projected capacitive touch sensing device. Examples of the projected capacitive touch sensing device include a self-capacitive touch sensing device and a mutual capacitive touch sensing device. The use of a mutual capacitive touch sensing device is preferred because multiple points can be sensed simultaneously.

The touch panel of one embodiment of the present invention can have any of a variety of structures, including a structure in which a display unit and a sensing device that are separately formed are bonded to each other and a structure in which an electrode and the like included in a sensing device are provided on one or both of a substrate supporting a display device and a counter substrate.

The stacked-layer structure from the substrate 151 to the substrate 101 in the display unit 100F is similar to that in the display unit 100A; therefore, detailed description thereof is omitted.

A conductive layer 189c is electrically connected to an FPC 1 through a conductive layer 189d, a conductive layer 190e, and a conductive layer 195. The display unit 100F is supplied with a signal and power through the FPC 1.

The conductive layer 189c can be formed using the same material and in the same step as the conductive layer 189a. The conductive layer 189d can be formed using the same material and in the same step as the conductive layer 189b. The conductive layer 190e can be formed using the same material and in the same step as the conductive layers 190a to 190d.

As the conductive layer 195, for example, an anisotropic conductive film (ACF) or an anisotropic conductive paste (ACP) can be used.

A substrate 171 is provided with a touch sensor. The substrate 171 and the substrate 101 are bonded to each other with an adhesive layer 179 so that a surface of the substrate 171 over which the touch sensor is provided faces the substrate 101 side.

An electrode 177 and an electrode 178 are provided on the side of the substrate 171 that faces the substrate 101. The electrodes 177 and 178 are formed on the same plane. A material that transmits visible light is used for the electrodes 177 and 178. An insulating layer 173 is provided to cover the electrodes 177 and 178. An electrode 174 is electrically connected to two of the electrodes 178 that are provided on both sides of the electrode 177, through an opening provided in the insulating layer 173.

A wiring 172 that is obtained by processing the same conductive layer as the electrodes 177 and 178 is connected to a conductive layer 175 that is obtained by processing the same conductive layer as the electrode 174. The conductive layer 175 is electrically connected to an FPC 2 through a connector 176.

As described above, the display unit of this embodiment can be manufactured by bonding a plurality of light-emitting diodes and a plurality of transistors at one time, which leads to a reduction in manufacturing cost of the display unit and an improvement in yield. Moreover, by combining a micro LED and a transistor including a metal oxide, a display unit with reduced power consumption can be obtained.

In the display unit of this embodiment, the first insulating layer over the plurality of transistors and the second insulating layer over the plurality of light-emitting diodes are formed using films of the same material (preferably, oxide insulating films, further preferably silicon oxide films). Directly bonding the first insulating layer and the second insulating layer can increase the bonding strength. The third insulating layer is provided between the plurality of transistors and the first insulating layer, and the fourth insulating layer is provided between the plurality of the light-emitting diodes and the second insulating layer. As each of the third insulating layer and the fourth insulating layer, a film in which one or both of hydrogen and oxygen are less likely to be diffused than in the first and second insulating layers (preferably an aluminum oxide film, a hafnium oxide film, and a silicon nitride film, further preferably a silicon nitride film) is used. Thus, entry of impurities to the transistors and the light-emitting diodes can be favorably prevented.

The size of the transistors in the display unit of this embodiment can be reduced, which facilitates an increase in the resolution of the display unit and the application to an electronic device having a relatively small display portion.

This embodiment can be combined with any of the other embodiments as appropriate. In this specification, in the case where a plurality of structure examples are shown in one embodiment, the structure examples can be combined as appropriate.

Embodiment 2

In this embodiment, a display unit of one embodiment of the present invention will be described with reference to FIG. 8, FIG. 9, FIGS. 10A and 10B, FIG. 11, FIG. 12, and FIG. 13.

Although the display units 100D and 100E (FIGS. 5A and 5B) described in Structure example 2 of display unit in Embodiment 1 are each an example in which the substrate provided with the color conversion layer is bonded to the substrate provided with the transistors and the light-emitting diodes, the present invention is not limited thereto.

This embodiment shows an example in which the substrate on the light-emitting diode side is separated, and the color conversion layer is formed over a surface exposed by the separation.

Note that detailed description of the same components as those in Embodiment 1 is omitted in some cases.

The display unit of this embodiment includes a plurality of light-emitting diodes that are display devices, and a plurality of transistors for driving the display devices. The plurality of light-emitting diodes are disposed in a matrix. Each of the plurality of transistors is electrically connected to at least one of the plurality of light-emitting diodes.

The display unit of this embodiment is formed by bonding a plurality of transistors formed over a substrate and a plurality of light-emitting diodes formed over a different substrate.

Since the plurality of light-emitting diodes and the plurality of transistors are bonded to each other at one time in the method for manufacturing the display unit of this embodiment, even when the display unit is manufactured so as to have a large number of pixels or high definition, the manufacturing time of the display unit can be shortened and the degree of difficulty in the manufacture can be lowered as compared to those in the case of a method in which light-emitting diodes are mounted on a circuit board one by one.

The display unit of this embodiment has a stacked-layer structure that includes transistors each including a channel formation region in a semiconductor substrate and transistors each including a channel formation region in a metal oxide layer. This structure enables high speed operation of a circuit and extremely low power consumption.

As a method for manufacturing the display unit of one embodiment of the present invention, first, a plurality of first transistors each including a channel formation region in a first substrate are formed, a plurality of second transistors are formed in a matrix over the plurality of first transistors, and a first insulating layer and a plurality of first conductive layers are formed over the plurality of second transistors. Each of the plurality of first conductive layers is electrically connected to at least one of the plurality of second transistors. Here, the first insulating layer and the first conductive layer are formed so that the top surface of the first insulating layer and the top surface of the first conductive layer are level with each other. A plurality of light-emitting diodes are formed in a matrix over a second substrate, and a second insulating layer and a plurality of second conductive layers are formed over the plurality of light-emitting diodes. Each of the plurality of second conductive layers is electrically connected to at least one of the plurality of light-emitting diodes. Here, the second insulating layer and the second conductive layer are formed so that the top surface of the second insulating layer and the top surface of the second conductive layer are level with each other.

The first substrate and the second substrate are bonded to each other so that each of the plurality of second transistors is electrically connected to at least one of the plurality of light-emitting diodes. By bonding the first substrate and the second substrate, the plurality of light-emitting diodes and the plurality of second transistors can be bonded to each other at one time. Specifically, each of the plurality of first conductive layers is directly bonded to at least one of the plurality of second conductive layers. Thus, the second transistor can be electrically connected to the light-emitting diode through the first conductive layer and the second conductive layer. The first conductive layer and the second conductive layer preferably contain the same metal element as their main components, and further preferably, the first conductive layer and the second conductive layer are formed using the same material. The metal element is preferably gold, aluminum, tungsten, or copper, and gold is particularly preferable. Accordingly, the bonding strength between the first conductive layer and the second conductive layer can be increased. The first insulating layer is directly bonded to the second insulating layer. The first insulating layer and the second insulating layer are preferably formed using the same material, and in particular, a silicon oxide film is preferably used as each of the first insulating layer and the second insulating layer.

After that, the second substrate is separated, and at least one of a coloring layer, a color conversion layer, and a light-blocking layer is formed over the surface exposed by the separation.

In the display unit of one embodiment of the present invention, the pixels of each color preferably include light-emitting diodes that emit light of the same color. Accordingly, the manufacture of the display unit is facilitated, leading to simplification of the process and an improvement in the yield.

In this embodiment, an example in which the pixels of each color include light-emitting diodes that emit blue light is described. In a blue pixel, blue light emitted by the light-emitting diode is extracted to the outside of the display unit without passing through a color conversion layer. In each of a red pixel and a green pixel, blue light emitted by the light-emitting diode is converted into red light or green light by the color conversion layer and extracted to the outside of the display unit.

It is preferable that light emitted from the light-emitting diodes in the pixels of each color be extracted outside through the coloring layers. Thus, the color purity of the light can be increased. Note that in the pixels of at least one color, coloring layers are not necessarily provided. When a coloring layer is not provided, light emitted from the light-emitting diode can be efficiently extracted to the outside of the display unit.

The light-blocking layer is preferably provided between the pixels of each color. Thus, entry of light emitted from the light-emitting diode to an adjacent pixel (also referred to as crosstalk in light) can be inhibited. Accordingly, the display quality of the display unit can be improved.

In the manufactured display unit, a surface of the first conductive layer on the second conductive layer side is substantially level with a surface of the first insulating layer on the second insulating layer side. A surface of the second conductive layer on the first conductive layer side is substantially level with a surface of the second insulating layer on the first insulating layer side.

The display unit preferably includes transistors each including silicon in a channel formation region and transistors each including metal oxide in a channel formation region. For example, transistors including metal oxide in the channel formation regions may be used in a pixel circuit and a gate driver, and transistors including silicon in the channel formation regions may be used in a source driver. Alternatively, for example, transistors including metal oxide in the channel formation regions may be used in a pixel circuit, and transistors including silicon in the channel formation regions may be used in a source driver and a gate driver. Alternatively, transistors including silicon in the channel formation regions and/or transistors including metal oxide in the channel formation regions may be used as transistors included in a variety of circuits such as an arithmetic circuit and a memory circuit.

<Structure Example 4 of Display Unit>

Figure 8:
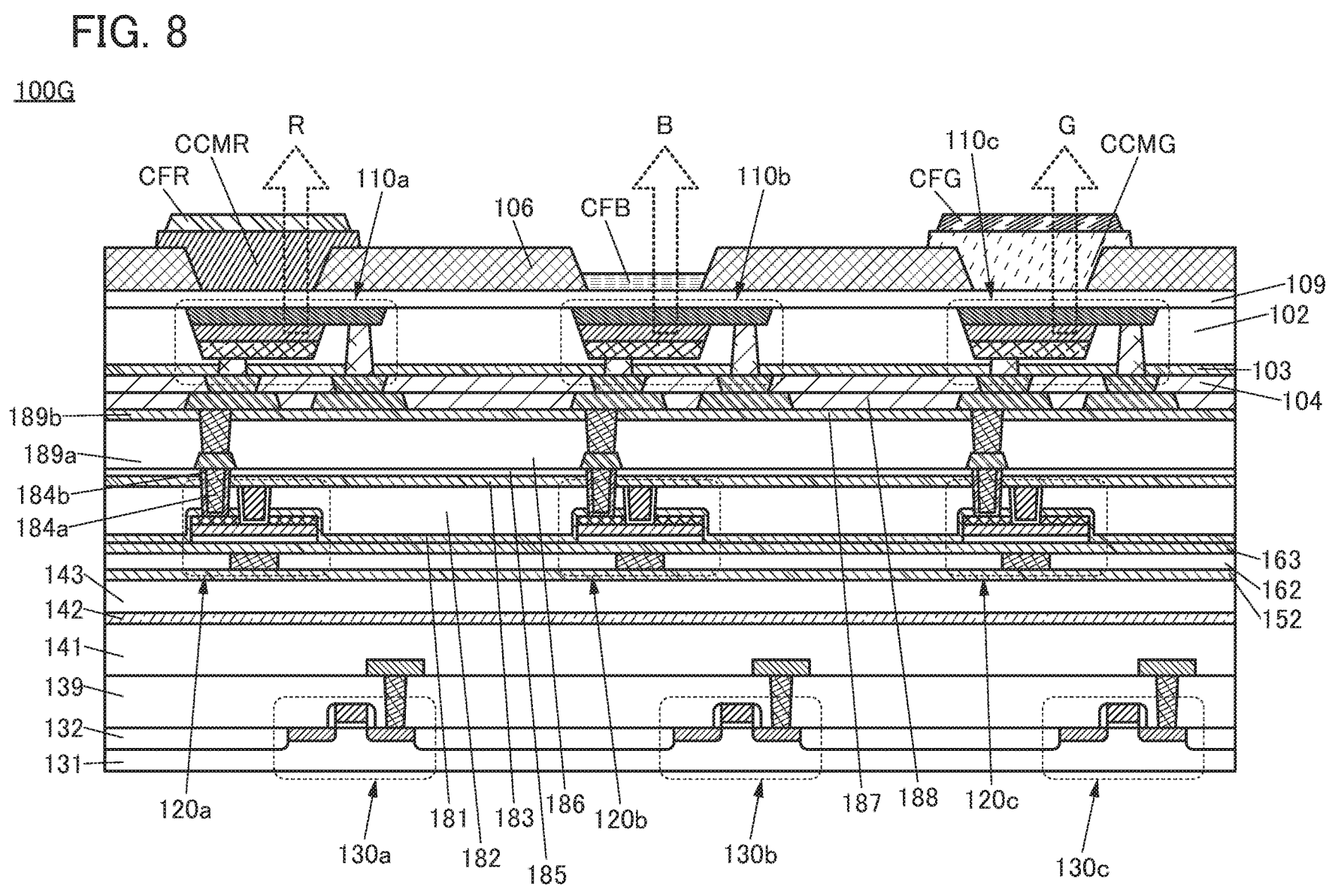
Figure 9:
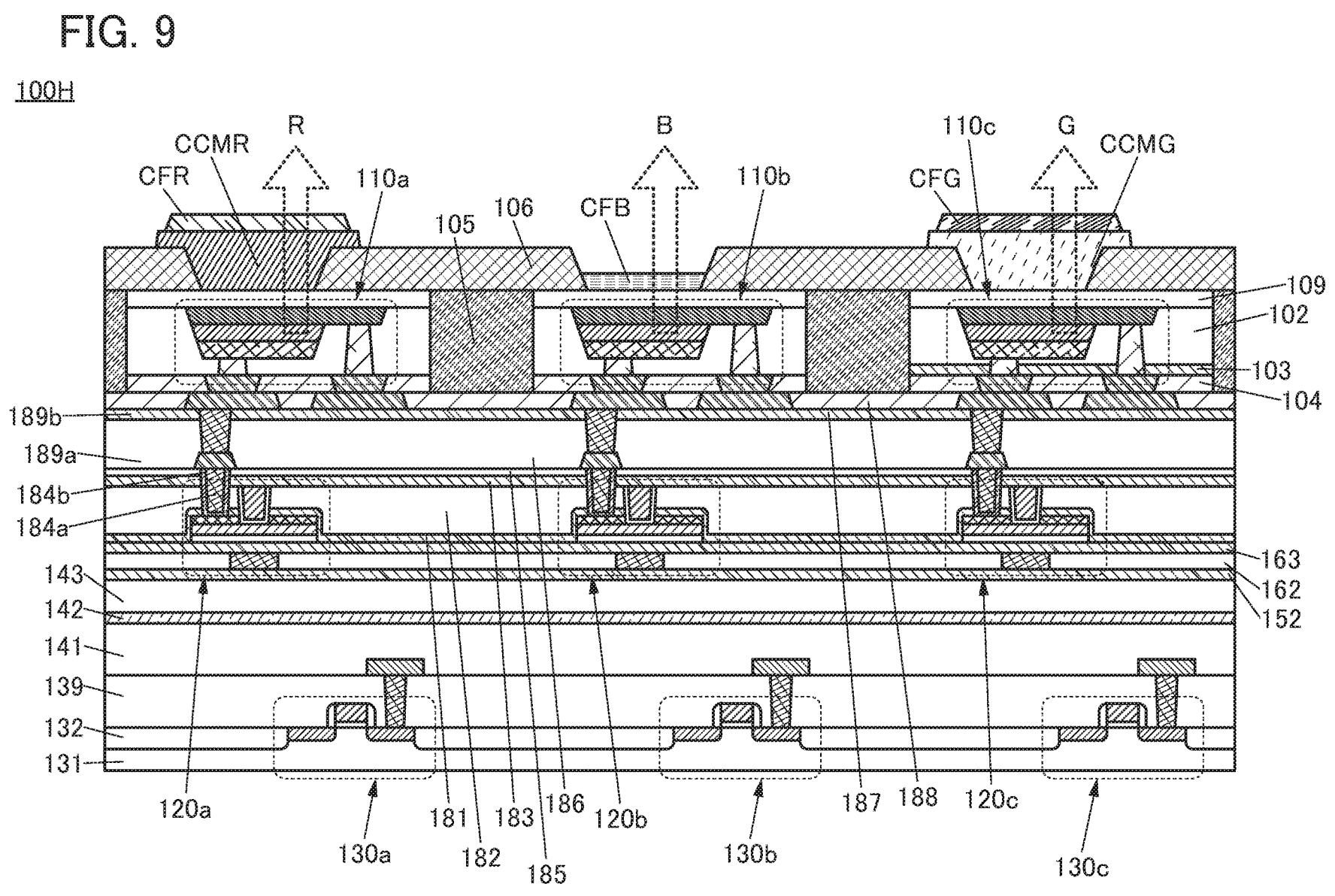

FIG. 8 is a cross-sectional view of a display unit 100G. FIG. 9 is a cross-sectional view of a display unit 100H. FIGS. 10A and 10B, FIG. 11, FIG. 12, and FIG. 13 are cross-sectional views illustrating a method for manufacturing the display unit 100G.

Each of the display unit 100G and the display unit 100H includes transistors 130*a*, 130*b* and 130*c* each of which includes silicon in the channel formation region, transistors 120*a*, 120*b* and 120*c* each of which includes metal oxide in the channel formation region, and light-emitting diodes 110*a* 110*b*, and 110*c*.

In the display units 100G and 100H, the pixels of each color include light-emitting diodes that emit blue light.

In the display units 100G and 100H, the coloring layer CFR and the color conversion layer CCMR are provided in a region overlapping with the light-emitting diode 110*a* of a red pixel. The color conversion layer CCMR has a function of converting blue light into red light.

Light emitted from the light-emitting diode 110*a* is converted from blue light into red light by the color conversion layer CCMR, the purity of the red light is improved by the coloring layer CFR, and the red light is emitted to the outside of the display unit 100G or 100H.

Similarly, in the display units 100G and 100H, a green coloring layer CFG and a color conversion layer CCMG that converts blue light into green light are provided in a region overlapping with the light-emitting diode 110*c* of a green pixel. Thus, light emitted from light-emitting diode 110*c* is converted from blue light into green light by the color conversion layer CCMG, the purity of the green light is improved by the coloring layer CFG, and the green light is emitted to the outside of the display unit 100G or 100H.

On the other hand, in the display units 100G and 100H, a color conversion layer is not provided in a region overlapping with the light-emitting diode 110*b* of a blue pixel. Blue light emitted from the light-emitting diode 110*b* is emitted to the outside of the display unit 100G or 100H through a coloring layer CFB without color conversion.

In the display unit 100G or 100H, the blue coloring layer CFB is preferably provided in a region overlapping with the light-emitting diode 110*b* of the blue pixel. In this case, the purity of the blue light can be increased. In the case where the blue coloring layer CFB is not provided, the manufacturing process can be simplified. In addition, when the blue coloring layer CFB is not provided, light emitted from the light-emitting diode 110*b* can be efficiently extracted to the outside of the display unit.

In manufacturing the display units 100G and 100H in each of which the pixels of each color include light-emitting diodes having the same structures, since only light-emitting diodes of the same kind are formed over a substrate, a manufacturing apparatus and manufacturing process can be simplified compared to the case where a plurality of kinds of light-emitting diodes are formed.

A light-blocking layer 106 is provided between the pixels of each color. The light-blocking layer 106 is provided over a base film 109. With the light-blocking layer 106, light emitted from the light-emitting diode can be prevented from entering an adjacent pixel of another color. Thus, the display quality of the display unit can be improved.

The display unit 100H in FIG. 9 is different from the display unit 100G in FIG. 8 in that a light-blocking layer 105 is provided. The display unit of one embodiment of the present invention preferably includes the light-blocking layer 105. The light-blocking layer 105 is provided to fill an opening provided in the base film 109, the insulating layer 102, the insulating layer 103, and the insulating layer 104. With the light-blocking layer 105, light emitted from the light-emitting diode can be prevented from entering an adjacent pixel of another color. Thus, the display quality of the display unit can be improved. Note that the opening is not necessarily provided in the base film 109 or in the insulating layer 104. The light-blocking layer 105 can be formed to fill an opening provided in at least one of the base film 109, the insulating layer 102, the insulating layer 103, and the insulating layer 104.

There is no particular limitation on materials of the light-blocking layers 106 and 105; for example, an inorganic material such as a metal material or an organic material such as a resin material containing a pigment (e.g., carbon black) or dye can be used. Alternatively, the light-blocking layer may be formed by stacking color filters that are used for the coloring layers for every color. For example, the light-blocking layer may be formed by stacking three color filters of red, green, and blue.

Figures 10A, 10B:
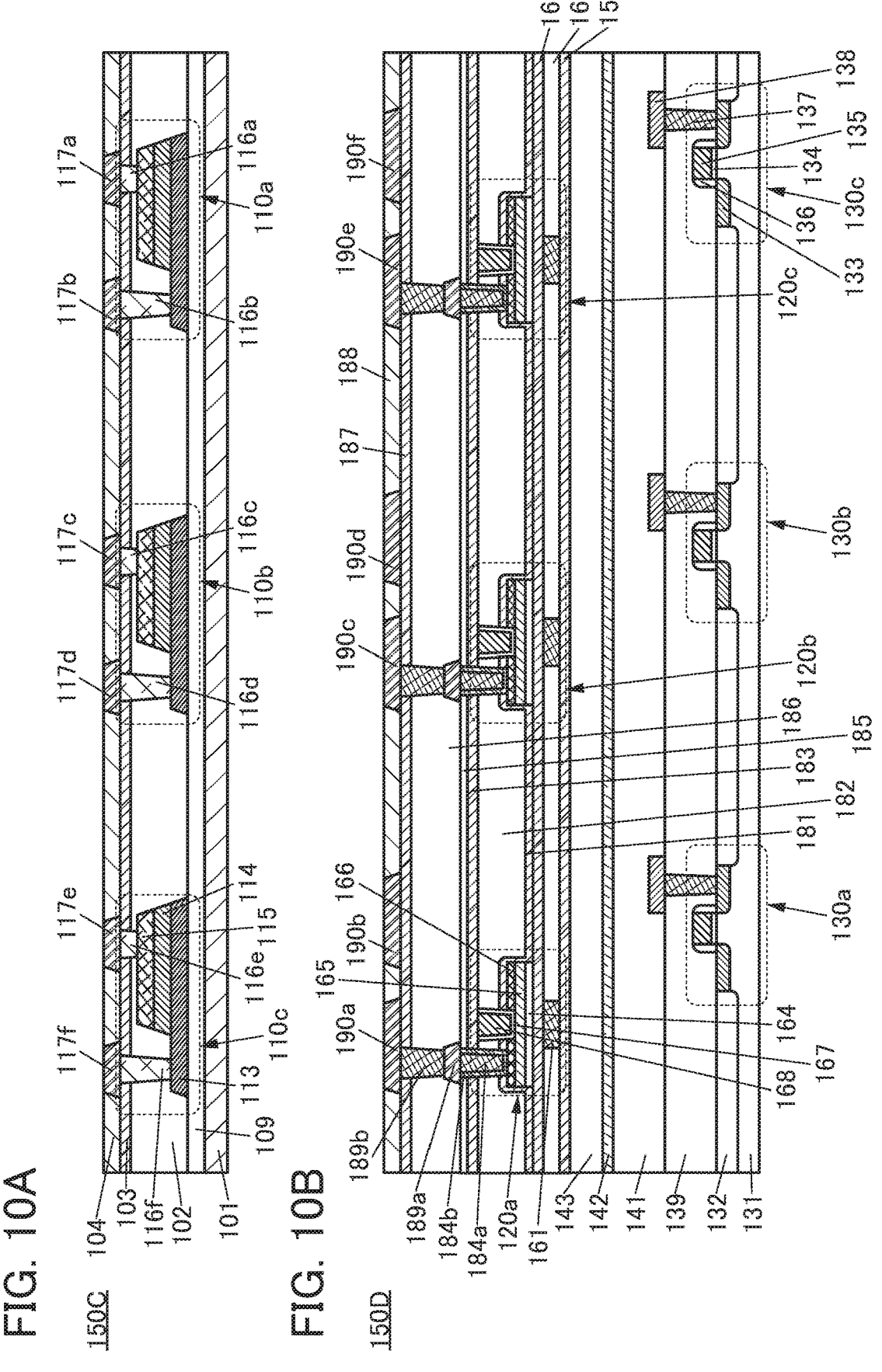
FIGS. 10A and 10B are cross-sectional views illustrating an example of a method for manufacturing a display unit.

The display unit 100G illustrated in FIG. 8 can be manufactured in the following manner: first, an LED substrate 150C illustrated in FIG. 10A and a circuit board 150D illustrated in FIG. 10B are bonded to each other (see FIG. 11), the substrate 101 of the LED substrate 150C is separated (see FIG. 12 and FIG. 13), and a coloring layer, a color conversion layer, the light-blocking layer 106, and the like are formed over the surface exposed by the separation.

FIG. 10A is a cross-sectional view of the LED substrate 150C.

The LED substrate 150C includes the substrate 101, the base film 109, the light-emitting diode 110*a*, the light-emitting diode 110*b*, the light-emitting diode 110*c*, the insulating layer 102, the insulating layer 103, and the insulating layer 104. The base film 109, the insulating layer 102, the insulating layer 103, and the insulating layer 104 may each have a single-layer structure or a stacked-layer structure. Note that in the case where the display unit 100H in FIG. 9 is manufactured, the LED substrate 150C further includes the light-blocking layer 105.

The light-emitting diodes 110*a*, 110*b*, and 110*c* emit light of the same color. Each of the light-emitting diodes includes a semiconductor layer 113, a light-emitting layer 114, and a semiconductor layer 115. The light-emitting diode 110*a* further includes the conductive layer 116*a*, the conductive layer 116*b*, the electrode 117*a*, and the electrode 117*b*. The light-emitting diode 110*b* further includes the conductive layer 116*c*, the conductive layer 116*d*, the electrode 117*c*, and the electrode 117*d*. The light-emitting diode 110*c* further includes a conductive layer 116*e*, a conductive layer 116*f*, an electrode 117*e*, and an electrode 117*f*. The layers included in the light-emitting diodes may each have a single-layer structure or a stacked-layer structure.

The base film 109 is provided over the substrate 101, the semiconductor layer 113 is provided over the base film 109, the light-emitting layer 114 is provided over the semiconductor layer 113, and the semiconductor layer 115 is provided over the light-emitting layer 114.

The electrode 117*a* is electrically connected to the semiconductor layer 115 included in the light-emitting diode 110*a* through the conductive layer 116*a*. The electrode 117*b* is electrically connected to the semiconductor layer 113 included in the light-emitting diode 110*a* through the conductive layer 116*b*.

Similarly, the electrode 117*c* is electrically connected to the semiconductor layer 115 included in the light-emitting diode 110*b* through the conductive layer 116*c*. The electrode 117*d* is electrically connected to the semiconductor layer 113 included in the light-emitting diode 110*b* through the conductive layer 116*d*.

The electrode 117*e* is electrically connected to the semiconductor layer 115 included in the light-emitting diode 110*c* through the conductive layer 116*e*. The electrode 117*f* is electrically connected to the semiconductor layer 113 included in the light-emitting diode 110*c* through the conductive layer 116*f*.

The insulating layer 102 is provided to cover the substrate 101, the semiconductor layer 113, the light-emitting layer 114, and the semiconductor layer 115. The insulating layer 102 preferably has a planarization function. The insulating layer 103 is provided over the insulating layer 102. The conductive layers 116*a*, 116*b*, 116*c*, 116*d*, 116*e*, and 116*f* are provided to fill openings provided in the insulating layer 102 and the insulating layer 103. It is preferable that the top surfaces of the conductive layers 116*a*, 116*b*, 116*c*, 116*d*, 116*e*, and 116*f* be substantially level with the top surface of the insulating layer 103. The insulating layer 104 is provided over the conductive layers 116*a*, 116*b*, 116*c*, 116*d*, 116*e*, and 116*f* and the insulating layer 103. The electrodes 117*a*, 117*b*, 117*c*, 117*d*, 117*e*, and 117*f* are provided to fill openings provided in the insulating layer 104. It is preferable that the top surfaces of the electrodes 117*a*, 117*b*, 117*c*, 117*d*, 117*e*, and 117*f* be substantially level with the top surface of the insulating layer 104.

The display unit of this embodiment includes at least one structure in which the top surface of the insulating layer is substantially level with the top surface of the conductive layer. An example of a method for manufacturing the structure is a method in which an insulating layer is formed, an opening is provided in the insulating layer, and a conductive layer is formed so as to fill the opening, and then, planarization treatment is performed by a CMP method or the like. Thus, the top surface of the conductive layer can be level with the top surface of the insulating layer.

Embodiment 1 can be referred to for materials that can be used for the components of the LED substrate 150C.

The base film 109 is preferably formed using an inorganic insulating material such as silicon oxide, silicon oxynitride, silicon nitride oxide, silicon nitride, aluminum oxide, hafnium oxide, or titanium nitride.

As the insulating layer 103, for example, a film in which one or both of hydrogen and oxygen are less likely to be diffused than in a silicon oxide film can be used. The insulating layer 103 preferably functions as a barrier layer that prevents diffusion of impurities from the LED substrate 150C into the circuit board 150D.

It is particularly preferable to use an oxide insulating film as the insulating layer 104. The insulating layer 104 is a layer that is directly bonded to the insulating layer included in the circuit board 150D. The oxide insulating films are directly bonded to each other, whereby the bonding strength (attachment strength) can be increased.

As the electrodes 117a to 117d, for example, Cu, Al, Sn, Zn, W, Ag, Pt, Au, or the like can be used. The electrodes 117a to 117d are layers that are directly bonded to the conductive layers included in the circuit board 150D. Preferably, Cu, Al, W, or Au is used for easy bonding.

As the substrate 101, for example, a single crystal substrate of sapphire ($Al_2O_3$), silicon carbide (SiC), silicon (Si), or gallium nitride (GaN) can be used. Note that in this embodiment, since the substrate 101 is to be separated in a later step, the substrate 101 does not necessarily have a transmitting property with respect to visible light.

FIG. 10B is a cross-sectional view of the circuit board 150D.

The circuit board 150D has the same structure as the stacked-layer structure from the substrate 131 to the insulating layer 188 of the display unit 100C illustrated in FIG. 4; therefore, detailed description thereof is omitted in some cases. Embodiment 1 can be referred to for material that can be used for the components of the circuit board 150D.

The circuit board 150D has a stacked-layer structure which includes transistors each including a channel formation region in the substrate 131 (the transistors 130a, 130b, and 130c) and transistors each including a channel formation region in a metal oxide layer (the transistors 120a, 120b, and 120c). Note that each of the layers included in the circuit board 150D may have either a single-layer structure or a stacked-layer structure.

A single crystal silicon substrate is preferably used as the substrate 131. Alternatively, a compound semiconductor substrate may be used as the substrate 131.

The transistors 130a, 130b, and 130c each include the conductive layer 135, the insulating layer 134, the insulating layer 136, and the pair of low-resistance regions 133. The conductive layer 135 functions as a gate. The insulating layer 134 is positioned between the conductive layer 135 and the substrate 131 and functions as a gate insulating layer. The insulating layer 136 is provided to cover the side surface of the conductive layer 135 and functions as a sidewall. The pair of low-resistance regions 133 in the substrate 131 is doped with an impurity; one of the pair of low-resistance regions 133 functions as a source of the transistor and the other functions as a drain of the transistor.

The element isolation layer 132 is provided between two adjacent transistors to be embedded in the substrate 131.

The insulating layer 139 is provided to cover the transistors 130a, 130b, and 130c, and the conductive layer 138 is provided over the insulating layer 139. The conductive layer 138 is electrically connected to one of the pair of low-resistance regions 133 through the conductive layer 137 provided to fill an opening in the insulating layer 139. An insulating layer 141 is provided to cover the conductive layer 138, and a conductive layer 142 is provided over the insulating layer 141. The conductive layer 138 and the conductive layer 142 each function as a wiring. The insulating layer 143 and the insulating layer 152 are provided to cover the conductive layer 142.

The insulating layer 152 functions as a barrier layer that prevents diffusion of impurities such as water and hydrogen from the transistor 130a side, the transistor 130b side, and the transistor 130c side into the transistor 120a, the transistor 120b, and the transistor 120c, and prevents release of oxygen from the metal oxide layer 165 to the insulating layer 152 side. As the insulating layer 152, a film in which hydrogen and oxygen are less likely to be diffused than in a silicon oxide film can be used.

The transistors 120a, 120b, and 120c each include the conductive layer 161, the insulating layer 163, the insulating layer 164, the metal oxide layer 165, the pair of conductive layers 166, the insulating layer 167, the conductive layer 168, and the like.

The metal oxide layer 165 includes a channel formation region. The metal oxide layer 165 includes a first region overlapping with one of the pair of conductive layers 166, a second region overlapping with the other of the pair of conductive layers 166, and a third region between the first region and the second region.

The conductive layer 161 and the insulating layer 162 are provided over the insulating layer 152, and the insulating layers 163 and 164 are provided to cover the conductive layer 161 and the insulating layer 162. The metal oxide layer 165 is provided over the insulating layer 164. The conductive layer 161 functions as a gate electrode, and the insulating layers 163 and 164 each function as a gate insulating layer. The conductive layer 161 overlaps with the metal oxide layer 165 with the insulating layers 163 and 164 therebetween. The insulating layer 163 preferably functions as a barrier layer like the insulating layer 152. As the insulating layer 164 in contact with the metal oxide layer 165, an oxide insulating film such as a silicon oxide film is preferably used.

Here, the top surface of the conductive layer 161 is substantially level with the top surface of the insulating layer 162. Accordingly, the size of the transistors 120a and 120b can be reduced.

The pair of conductive layers 166 is provided over the metal oxide layer 165 so that the conductive layers 166 are apart from each other. The pair of conductive layers 166 functions as a source and a drain. The insulating layer 181 is provided to cover the metal oxide layer 165 and the pair of conductive layers 166, and the insulating layer 182 is provided over the insulating layer 181. An opening reaching the metal oxide layer 165 is provided in the insulating layers 181 and 182, and the insulating layer 167 and the conductive layer 168 are provided to fill the opening. The opening overlaps with the third region. The insulating layer 167 overlaps with the side surfaces of the insulating layers 181 and 182. The conductive layer 168 overlaps with the side surfaces of the insulating layers 181 and 182 with the insulating layer 167 therebetween. The conductive layer 168 functions as a gate electrode, and the insulating layer 167 functions as a gate insulating layer. The conductive layer 168 overlaps with the metal oxide layer 165 with the insulating layer 167 therebetween.

Here, the top surface of the conductive layer 168 is substantially level with the top surface of the insulating layer 182. Accordingly, the size of the transistors 120a and 120b can be reduced.

The insulating layers 183 and 185 are provided to cover the top surfaces of the insulating layers 182 and 167 and the conductive layer 168. The insulating layers 181 and 183 each preferably function as a barrier layer like the insulating layer 152. When the pair of conductive layers 166 is covered with the insulating layer 181, oxidation of the pair of conductive layers 166 due to oxygen contained in the insulating layer 182 can be inhibited.

A plug electrically connected to one of the pair of conductive layers 166 and the conductive layer 189a is provided to fill an opening provided in the insulating layers 181, 182, 183, and 185. The plug preferably includes the conductive layer 184b in contact with the side surface of the opening and the top surface of one of the pair of conductive layers 166, and the conductive layer 184a embedded inside the conductive layer 184b. Here, a conductive material in which hydrogen and oxygen are less likely to be diffused is preferably used for the conductive layer 184b.

The conductive layer 189a and the insulating layer 186 are provided over the insulating layer 185, the conductive layer 189b is provided over the conductive layer 189a, and the insulating layer 187 is provided over the insulating layer 186. The insulating layer 186 preferably has a planarization function. Here, the top surface of the conductive layer 189b is substantially level with the top surface of the insulating layer 187. An opening reaching the conductive layer 189a is provided in the insulating layers 187 and 186, and the conductive layer 189b is provided to fill the opening. The conductive layer 189b functions as a plug for electrically connecting the conductive layer 189a and the conductive layer 190a or 190c.

One of the pair of conductive layers 166 of the transistor 120a is electrically connected to the conductive layer 190a through the conductive layers 184a, 184b, 189a, and 189b.

Similarly, one of the pair of conductive layers 166 of the transistor 120b is electrically connected to the conductive layer 190c through the conductive layers 184a, 184b, 189a, and 189b.

One of the pair of conductive layers 166 of the transistor 120c is electrically connected to the conductive layer 190e through the conductive layers 184a, 184b, 189a, and 189b.

As the insulating layer 187, for example, a film in which one or both of hydrogen and oxygen are less likely to be diffused than in a silicon oxide film can be used. The insulating layer 187 preferably functions as a barrier layer that prevents diffusion of impurities (e.g., hydrogen and water) from the LED substrate 150C into the transistor. The insulating layer 187 preferably functions as a barrier layer that prevents diffusion of impurities from the circuit board 150D into the LED substrate 150C.

The insulating layer 188 is a layer that is directly bonded to the insulating layer 104 included in the LED substrate 150C. The insulating layer 188 is preferably formed using the same material as the insulating layer 104. An oxide insulating film is preferably used as the insulating layer 188. The oxide insulating films are directly bonded to each other, whereby the bonding strength (attachment strength) can be increased. Note that in the case where one or both of the insulating layers 104 and 188 have a stacked-layer structure, layers (including a surface layer and a bonding surface) that are in contact with each other are preferably formed using the same material.

The conductive layers 190a to 190e and a conductive layer 190f are layers that are directly bonded to the electrodes 117a to 117f of the LED substrate 150C. It is preferable that the main components of the conductive layers 190a to 190f and the main components of the electrodes 117a to 117f be the same metal element and further preferable that the conductive layers 190a to 190f and the electrodes 117a to 117f be formed using the same material. For the conductive layers 190a to 190f, for example, Cu, Al, Sn, Zn, W, Ag, Pt, Au, or the like can be used. Preferably, Cu, Al, W, or Au is used for easy bonding. Note that in the case where one or both of the conductive layer 190 and the electrode 117 have a stacked-layer structure, layers (including a surface layer and a bonding surface) that are in contact with each other are preferably formed using the same material.

Note that the circuit board 150D may include one or both of a reflective layer that reflects light of a light-emitting diode and a light-blocking layer that blocks the light.

Figure 11:
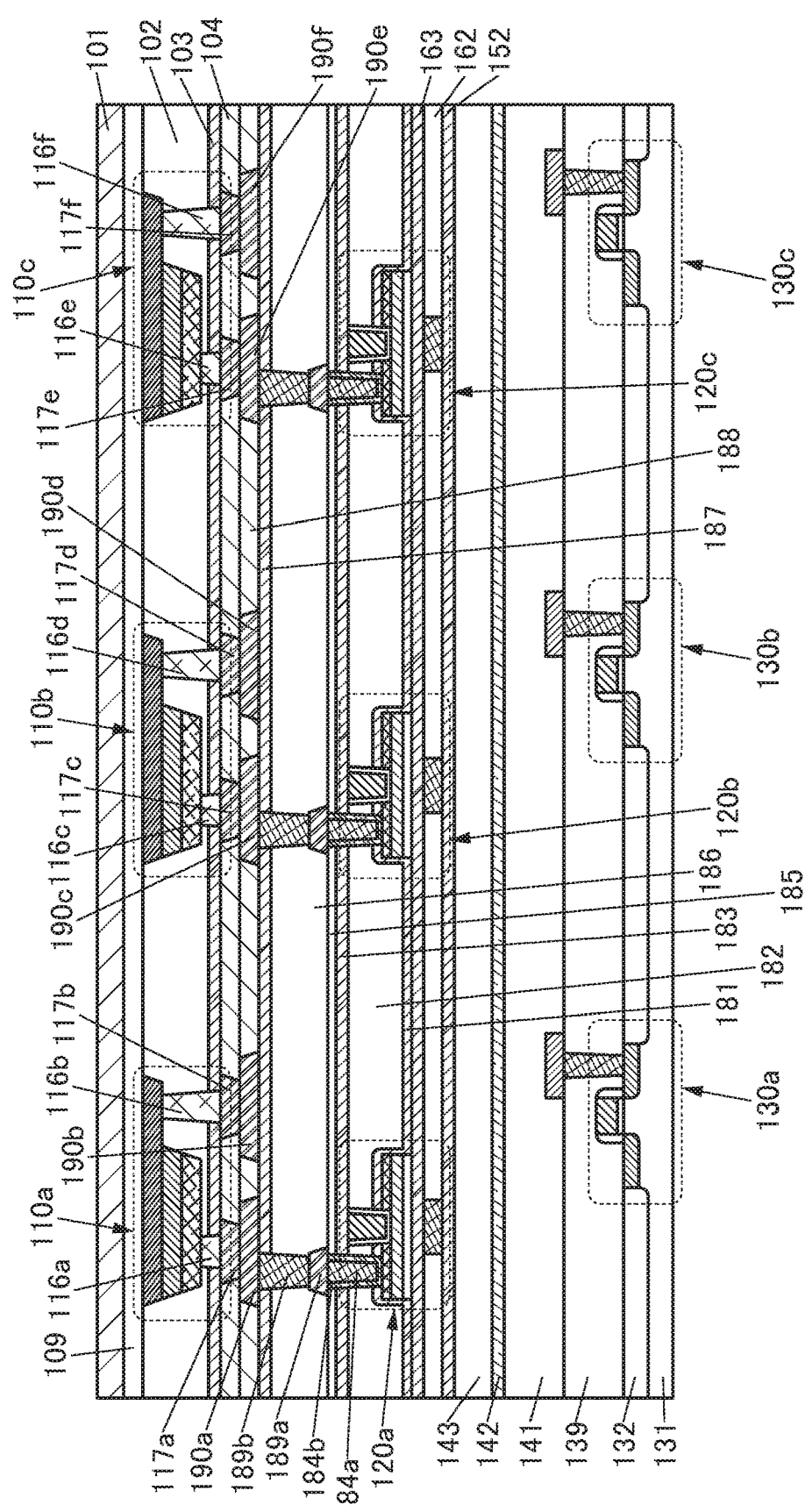
FIG. 11 is a cross-sectional view illustrating an example of a method for manufacturing a display unit.

As illustrated in FIG. 11, the electrodes 117a, 117b, 117c, 117d, 117e, and 117f, which are provided in the LED substrate 150C, are respectively bonded to and electrically connected to the conductive layers 190a, 190b, 190c, 190d, 190e, and 190f, which are provided in the circuit board 150D.

For example, the electrode 117a and the conductive layer 190a are connected to each other, whereby the transistor 120a and the light-emitting diode 110a can be electrically connected to each other. The electrode 117a functions as a pixel electrode of the light-emitting diode 110a. The electrode 117b and the conductive layer 190b are connected to each other. The electrode 117b functions as a common electrode of the light-emitting diode 110a.

Similarly, the electrode 117c and the conductive layer 190c are connected to each other, whereby the transistor 120b and the light-emitting diode 110b can be electrically connected to each other. The electrode 117c functions as a pixel electrode of the light-emitting diode 110b. The electrode 117d and the conductive layer 190d are connected to each other. The electrode 117d functions as a common electrode of the light-emitting diode 110b.

The electrode 117e and the conductive layer 190e are connected to each other, whereby the transistor 120c and the light-emitting diode 110c can be electrically connected to each other. The electrode 117e functions as a pixel electrode of the light-emitting diode 110c. The electrode 117f and the conductive layer 190f are connected to each other. The electrode 117f functions as a common electrode of the light-emitting diode 110c.

It is preferable that the main components of the electrodes 117a, 117b, 117c, 117d, 117e, and 117f and the main components of the conductive layers 190a, 190b, 190c, 190d, 190e, and 190f be the same metal element.

The insulating layer 104 provided in the LED substrate 150C and the insulating layer 188 provided in the circuit board 150D are directly bonded to each other. The insulating layers 104 and 188 are preferably formed of the same main component or formed using the same material.

The layers formed using the same material are in contact with each other at the bonding surface between the LED substrate 150C and the circuit board 150D, whereby connection with mechanical strength can be obtained.

After bonding the LED substrate 150C and the circuit board 150D, the substrate 101 is separated.

Figure 12:
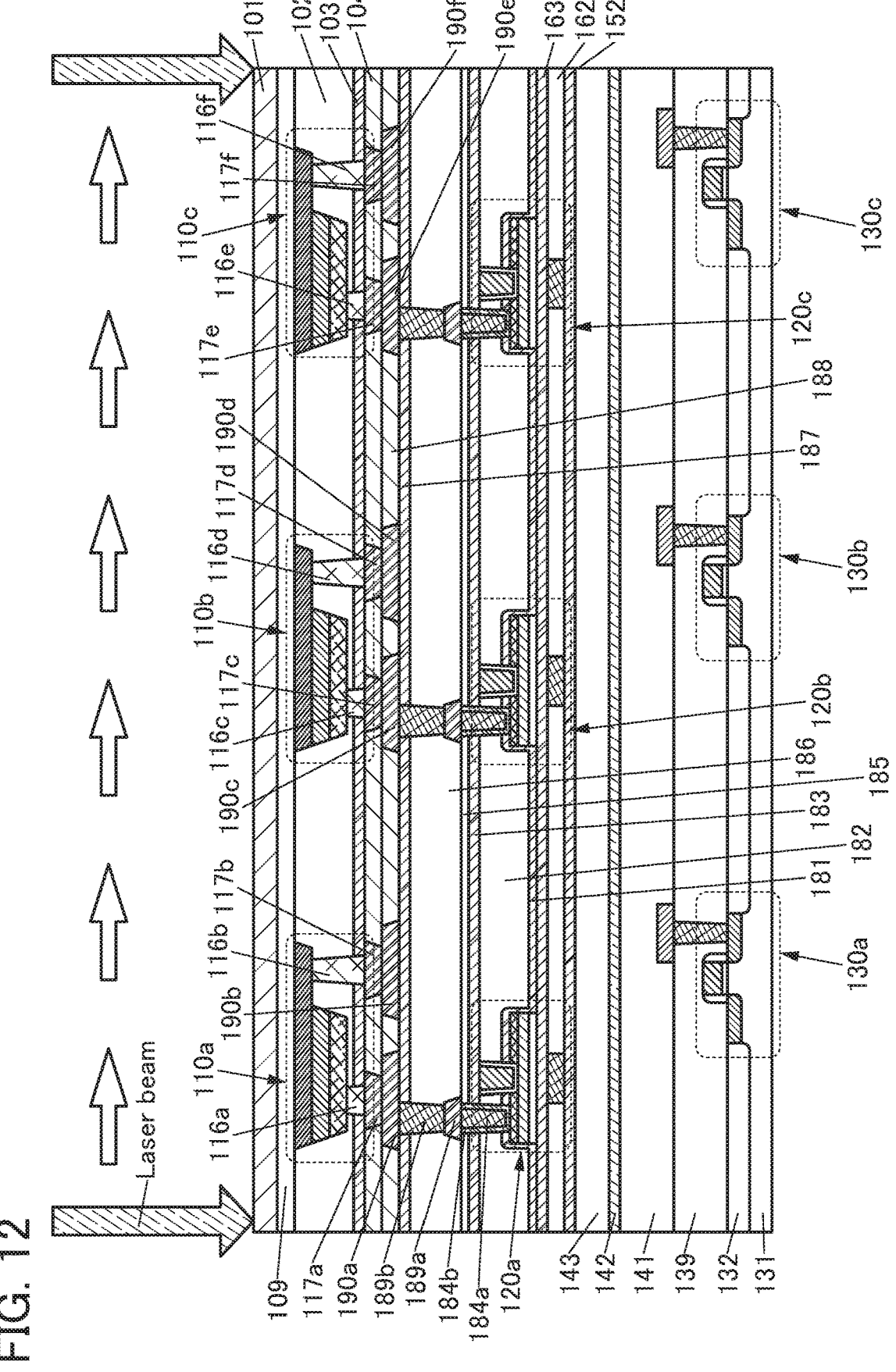
FIG. 12 is a cross-sectional view illustrating an example of a method for manufacturing a display unit.
Figure 13:
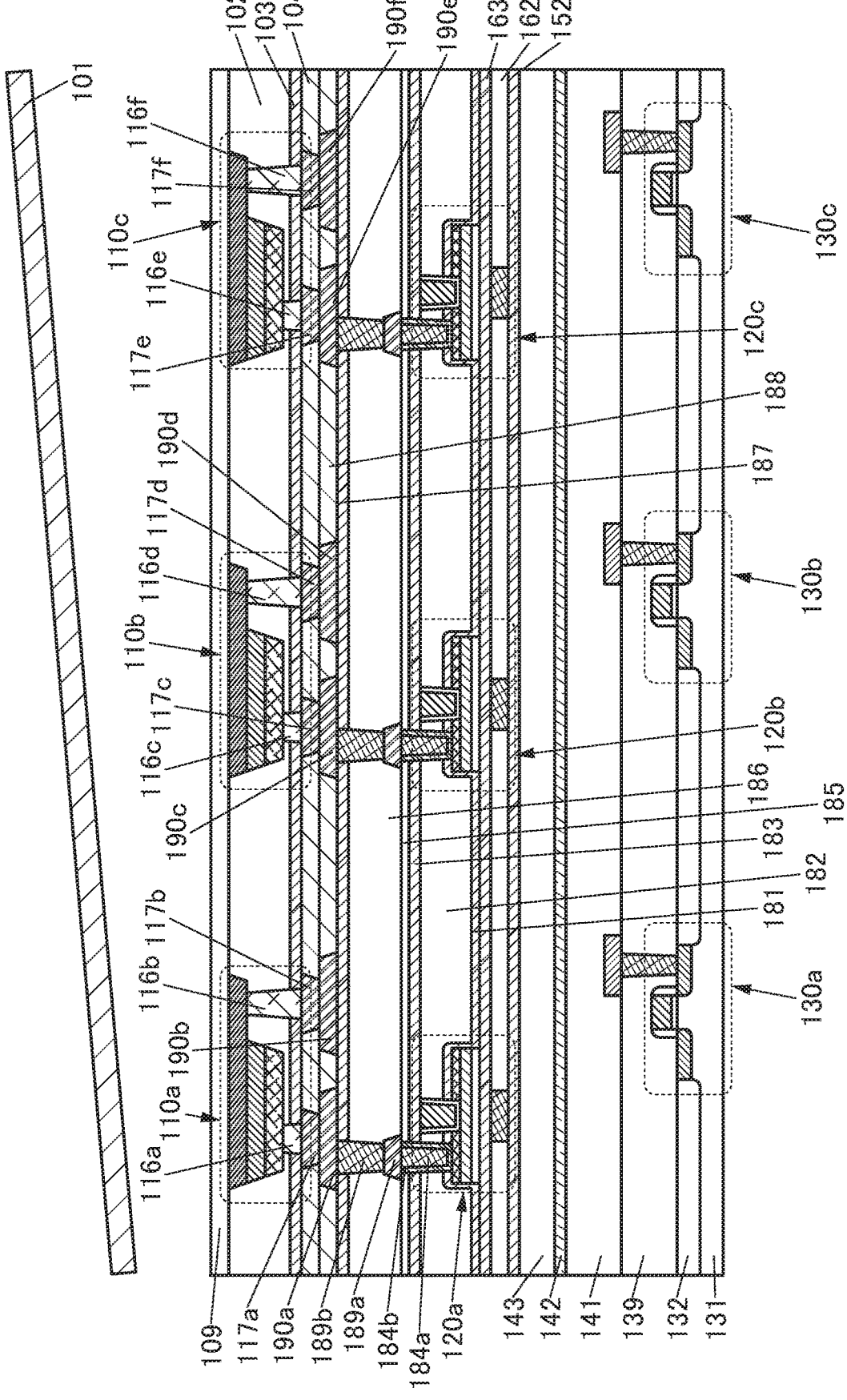
FIG. 13 is a cross-sectional view illustrating an example of a method for manufacturing a display unit.

There is no limitation on the method for separating the substrate 101; for example, a method in which the entire surface of the substrate 101 is irradiated with a laser beam as illustrated in FIG. 12 may be used. Thus, the substrate 101 can be separated, and the base film 109 can be exposed (FIG. 13).

A separation layer may be provided between the substrate 101 and the light-emitting diodes 110a and 110b. Embodiment 1 can be referred to for a material that can be used for the separation layer.

Then, the light-blocking layer 106, the color conversion layer CCMR, the color conversion layer CCMG, the coloring layer CFR, the coloring layer CFG, and the coloring layer CFB are formed over the base film 109.

Specifically, the light-blocking layer 106 is formed between the red pixel and the blue pixel and between the blue pixel and the green pixel.

The color conversion layer CCMR is formed in a region overlapping with the light-emitting diode 110*a* of the red pixel, and the coloring layer CFR is formed over the color conversion layer CCMR. Similarly, the color conversion layer CCMG is formed in a region overlapping with the light-emitting diode 110*c* of the green pixel, and the coloring layer CFG is formed over the color conversion layer CCMG. The coloring layer CFB is formed in a region overlapping with the light-emitting diode 110*b* of the blue pixel.

As the color conversion layer, a phosphor or a quantum dot (QD) is preferably used. In particular, a quantum dot has an emission spectrum with a narrow peak, so that emission with high color purity can be obtained. Accordingly, the display quality of the display unit can be improved.

The color conversion layer can be formed by a droplet discharge method (e.g., an inkjet method), a coating method, an imprinting method, a variety of printing methods (screen printing or offset printing), or the like. A color conversion film such as a quantum dot film may also be used.

Embodiment 1 can be referred to for the details of the quantum dot.

The coloring layer is a colored layer that transmits light in a specific wavelength range. For example, a color filter for transmitting light in a red, green, blue, or yellow wavelength range can be used. Examples of a material that can be used for the coloring layer include a metal material, a resin material, and a resin material containing a pigment or dye.

As described above, the display unit of this embodiment can be manufactured by bonding a plurality of light-emitting diodes and a plurality of transistors at a time, which leads to a reduction in manufacturing cost of the display unit and an improvement in yield. A micro LED, a transistor using metal oxide, and a transistor using a semiconductor substrate (in particular, a silicon substrate) are combined, whereby a display unit in which the circuit can be operated at high speed and the power consumption is reduced can be obtained.

In the display unit of this embodiment, a substrate provided with light-emitting diodes is separated, and color conversion layers, coloring layers, light-blocking layers, and the like are provided over a surface exposed by the separation. Thus, the display quality of the display unit can be improved.

The size of the transistors in the display unit of this embodiment can be reduced, which facilitates an increase in the resolution of the display unit and the application to an electronic device having a relatively small display portion.

This embodiment can be combined with any of the other embodiments as appropriate.

Embodiment 3

In this embodiment, a transistor that can be used in the display unit of one embodiment of the present invention will be described.

There is no particular limitation on the structure of the transistor in the display unit. For example, a planar transistor, a staggered transistor, or an inverted staggered transistor may be used. A top-gate transistor or a bottom-gate transistor may be used. Gate electrodes may be provided above and below a channel.

As the transistor of the display unit, a transistor containing metal oxide in a channel formation region can be used, for example. Therefore, a transistor with an extremely low off-state current can be obtained.

As the transistor of the display unit, a transistor containing silicon in a channel formation region may be used. Examples of the transistor include a transistor containing amorphous silicon, a transistor containing crystalline silicon (typically, low-temperature polysilicon), and a transistor containing single crystal silicon. For example, a transistor containing metal oxide in a channel formation region and a transistor containing silicon in a channel formation region may be used in combination.

Note that in this specification and the like, a transistor is an element having at least three terminals: a gate, a drain, and a source. The transistor includes a region where a channel is formed (hereinafter also referred to as a channel formation region) between the drain (a drain terminal, a drain region, or a drain electrode) and the source (a source terminal, a source region, or a source electrode), and current can flow between the source and the drain through the channel formation region. Note that in this specification and the like, a channel formation region refers to a region through which current mainly flows.

Furthermore, functions of a source and a drain might be switched when a transistor of opposite polarity is employed or when a direction of current flow is changed in circuit operation, for example. Therefore, the terms "source" and "drain" can be interchanged in some cases in this specification and the like.

Note that a channel length refers to, for example, a distance between a source (source region or source electrode) and a drain (drain region or drain electrode) in a region where a semiconductor (or a portion where a current flows in a semiconductor when a transistor is on) and a gate electrode overlap each other or in a channel formation region in a top view of the transistor. In one transistor, channel lengths in all regions are not necessarily the same. In other words, the channel length of one transistor is not fixed to one value in some cases. Therefore, in this specification, the channel length is any one of values, the maximum values, the minimum value, or the average value in a channel formation region.

A channel width refers to, for example, the length of a channel formation region perpendicular to a channel length direction in a region where a semiconductor (or a portion where a current flows in a semiconductor when a transistor is on) and a gate electrode overlap with each other or in the channel formation region in a top view of the transistor. In one transistor, channel widths in all regions are not necessarily the same. In other words, the channel width of one transistor is not fixed to one value in some cases. Therefore, in this specification, the channel width is any one of values, the maximum value, the minimum value, or the average value in a channel formation region.

Note that in this specification and the like, depending on the transistor structure, a channel width in a region where a channel is actually formed (hereinafter also referred to as an effective channel width) is different from a channel width shown in a top view of a transistor (hereinafter also referred to as an apparent channel width) in some cases. For example, in a transistor having a gate electrode covering the side surface of a semiconductor, the effective channel width is larger than the apparent channel width, and its influence cannot be ignored in some cases. As another example, in a miniaturized transistor having a gate electrode covering the side surface of a semiconductor, the proportion of a channel formation region formed on the side surface of the semiconductor is sometimes increased. In that case, the effective channel width is larger than the apparent channel width.

In such cases, an effective channel width is sometimes difficult to estimate by measuring. For example, to estimate an effective channel width from a design value, it is necessary to assume that the shape of a semiconductor is known. Accordingly, in the case where the shape of a semiconductor is not known exactly, it is difficult to measure an effective channel width accurately.

In this specification, the simple term "channel width" denotes an apparent channel width in some cases. In other cases, the simple term "channel width" denotes an effective channel width. Note that the values of a channel length, a channel width, an effective channel width, an apparent channel width, and the like can be determined by analyzing a cross-sectional image obtained by a transmission electron microscope (TEM) and the like.

An insulator, a conductor, an oxide, or a semiconductor may be deposited by a sputtering method, a chemical vapor deposition (CVD) method, a molecular beam epitaxy (MBE) method, a pulsed laser deposition (PLD) method, an atomic layer deposition (ALD) method, or the like. In this specification and the like, the term "insulator" can be replaced with an insulating film or an insulating layer. The term "conductor" can be replaced with a conductive film or a conductive layer. The term "oxide" can be replaced with an oxide film or an oxide layer . The term "semiconductor" can be replaced with a semiconductor film or a semiconductor layer.

FIG. 14A is a top view of a transistor 200. Note that for simplification, some components are not illustrated in FIG. 14A. FIG. 14B is a cross-sectional view taken along a dashed-dotted line A1-A2 in FIG. 14A. FIG. 14B can also be referred to as a cross-sectional view of the transistor 200 in the channel length direction. FIG. 14C is a cross-sectional view taken along a dashed-dotted line A3-A4 in FIG. 14A. FIG. 14C can also be referred to as a cross-sectional view of the transistor 200 in the channel width direction. FIG. 14D is a cross-sectional view taken along a dashed-dotted line A5-A6 in FIG. 14A.

The semiconductor device illustrated in FIGS. 14A to 14D includes, an insulator 212 over a substrate (not illustrated), an insulator 214 over the insulator 212, the transistor 200 over the insulator 214, an insulator 280 over the transistor 200, an insulator 282 over the insulator 280, an insulator 283 over the insulator 282, and an insulator 285 over the insulator 283. The insulators 212, 214, 280, 282, 283, and 285 each function as an interlayer insulating film. The semiconductor device also includes a conductor 240 (a conductor 240a and a conductor 240b) that is electrically connected to the transistor 200 and functions as a plug. Note that an insulator 241 (an insulator 241a and an insulator 241b) is provided in contact with the side surface of the conductor 240 functioning as a plug. A conductor 246 (a conductor 246a and a conductor 246b) electrically connected to the conductor 240 and functioning as a wiring is provided over the insulator 285 and the conductor 240.

The insulator 241a is provided in contact with an inner wall of an opening formed in the insulators 280, 282, 283, and 285, a first conductor of the conductor 240a is provided in contact with the side surface of the insulator 241a, and a second conductor of the conductor 240a is provided inside the first conductor. The insulator 241b is provided in contact with an inner wall of an opening formed in the insulators 280, 282, 283, and 285, a first conductor of the conductor 240b is provided in contact with the side surface of the insulator 241b, and a second conductor of the conductor 240b is provided inside the first conductor. The top surface of the conductor 240 can be substantially level with the top surface of the insulator 285 in a region overlapping with the conductor 246. Although the first and second conductors are stacked as the conductor 240 in the transistor 200, the present invention is not limited thereto. For example, the conductor 240 may have a single-layer structure or a stacked-layer structure of three or more layers. In the case where a stacked-layer structure is employed, the layers may be distinguished by numbers corresponding to the formation order.

[Transistor 200]

As illustrated in FIGS. 14A to 14D, the transistor 200 includes an insulator 216 over the insulator 214, a conductor 205 (a conductor 205a, a conductor 205b, and a conductor 205c) provided to be embedded in the insulator 216, an insulator 222 over the insulator 216 and the conductor 205, an insulator 224 over the insulator 222, an oxide 230a over the insulator 224, an oxide 230b over the oxide 230a, an oxide 243 (an oxide 243a and an oxide 243b) over the oxide 230b, a conductor 242a over the oxide 243a, an insulator 271a over the conductor 242a, a conductor 242b over the oxide 243b, an insulator 271b over the conductor 242b, an insulator 250 (an insulator 250a and an insulator 250b) over the oxide 230b, a conductor 260 (a conductor 260a and a conductor 260b) provided over the insulator 250 and overlapping with part of the oxide 230b, and an insulator 275 provided to cover the insulator 222, the insulator 224, the oxide 230a, the oxide 230b, the oxide 243a, the oxide 243b, the conductor 242a, the conductor 242b, the insulator 271a, and insulator 271b.

Hereinafter, the oxide 230a and the oxide 230b are collectively referred to as an oxide 230 in some cases. The conductor 242a and the conductor 242b are collectively referred to as a conductor 242 in some cases. The insulator 271a and the insulator 271b are collectively referred to as an insulator 271 in some cases.

An opening reaching the oxide 230b is provided in the insulators 280 and 275. The insulator 250 and the conductor 260 are provided in the opening. In addition, in the channel length direction of the transistor 200, the conductor 260 and the insulator 250 are provided between the insulator 271a, the conductor 242a, and the oxide 243a and the insulator 271b, the conductor 242b, and the oxide 243b. The insulator 250 includes a region in contact with the side surface of the conductor 260 and a region in contact with the bottom surface of the conductor 260.

The oxide 230 preferably includes the oxide 230a provided over the insulator 224 and the oxide 230b provided over the oxide 230a. When the oxide 230a is provided under the oxide 230b, impurities can be inhibited from being diffused into the oxide 230b from the components formed below the oxide 230a.

Although the oxide 230 of the transistor 200 has a structure in which two layers, the oxide 230a and the oxide 230b, are stacked, the present invention is not limited to this structure. For example, the oxide 230 may have a single-layer structure of the oxide 230b or a stacked-layer structure of three or more layers, or the oxide 230a and the oxide 230b may each have a stacked-layer structure.

The conductor 260 functions as a first gate (also referred to as a top gate) electrode and the conductor 205 functions as a second gate (also referred to as a back gate) electrode. The insulator 250 functions as a first gate insulating film, and the insulator 224 and the insulator 222 function as a second gate insulating film. The conductor 242a functions as one of a source electrode and a drain electrode, and the conductor 242b functions as the other of the source electrode and the drain electrode. A region of the oxide 230 that overlaps with the conductor 260 at least partly functions as a channel formation region.

A region of the oxide 230b that overlaps with the conductor 242a includes one of source and drain regions, and a region of the oxide 230b that overlaps with the conductor 242b includes the other of the source and drain regions. A region of the oxide 230b that is sandwiched between the source and drain regions includes a channel formation region (a region indicated by a shaded portion in FIG. 14B).

The channel formation region has a smaller amount of oxygen vacancies or a lower impurity concentration than the source and drain regions, and thus has a low carrier concentration and a high resistance. Here, the carrier concentration of the channel formation region is preferably lower than or equal to $1\times10^{18}$ cm$^{-3}$, further preferably lower than $1\times10^{17}$ cm$^{-3}$, still further preferably lower than $1\times10^{16}$ cm$^{-3}$, yet further preferably lower than $1\times10^{13}$ cm$^{-3}$, and yet still further preferably lower than $1\times10^{12}$ cm$^{-3}$. Note that the lower limit of the carrier concentration of the channel formation region is not particularly limited and can be, for example, $1\times10^{-9}$ cm$^{-3}$.

Although the channel formation region, the source region, and the drain region are formed in the oxide 230b in the above-described example, the present invention is not limited thereto. For example, a channel formation region, a source region, and a drain region are also formed in the oxide 230a in some cases.

In the transistor 200, the oxide 230 (the oxides 230a and 230b), which includes the channel formation region, is preferably formed using metal oxide functioning as a semiconductor (hereinafter referred to as an oxide semiconductor).

The metal oxide functioning as a semiconductor preferably has a band gap of 2 eV or more, preferably 2.5 eV or more. The use of such metal oxide having a wide band gap can reduce the off-state current of the transistor.

For example, as the oxide 230, metal oxide such as an In-M-Zn oxide containing indium, an element M, and zinc is used; the element M is one or more selected from aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like. Alternatively, In—Ga oxide, In—Zn oxide, or indium oxide may be used as the oxide 230.

Here, the atomic ratio of In to the element M in the metal oxide used as the oxide 230b is preferably greater than that in the metal oxide used as the oxide 230a.

Specifically, as the oxide 230a, metal oxide having an atomic ratio of In:M:Zn=1:3:4 or in the vicinity thereof, or In:M:Zn=1:1:0.5 or in the vicinity thereof may be used. As the oxide 230b, a metal oxide having an atomic ratio of In:M:Zn=1:1:1 or in the vicinity thereof or In:M:Zn=4:2:3 or in the vicinity thereof may be used. Note that the vicinity of the atomic ratio includes ±30% of an intended atomic ratio. Gallium is preferably used as the element M.

When the metal oxide is deposited by a sputtering method, the aforementioned atomic ratio is not limited to the atomic ratio of the deposited metal oxide and may be the atomic ratio of a sputtering target used for depositing the metal oxide.

When the oxide 230a is provided under the oxide 230b in the above manner, impurities and oxygen can be inhibited from diffusing into the oxide 230b from the components formed below the oxide 230a.

Furthermore, when the oxide 230a and the oxide 230b contain a common element (as the main component) besides oxygen, the density of defect states at the interface between the oxide 230a and the oxide 230b can be low. Since the density of defect states at the interface between the oxides 230a and 230b can be low, the influence of interface scattering on carrier conduction can be small and a high on-state current can be obtained.

Each of the oxides 230a and 230b preferably has crystallinity. In particular, as the oxide 230b, a c-axis-aligned crystalline oxide semiconductor (CAAC-OS) is preferably used.

The CAAC-OS is a metal oxide having a dense structure with high crystallinity and a small amount of impurities or defects (oxygen vacancies (Vo) or the like). In particular, after the formation of a metal oxide, heat treatment is performed at a temperature at which the metal oxide does not become a polycrystal (e.g., 400 ° C. to 600 ° C.), whereby a CAAC-OS having a dense structure with higher crystallinity can be obtained. As the density of the CAAC-OS is increased in such a manner, diffusion of impurities or oxygen in the CAAC-OS can be further reduced.

By contrast, in the CAAC-OS, a reduction in electron mobility due to a grain boundary is less likely to occur because it is difficult to observe a clear grain boundary. Thus, a metal oxide including the CAAC-OS is physically stable. Accordingly, the metal oxide including the CAAC-OS is resistant to heat and has high reliability.

At least one of the insulators 212, 214, 271, 275, 282, and 283 preferably functions as a barrier insulating film that inhibits diffusion of impurities such as water and hydrogen from the substrate side or from above the transistor 200 into the transistor 200. Thus, at least one of the insulators 212, 214, 271, 275, 282, and 283 is preferably formed using an insulating material having a function of inhibiting diffusion of impurities such as hydrogen atoms, hydrogen molecules, water molecules, nitrogen atoms, nitrogen molecules, nitrogen oxide molecules (e.g., $N_2O$, NO, and $NO_2$), and copper atoms, that is, an insulating material through which the impurities are less likely to pass. Alternatively, it is preferable to use an insulating material having a function of inhibiting diffusion of oxygen (e.g., at least one of oxygen atoms, oxygen molecules, and the like), that is, an insulating material through which the above oxygen is less likely to pass.

Note that in this specification, a barrier insulating film refers to an insulating film having a barrier property. A barrier property in this specification refers to a function of inhibiting diffusion of a particular substance (also referred to as a function of less easily transmitting the substance). Alternatively, a barrier property in this specification refers to a function of capturing and fixing (also referred to as gettering) a particular substance.

Aluminum oxide, magnesium oxide, hafnium oxide, gallium oxide, indium gallium zinc oxide, silicon nitride, or silicon nitride oxide can be used for the insulators 212, 214, 271, 275, 282, and 283, for example. For example, silicon nitride, which has a high hydrogen barrier property, is preferably used for the insulators 212, 275, and 283. For example, aluminum oxide, magnesium oxide, or the like, which has an excellent function of capturing and fixing hydrogen, is preferably used for the insulators 214, 271, and 282. Accordingly, impurities such as water and hydrogen can be inhibited from diffusing from the substrate side to the transistor 200 side through the insulators 212 and 214. Furthermore, impurities such as water and hydrogen can be inhibited from diffusing to the transistor 200 side from an interlayer insulating film and the like positioned outside the insulator 283. In addition, oxygen contained in the insulator 224 and the like can be inhibited from diffusing to the substrate side through the insulators 212 and 214. Oxygen contained in the insulator 280 and the like can be inhibited from diffusing to the components over the transistor 200 through the insulator 282 and the like. In this manner, the transistor 200 is preferably surrounded by the insulators 212, 214, 271, 275, 282, and 283, which have a function of inhibiting diffusion of oxygen and impurities such as water and hydrogen.

Here, oxide having an amorphous structure is preferably used as the insulators 212, 214, 271, 275, 282, and 283. For example, metal oxide such as AlO$_x$ (x is a given number larger than 0) or MgO$_y$ (y is a given number larger than 0) is preferably used. In such metal oxide having an amorphous structure, oxygen atoms have dangling bonds, and the metal oxide has a property of capturing or fixing hydrogen with the dangling bonds in some cases. When such metal oxide having an amorphous structure is used as the component of the transistor 200 or provided in the vicinity of the transistor 200, hydrogen contained in the transistor 200 or hydrogen in the vicinity of the transistor 200 can be captured or fixed. In particular, hydrogen contained in the channel formation region of the transistor 200 is preferably captured or fixed. The metal oxide having an amorphous structure is used as the component of the transistor 200 or provided in the vicinity of the transistor 200, whereby the transistor 200 and the semiconductor device with favorable characteristics and high reliability can be manufactured.

Although the insulators 212, 214, 271, 275, 282, and 283 preferably have an amorphous structure, they may include a region having a polycrystalline structure. Alternatively, the insulators 212, 214, 271, 275, 282, and 283 may have a multilayer structure in which a layer having an amorphous structure and a layer having a polycrystalline structure are stacked. For example, a stacked-layer structure in which a layer having a polycrystalline structure is formed over a layer having an amorphous structure may be employed.

The insulators 212, 214, 271, 275, 282, and 283 can be deposited by a sputtering method, for example. Since a sputtering method does not need to use hydrogen as a deposition gas, the hydrogen concentrations of the insulators 212, 214, 271, 275, 282, and 283 can be reduced. Note that the deposition method is not limited to a sputtering method, and a CVD method, an MBE method, a PLD method, an ALD method, or the like can be used as appropriate.

The dielectric constants of the insulators 216, 280, and 285 are preferably lower than that of the insulator 214. The use of a material having a low dielectric constant for the interlayer insulating film can reduce the parasitic capacitance between wirings. For example, for the insulators 216, 280, and 285, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or the like is used as appropriate.

The conductor 205 is provided to overlap with the oxide 230 and the conductor 260. Here, the conductor 205 is preferably provided to fill an opening formed in the insulator 216.

The conductor 205 includes the conductors 205a, 205b, and 205c. The conductor 205a is provided in contact with the bottom surface and the side wall of the opening. The conductor 205b is provided so as to be embedded in a recessed portion formed in the conductor 205a. Here, the level of the top surface of the conductor 205b is lower than the levels of the top surfaces of the conductor 205a and the insulator 216. The conductor 205c is provided in contact with the top surface of the conductor 205b and the side surface of the conductor 205a. Here, the top surface of the conductor 205c is substantially level with the top surfaces of the conductor 205a and the insulator 216. That is, the conductor 205b is surrounded by the conductor 205a and the conductor 205c.

A conductive material that can be used for the conductor 260a described later may be used for the conductors 205a and 205c. A conductive material that can be used for the conductor 260b described later may be used for the conductor 205b. Although the conductor 205 of the transistor 200 has a structure in which the conductors 205a, 205b, and 205c are stacked, the present invention is not limited to this structure. For example, the conductor 205 may have a single-layer structure or a stacked-layer structure of two layers or four or more layers.

The insulators 222 and 224 function as a gate insulating film.

The insulator 222 preferably has a function of inhibiting diffusion of hydrogen (e.g., at least one of hydrogen atoms, hydrogen molecules, and the like). Moreover, the insulator 222 preferably has a function of inhibiting diffusion of oxygen (e.g., at least one of oxygen atoms, oxygen molecules, and the like). For example, the insulator 222 preferably has a function of inhibiting diffusion of much hydrogen and/or oxygen compared to the insulator 224.

As the insulator 222, an insulator containing an oxide of one or both of aluminum and hafnium, which are insulating materials, is preferably used. As the insulator, aluminum oxide, hafnium oxide, an oxide containing aluminum and hafnium (hafnium aluminate), or the like is preferably used. As the insulator 222, a barrier insulating film that can be used as the insulator 214 or the like may be used.

Silicon oxide, silicon oxynitride, or the like can be used as appropriate for the insulator 224. When the insulator 224 containing oxygen is provided in contact with the oxide 230, oxygen vacancies in the oxide 230 can be reduced, leading to an improvement in the reliability of the transistor 200. The insulator 224 is preferably processed into an island shape so as to overlap with the oxide 230a. In that case, the insulator 275 is in contact with the side surface of the insulator 224 and the top surface of the insulator 222. Accordingly, the insulator 224 and the insulator 280 can be apart from each other by the insulator 275; thus, diffusion of oxygen contained in the insulator 280 into the insulator 224 can be reduced, so that the amount of oxygen in the insulator 224 can be prevented from being excessively large.

Note that the insulators 222 and 224 may each have a stacked-layer structure of two or more layers. In that case, the stacked layers are not necessarily formed of the same material and may be formed of different materials. Note that FIG. 14B and the like illustrates the structure in which the insulator 224 is formed into an island shape so as to overlap with the oxide 230a; however, the present invention is not limited to this structure. In the case where the amount of oxygen contained in the insulator 224 can be adjusted appropriately, a structure in which the insulator 224 is not pattered in a manner similar to that of the insulator 222 may be employed.

The oxides 243a and 243b are provided over the oxide 230b. The oxides 243a and 243b are provided to be apart from each other with the conductor 260 therebetween. The oxide 243 (the oxides 243a and 243b) preferably has a function of inhibiting oxygen transmission. It is preferable that the oxide 243 having a function of inhibiting oxygen transmission be provided between the oxide 230b and the conductor 242 functioning as the source electrode or the drain electrode, in which case the electrical resistance between the oxide 230b and the conductor 242 is reduced. In the case where the electrical resistance between the oxide 230b and the conductor 242 can be sufficiently reduced, the oxide 243 is not necessarily provided.

Metal oxide containing the element M may be used as the oxide 243. In particular, aluminum, gallium, yttrium, or tin is preferably used as the element M The concentration of the element M in the oxide 243 is preferably higher than that in the oxide 230b. Alternatively, gallium oxide may be used as the oxide 243. A metal oxide such as an In-M-Zn oxide may be used as the oxide 243. Specifically, the atomic ratio of the element M to In in the metal oxide used as the oxide 243 is preferably higher than that in the metal oxide used as the oxide 230b. The thickness of the oxide 243 is preferably greater than or equal to 0.5 nm and less than or equal to 5 nm, further preferably greater than or equal to 1 nm and less than or equal to 3 nm, still further preferably greater than or equal to 1 nm and less than or equal to 2 nm.

It is preferable that the conductor 242a be provided in contact with the top surface of the oxide 243a and the conductor 242b be provided in contact with the top surface of the oxide 243b. The conductor 242a and the conductor 242b function as the source electrode and the drain electrode of the transistor 200.

For the conductor 242 (the conductors 242a and 242b), for example, a nitride containing tantalum, a nitride containing titanium, a nitride containing molybdenum, a nitride containing tungsten, a nitride containing tantalum and aluminum, a nitride containing titanium and aluminum, or the like is preferably used. In one embodiment of the present invention, a nitride containing tantalum is particularly preferable. As another example, ruthenium oxide, ruthenium nitride, an oxide containing strontium and ruthenium, or an oxide containing lanthanum and nickel may be used. These materials are preferable because they are a conductive material that is not easily oxidized or a material that maintains the conductivity even when absorbing oxygen.

No curved surface is preferably formed between the side surface and the top surface of the conductor 242. Without the curved surface, the conductor 242 can have a large cross-sectional area in the channel width direction as illustrated in FIG. 14D. Accordingly, the conductivity of the conductor 242 is increased, so that the on-state current of the transistor 200 can be increased.

The insulator 271a is provided in contact with the top surface of the conductor 242a, and the insulator 271b is provided in contact with the top surface of the conductor 242b.

The insulator 275 is provided in contact with the top surface of the insulator 222, the side surface of the insulator 224, the side surface of the oxide 230a, the side surface of the oxide 230b, the side surface of the oxide 243, the side surface of the conductor 242, and the top and side surfaces of the insulator 271. An opening is provided in a region of the insulator 275 where the insulator 250 and the conductor 260 are provided.

The insulators 214, 271, and 275 having a function of capturing impurities such as hydrogen are provided in a region sandwiched between the insulator 212 and the insulator 283, whereby impurities such as hydrogen contained in the insulator 224, the insulator 216, or the like can be captured, and the amount of hydrogen in the region can be kept constant. In that case, the insulators 214, 271, and 275 preferably contain aluminum oxide with an amorphous structure.

The insulator 250 includes the insulator 250a and the insulator 250b over the insulator 250a and functions as a gate insulating film. It is preferable that the insulator 250a be provided in contact with the top surface of the oxide 230b, the side surface of the oxide 243, the side surface of the conductor 242, the side surface of the insulator 271, the side surface of the insulator 275, and the side surface of the insulator 280. The thickness of the insulator 250 is preferably greater than or equal to 1 nm and less than or equal to 20 nm.

For the insulator 250a, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or the like can be used. In particular, silicon oxide and silicon oxynitride, which have thermal stability, are preferable. As in the insulator 224, the concentration of impurities such as water, hydrogen, and the like in the insulator 250a is preferably reduced.

It is preferable that the insulator 250a be formed using an insulator from which oxygen is released by heating and the insulator 250b be formed using an insulator having a function of inhibiting diffusion of oxygen. Owing to this structure, diffusion of oxygen contained in the insulator 250a into the conductor 260 can be inhibited. That is, a reduction in the amount of oxygen supplied to the oxide 230 can be inhibited. Moreover, oxidation of the conductor 260 due to oxygen contained in the insulator 250a can be inhibited. For example, the insulator 250b can be formed using a material similar to that used for the insulator 222.

Specifically, for the insulator 250b, metal oxide containing one or more of hafnium, aluminum, gallium, yttrium, zirconium, tungsten, titanium, tantalum, nickel, germanium, magnesium, and the like or metal oxide that can be used as the oxide 230 can be used. In particular, an insulator containing oxide of one or both of aluminum and hafnium is preferably used. As the insulator, aluminum oxide, hafnium oxide, oxide containing aluminum and hafnium (hafnium aluminate), or the like is preferably used. The thickness of the insulator 250b is preferably greater than or equal to 0.5 nm and less than or equal to 3.0 nm, further preferably greater than or equal to 1.0 nm and less than or equal to 1.5 nm.

Although FIGS. 14B and 14C show that the insulator 250 has the stacked-layer structure of two layers, the present invention is not limited thereto. The insulator 250 may have a single-layer structure or a stacked-layer structure of three or more layers.

The conductor 260 is provided over the insulator 250b and functions as a first gate electrode of the transistor 200. The conductor 260 preferably includes the conductor 260a and the conductor 260b over the conductor 260a. For example, the conductor 260a is preferably positioned so as to cover the bottom and side surfaces of the conductor 260b. As illustrated in FIGS. 14B and 14C, the top surface of the conductor 260 is substantially level with the top surface of the insulator 250. Although FIGS. 14B and 14C show that the conductor 260 has the two-layer structure of the conductors 260a and 260b, the conductor 260 may have a single-layer structure or a stacked-layer structure of three or more layers.

The conductor 260a is preferably formed using a conductive material having a function of inhibiting diffusion of impurities such as hydrogen atoms, hydrogen molecules, water molecules, nitrogen atoms, nitrogen molecules, nitrogen oxide molecules, and copper atoms. Alternatively, the conductor 260a is preferably formed using a conductive material having a function of inhibiting diffusion of oxygen (e.g., at least one of oxygen atoms and oxygen molecules).

When the conductor 260a has a function of inhibiting diffusion of oxygen, the conductivity of the conductor 260b can be prevented from being lowered because of oxidization of the conductor 260b due to oxygen in the insulator 250. As the conductive material having a function of inhibiting diffusion of oxygen, for example, titanium, titanium nitride, tantalum, tantalum nitride, ruthenium, or ruthenium oxide is preferably used.

The conductor 260 also functions as a wiring and thus is preferably a conductor having high conductivity. For example, a conductive material containing tungsten, copper, or aluminum as its main component can be used for the conductor 260b. The conductor 260b may have a stacked-layer structure, for example, a stacked-layer structure of titanium or titanium nitride and the above conductive material.

In the transistor 200, the conductor 260 is formed in a self-aligned manner so as to fill an opening formed in the insulator 280 and the like. In this manner, the conductor 260 can surely be provided in a region between the conductor 242a and the conductor 242b without alignment.

In the channel width direction of the transistor 200 as illustrated in FIG. 14C, with the level of the bottom surface of the insulator 222 as a reference, the level of a region of the bottom surface of the conductor 260 that does not overlap with the oxide 230b is preferably lower than the level of the bottom surface of the oxide 230b. When the conductor 260 functioning as the gate electrode covers the side and top surfaces of the channel formation region of the oxide 230b with the insulator 250 and the like therebetween, the electric field of the conductor 260 is likely to affect the entire channel formation region in the oxide 230b. Hence, the transistor 200 can have a higher on-state current and higher frequency characteristics. With the level of the bottom surface of the insulator 222 as a reference, a distance between the bottom surface of the conductor 260 and the bottom surfaces of the oxide 230b in a region where the conductor 260 does not overlap with the oxides 230a and 230b is greater than or equal to 0 nm and less than or equal to 100 nm, preferably greater than or equal to 3 nm and less than or equal to 50 nm, and further preferably greater than or equal to 5 nm and less than or equal to 20 nm.

The insulator 280 is provided over the insulator 275, and the opening is formed in the region where the insulator 250 and the conductor 260 are provided. The top surface of the insulator 280 may be planarized. In that case, the top surface of the insulator 280 is preferably substantially level with the top surface of the insulator 250 and the top surface of the conductor 260.

The insulator 282 is provided in contact with the top surface of the insulator 280, the top surface of the insulator 250, and the top surface of the conductor 260. The insulator 282 preferably functions as a barrier insulating film that inhibits impurities such as water and hydrogen from diffusing into the insulator 280 from the above and also has a function of capturing impurities such as hydrogen. The insulator 282 also preferably functions as a barrier insulating film that inhibits oxygen transmission. As the insulator 282, for example, an insulator such as aluminum oxide can be used. The insulator 282, which has a function of capturing impurities such as hydrogen, is provided in contact with the insulator 280 in a region sandwiched between the insulator 212 and the insulator 283, whereby impurities such as hydrogen contained in the insulator 280 and the like can be captured and the amount of hydrogen in the region can be kept constant. It is particularly preferable to use aluminum oxide having an amorphous structure as the insulator 282 because hydrogen can be captured or fixed more effectively in some cases. Accordingly, the transistor 200 and the semiconductor device with favorable characteristics and high reliability can be manufactured.

The conductors 240a and 240b are preferably formed using a conductive material containing tungsten, copper, or aluminum as the main component. The conductors 240a and 240b may have a stacked-layer structure. In the case where the conductor 240 has a stacked-layer structure, the conductor in contact with the insulator 241 is preferably formed using a conductive material having a function of inhibiting transmission of impurities such as water and hydrogen. For example, any of the above conductive materials that can be used for the conductor 260a may be used.

An insulator such as silicon nitride, aluminum oxide, or silicon nitride oxide may be used as the insulators 241a and 241b, for example. Since the insulators 241a and 241b are provided in contact with the insulators 283, 282, and 271, impurities such as water and hydrogen contained in the insulator 280 and the like can be prevented from entering the oxide 230 through the conductors 240a and 240b.

The conductor 246 (the conductors 246a and 246b) functioning as a wiring may be provided in contact with the top surfaces of the conductors 240a and 240b. The conductor 246 is preferably formed using a conductive material containing tungsten, copper, or aluminum as its main component. The conductor may have a stacked-layer structure, for example, a stack of titanium or titanium nitride and the above conductive material. Note that the conductor may be formed to be provided to fill an opening in an insulator.

In the above manner, a semiconductor device having favorable electrical characteristics can be provided. A highly reliable semiconductor device can also be provided. A semiconductor device that can be miniaturized or highly integrated can be provided. Alternatively, a semiconductor device with low power consumption can be provided.

[Metal Oxide]

Next, metal oxide that can be used for the transistor (also referred to as an oxide semiconductor) will be described.

The metal oxide preferably contains at least indium or zinc. In particular, indium and zinc are preferably contained. In addition, aluminum, gallium, yttrium, tin, or the like is preferably contained. Furthermore, one or more elements selected from boron, silicon, titanium, iron, nickel, germanium, zirconium, molybdenum, lanthanum, cerium, neodymium, hafnium, tantalum, tungsten, magnesium, cobalt, and the like may be contained.

The metal oxide can be formed by a sputtering method, a CVD method such as a metal organic chemical vapor deposition (MOCVD) method, an ALD method, or the like.

<Classification of Crystal Structure>

Amorphous (including a completely amorphous structure), c-axis-aligned crystalline (CAAC), nanocrystalline (nc), cloud-aligned composite (CAC), single-crystal, and polycrystalline structures can be given as examples of a crystal structure of an oxide semiconductor.

A crystal structure of a film or a substrate can be analyzed with an X-ray diffraction (XRD) spectrum. For example, evaluation is possible using an XRD spectrum which is obtained by grazing-incidence XRD (GIXD) measurement. Note that a GIXD method is also referred to as a thin film method or a Seemann-Bohlin method.

For example, the peak of the XRD spectrum of the quartz glass substrate has a bilaterally symmetrical shape. On the other hand, the peak of the XRD spectrum of the IGZO film having a crystal structure has a bilaterally asymmetrical shape. The bilaterally asymmetrical peak shows the existence of crystal in the film or the substrate. In other words, the crystal structure of the film or the substrate cannot be regarded as "amorphous" unless it has a bilaterally symmetrical peak in the XRD spectrum.

The crystal structure of a film or a substrate can be analyzed with a diffraction pattern obtained by nanobeam electron diffraction (NBED) (also referred to as a nanobeam electron diffraction pattern). For example, a halo pattern is observed in the diffraction pattern of the quartz glass substrate, which indicates that the quartz glass substrate is in an amorphous state. Furthermore, not a halo pattern but a spot-like pattern is observed in the diffraction pattern of the IGZO film formed at room temperature. Thus, it is presumed that the IGZO film formed at room temperature is in an intermediate state, which is neither a crystal state nor an amorphous state, and it cannot be concluded that the IGZO film is in an amorphous state.

<<Oxide Semiconductor Structure>>

Oxide semiconductors might be classified in a manner different from the above-described one when classified in terms of the structure. Oxide semiconductors are classified into a single crystal oxide semiconductor and a non-single-crystal oxide semiconductor, for example. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Here, the above-described CAAC-OS, nc-OS, and a-like OS will be described in detail.

[[CAAC-OS]]

The CAAC-OS is an oxide semiconductor that has a plurality of crystal regions each of which has c-axis alignment in a particular direction. Note that the particular direction refers to the film thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more fine crystals (crystals each of which has a maximum diameter of less than 10 nm). In the case where the crystal region is formed of one fine crystal, the maximum diameter of the crystal region is less than 10 nm. In the case where the crystal region is formed of a large number of fine crystals, the size of the crystal region may be approximately several tens of nanometers.

Furthermore, in an In-M-Zn oxide (the element M is one or more of aluminum, gallium, yttrium, tin, titanium, and the like), the CAAC-OS tends to have a layered crystal structure (also referred to as a layered structure) in which a layer containing indium (In) and oxygen (hereinafter, In layer) and a layer containing the element M, zinc (Zn), and oxygen (hereinafter, (M, Zn) layer) are stacked. Indium and the element M can be replaced with each other. Therefore, indium may be contained in the (M, Zn) layer. In addition, the element M may be contained in the In layer. Note that Zn may be contained in the In layer. Such a layered structure is observed as a lattice image in a high-resolution TEM image, for example.

When the CAAC-OS film is subjected to structural analysis by out-of-plane XRD measurement with an XRD apparatus using $\theta/2\theta$ scanning, for example, a peak indicating c-axis alignment is detected at or around $2\theta=31°$. Note that the position of the peak indicating c-axis alignment (the value of $2\theta$) may change depending on the kind, composition, or the like of the metal element contained in the CAAC-OS.

For example, a plurality of bright spots are observed in the electron diffraction pattern of the CAAC-OS film. Note that one spot and another spot are symmetric with respect to a spot of the incident electron beam which passes through a sample (also referred to as a direct spot).

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear grain boundary cannot be observed even in the vicinity of the distortion in the CAAC-OS. That is, formation of a grain boundary is inhibited by the distortion of a lattice arrangement. This is probably because the CAAC-OS can tolerate distortion owing to a low density of arrangement of oxygen atoms in the a-b plane direction, an interatomic bond distance changed by substitution of a metal atom, and the like.

A crystal structure in which a clear grain boundary is observed is what is called a polycrystal structure. It is highly probable that the grain boundary becomes a recombination center and traps carriers and thus decreases the on-state current and field-effect mobility of a transistor, for example. Thus, the CAAC-OS in which no clear grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a grain boundary as compared with an In oxide.

The CAAC-OS is an oxide semiconductor with high crystallinity in which no clear grain boundary is observed. Thus, in the CAAC-OS, a reduction in electron mobility due to the grain boundary is less likely to occur. Entry of impurities, formation of defects, or the like might decrease the crystallinity of an oxide semiconductor. This means that the CAAC-OS can be referred to as an oxide semiconductor having small amounts of impurities and defects (e.g., oxygen vacancies). Therefore, an oxide semiconductor including the CAAC-OS is physically stable. Accordingly, the oxide semiconductor including the CAAC-OS is resistant to heat and has high reliability. In addition, the CAAC-OS is stable with respect to high temperatures in the manufacturing process (i.e., thermal budget). Accordingly, the use of the CAAC-OS for the OS transistor can extend a degree of freedom of the manufacturing process.

[[nc-OS]]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a fine crystal. Note that the size of the fine crystal is, for example, greater than or equal to 1 nm and less than or equal to 10 nm, particularly greater than or equal to 1 nm and less than or equal to 3 nm; thus, the fine crystal is also referred to as a nanocrystal. There is no regularity of crystal orientation between different nanocrystals in the nc-OS. Hence, the orientation in the whole film is not observed. Accordingly, in some cases, the nc-OS cannot be distinguished from an a-like OS or an amorphous oxide semiconductor, depending on an analysis method. For example, when an nc-OS film is subjected to structural analysis by out-of-plane XRD measurement with an XRD apparatus using $\theta/2\theta$ scanning, a peak indicating crystallinity is not observed. Furthermore, a halo pattern is shown in a selected-area electron diffraction pattern of the nc-OS film obtained using an electron beam having a probe diameter larger than the diameter of a nanocrystal (e.g., larger than or equal to 50 nm). Meanwhile, in some cases, a plurality of spots in a ring-like region with a direct spot as the center are observed in a nanobeam electron diffraction pattern of the nc-OS film obtained using an electron beam with a probe diameter nearly equal to or smaller than the diameter of a nanocrystal (e.g., 1 nm or larger and 30 nm or smaller).

[[a-like OS]]

The a-like OS is an oxide semiconductor having a structure between those of the nc-OS and the amorphous oxide semiconductor. The a-like OS has a void or a low-density region. That is, the a-like OS has lower crystallinity than the nc-OS and the CAAC-OS. Moreover, the a-like OS has higher hydrogen concentration than the nc-OS and the CAAC-OS.

<<Oxide Semiconductor Structure>>

Next, the CAC-OS will be described in detail. Note that the CAC-OS relates to the material composition.

[[CAC-OS]]

The CAC-OS has, for example, a composition in which elements included in a metal oxide are unevenly distributed. Materials including unevenly distributed elements each have a size greater than or equal to 0.5 nm and less than or equal to 10 nm, preferably greater than or equal to 1 nm and less than or equal to 3 nm, or a similar size. Note that in the following description of a metal oxide, a state in which one or more types of metal elements are unevenly distributed and regions including the metal element(s) are mixed is referred to as a mosaic pattern or a patch-like pattern. The regions each have a size greater than or equal to 0.5 nm and less than or equal to 10 nm, preferably greater than or equal to 1 nm and less than or equal to 3 nm, or a similar size.

In addition, the CAC-OS has a composition in which materials are separated into a first region and a second region to form a mosaic pattern, and the first regions are distributed in the film. This composition is hereinafter also referred to as a cloud-like composition. That is, the CAC-OS is a composite metal oxide having a composition in which the first regions and the second regions are mixed.

Here, the atomic ratios of In, Ga, and Zn to a metal element included in a CAC-OS in an In—Ga—Zn oxide are expressed as [In], [Ga], and [Zn], respectively. For example, the first region in the CAC-OS in the In—Ga—Zn oxide has [In] higher than that in the composition of the CAC-OS film. In addition, the second region of the CAC-OS in the In—Ga—Zn oxide has [Ga], which is greater than that in the composition of the CAC-OS film. Alternatively, for example, [In] of the first region is greater than that in the second region, and [Ga] of the first region is less than that in the second region. Moreover, the second region has higher [Ga] and lower [In] than the first region.

Specifically, the first region includes indium oxide, indium zinc oxide, or the like as its main component. The second region includes gallium oxide, gallium zinc oxide, or the like as its main component. That is, the first region can be referred to as a region containing In as its main component. The second region can be referred to as a region containing Ga as its main component.

Note that a clear boundary between the first region and the second region cannot be observed in some cases.

In a material composition of a CAC-OS in an In—Ga—Zn oxide that contains In, Ga, Zn, and O, regions containing Ga as a main component are observed in part of the CAC-OS and regions containing In as a main component are observed in part thereof. These regions are randomly dispersed to form a mosaic pattern. Thus, it is suggested that the CAC-OS has a structure in which metal elements are unevenly distributed.

The CAC-OS can be formed by a sputtering method under conditions where a substrate is not heated, for example. In the case of forming the CAC-OS by a sputtering method, one or more selected from an inert gas (typically, argon), an oxygen gas, and a nitrogen gas may be used as a deposition gas. The ratio of the flow rate of an oxygen gas to the total flow rate of the deposition gas at the time of film formation is preferably as low as possible, and for example, the flow ratio of an oxygen gas is preferably higher than or equal to 0% and less than 30%, further preferably higher than or equal to 0% and less than or equal to 10%.

For example, energy dispersive X-ray spectroscopy (EDX) is used to obtain EDX mapping, and according to the EDX mapping, the CAC-OS in the In—Ga—Zn oxide has a composition in which the regions containing In as a main component (the first regions) and the regions containing Ga as a main component (the second regions) are unevenly distributed and mixed.

Here, the first region has a higher conductivity than the second region. In other words, when carriers flow through the first region, the conductivity of a metal oxide is exhibited. Accordingly, when the first regions are distributed in a metal oxide as a cloud, high field-effect mobility ($\mu$) can be achieved.

The second region has a higher insulating property than the first region. In other words, when the second regions are distributed in a metal oxide, leakage current can be inhibited.

Thus, in the case where a CAC-OS is used for a transistor, by the complementary function of the conducting function due to the first region and the insulating function due to the second region, the CAC-OS can have a switching function (on/off function). That is, the CAC-OS has a conducting function in part of the material and has an insulating function in another part of the material; as a whole, the CAC-OS has a function of a semiconductor. Separation of the conducting function and the insulating function can maximize each function. Accordingly, when a CAC-OS is used for a transistor, a high on-state current ($I_{on}$), a high field-effect mobility ($\mu$), and favorable switching operation can be achieved.

A transistor including a CAC-OS is highly reliable. Thus, the CAC-OS is suitably used in a variety of semiconductor devices typified by a display unit.

An oxide semiconductor can have any of various structures that show various different properties. Two or more of the amorphous oxide semiconductor, the polycrystalline oxide semiconductor, the a-like OS, the CAC-OS, the nc-OS, and the CAAC-OS may be included in an oxide semiconductor of one embodiment of the present invention.

This embodiment can be combined with any of the other embodiments as appropriate.

Embodiment 4

In this embodiment, a display unit of one embodiment of the present invention will be described with reference to FIG. 15.

A display unit of this embodiment includes a plurality of pixels arranged in a matrix of m rows and n columns (m and n are each an integer of 1 or more). FIG. 15 shows an example of a circuit diagram of a pixel PIX(i,j) (i is an integer of 1 or more and m or less, and j is an integer of 1 or more and n or less).

Figure 15:
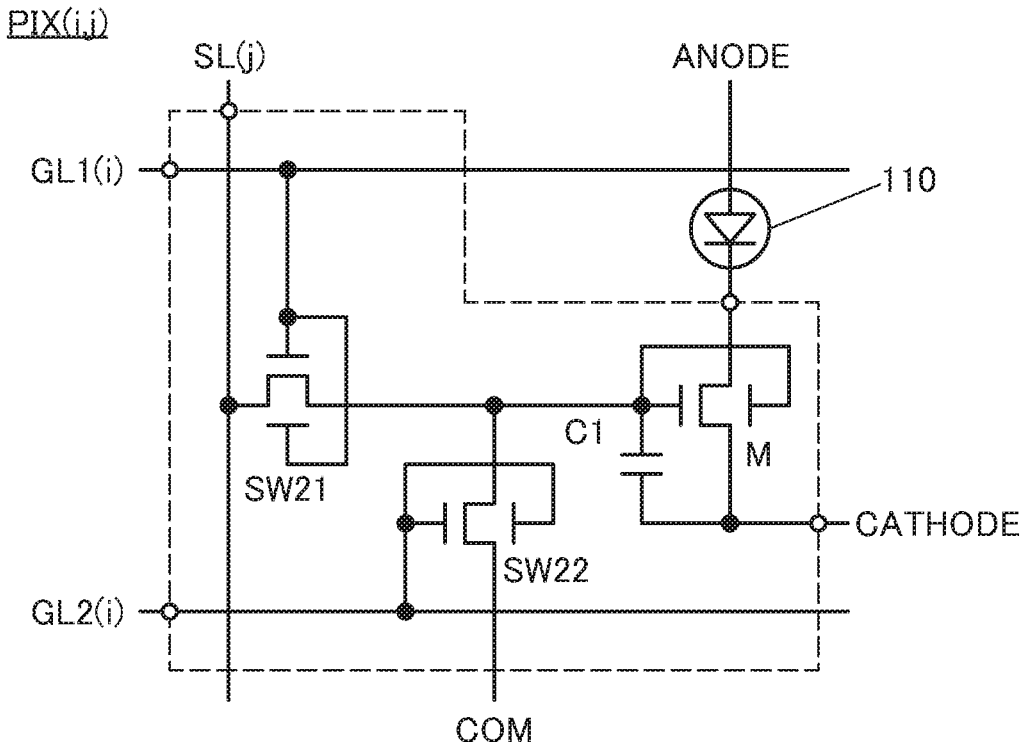
FIG. 15 is a circuit diagram showing an example of a pixel circuit.

The pixel PIX(i,j) in FIG. 15 includes a light-emitting device 110 (also referred to as a light-emitting element), a switch SW21, a transistor M, and a capacitor C1. The pixel PIX(i,j) may further include a switch SW22. Here, a light-emitting diode is used as the light-emitting device 110, for example. It is particularly preferable to use a micro light-emitting diode as the light-emitting device 110.

In this embodiment, a transistor is used as the switch SW21. A gate of the switch SW21 is electrically connected to a scan line GL1(*i*). One of a source and a drain of the switch SW21 is electrically connected to a signal line SL(j) and the other of the source and the drain is electrically connected to a gate of the transistor M.

In this embodiment, a transistor is used as the switch SW22. A gate of the switch SW22 is electrically connected to a scan line GL2(*i*). One of a source and a drain of the switch SW22 is electrically connected to a wiring COM and the other of the source and the drain is electrically connected to the gate of the transistor M.

The gate of the transistor M is electrically connected to one electrode of the capacitor C1, the other of the source and the drain of the switch SW21, and the other of the source and the drain of the switch SW22. One of a source and a drain of the transistor M is electrically connected to a wiring CATHODE and the other of the source and the drain is electrically connected to a cathode of the light-emitting device 110.

The other electrode of the capacitor C1 is electrically connected to the wiring CATHODE.

An anode of the light-emitting device 110 is electrically connected to a wiring ANODE.

The scan line GL1(*i*) has a function of supplying a selection signal. The scan line GL2(*i*) has a function of supplying a control signal. The signal line SL(j) has a function of supplying an image signal. A constant potential is supplied to each of the wiring COM, the wiring CATHODE, and the wiring ANODE. In the light-emitting device 110, the anode side can have a high potential and the cathode side can have a lower potential than the anode side.

The switch SW21 is controlled by a selection signal and functions as a selection transistor for controlling the selection state of the pixel PIX(i,j).

The transistor M functions as a driving transistor that controls a current flowing through the light-emitting device 110 in accordance with a potential supplied to the gate. When the switch SW21 is on, an image signal supplied to the signal line SL(j) is supplied to the gate of the transistor M, and the luminance of the light-emitting device 110 can be controlled in accordance with the potential of the image signal.

The switch SW22 has a function of controlling the gate potential of the transistor M on the basis of a control signal. Specifically, the switch SW22 can supply a potential for turning off the transistor M to the gate of the transistor M.

The switch SW22 can be used to control the pulse width, for example. During a period based on a control signal, a current can be supplied from the transistor M to the light-emitting device 110. The light-emitting device 110 can express gray levels on the basis of an image signal and a control signal.

Here, as each of the transistors included in the pixel PIX(i,j), it is preferable to use a transistor including metal oxide (an oxide semiconductor) for a semiconductor layer where a channel is formed.

A transistor including metal oxide which has a wider bandgap and a lower carrier density than silicon has an extremely low off-state current. Therefore, owing to the low off-state current, a charge accumulated in a capacitor that is series-connected to the transistor can be retained for a long time. Thus, in particular, a transistor including an oxide semiconductor is preferably used as each of the switches SW21 and SW22 series-connected to the capacitor C1. When each of the other transistors also includes an oxide semiconductor, manufacturing cost can be reduced.

Alternatively, a transistor including silicon as a semiconductor in which a channel is formed can be used as the transistor included in the pixel PIX(i,j). It is particularly preferable to use silicon with high crystallinity such as single crystal silicon or polycrystalline silicon because high field-effect mobility can be achieved and higher-speed operation can be performed.

Alternatively, a structure may be employed in which a transistor including an oxide semiconductor is used as one or more of the transistors included in the pixel PIX(i,j), and a transistor including silicon is used as the other transistor(s).

Note that although the transistor is an n-channel transistor in FIG. 15, a p-channel transistor can also be used.

This embodiment can be combined with any of the other embodiments as appropriate.

Embodiment 5

In this embodiment, electronic devices of embodiments of the present invention will be described with reference to FIGS. 16A and 16B, FIGS. 17A and 17B, FIGS. 18A and 18B, FIGS. 19A and 19B, FIGS. 20A, 20B, 20C, and 20D, and FIGS. 21A, 21B, 21C, 21D, 21E, and 21F.

Electronic devices of this embodiment are each provided with a display unit of one embodiment of the present invention in a display portion. A display unit of one embodiment of the present invention has high display quality and low power consumption. In addition, the display unit of one embodiment of the present invention can be easily increased in resolution and definition. Thus, the display unit of one embodiment of the present invention can be used for a display portion of a variety of electronic devices.

Examples of the electronic devices include a digital camera, a digital video camera, a digital photo frame, a mobile phone, a portable game console, a portable information terminal, and an audio reproducing device, in addition to electronic devices with a relatively large screen, such as a television device, a desktop or laptop personal computer, a monitor of a computer or the like, digital signage, and a large game machine such as a pachinko machine.

In particular, a display unit of one embodiment of the present invention can have a high resolution, and thus can be favorably used for an electronic device having a relatively small display portion. Examples of such an electronic device include a watch-type or bracelet-type information terminal device (wearable device) and a wearable device worn on a head, such as a VR device such as a head mounted display, a glasses-type AR device, and an MR device.

The resolution of the display unit of one embodiment of the present invention is preferably as high as HD (number of pixels: 1280×720), FHD (number of pixels: 1920×1080), WQHD (number of pixels: 2560×1440), WQXGA (number of pixels: 2560×1600), 4K (number of pixels: 3840×2160), or 8K (number of pixels: 7680×4320). In particular, resolution of 4K, 8K, or higher is preferable. Furthermore, the pixel density (definition) of the display unit of one embodiment of the present invention is preferably higher than or equal to 300 ppi, further preferably higher than or equal to 500 ppi, still further preferably higher than or equal to 1000 ppi, still further preferably higher than or equal to 3000 ppi, still further preferably higher than or equal to 5000 ppi, and yet further preferably higher than or equal to 7000 ppi. With the display unit with such high resolution and high definition, the electronic device can have higher realistic sensation, sense of depth, and the like in personal use such as portable use and home use.

The electronic device in this embodiment may include a sensor (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays).

The electronic device in this embodiment can have a variety of functions. For example, the electronic device of one embodiment of the present invention can have a function of displaying a variety of data (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

Figure 16A:
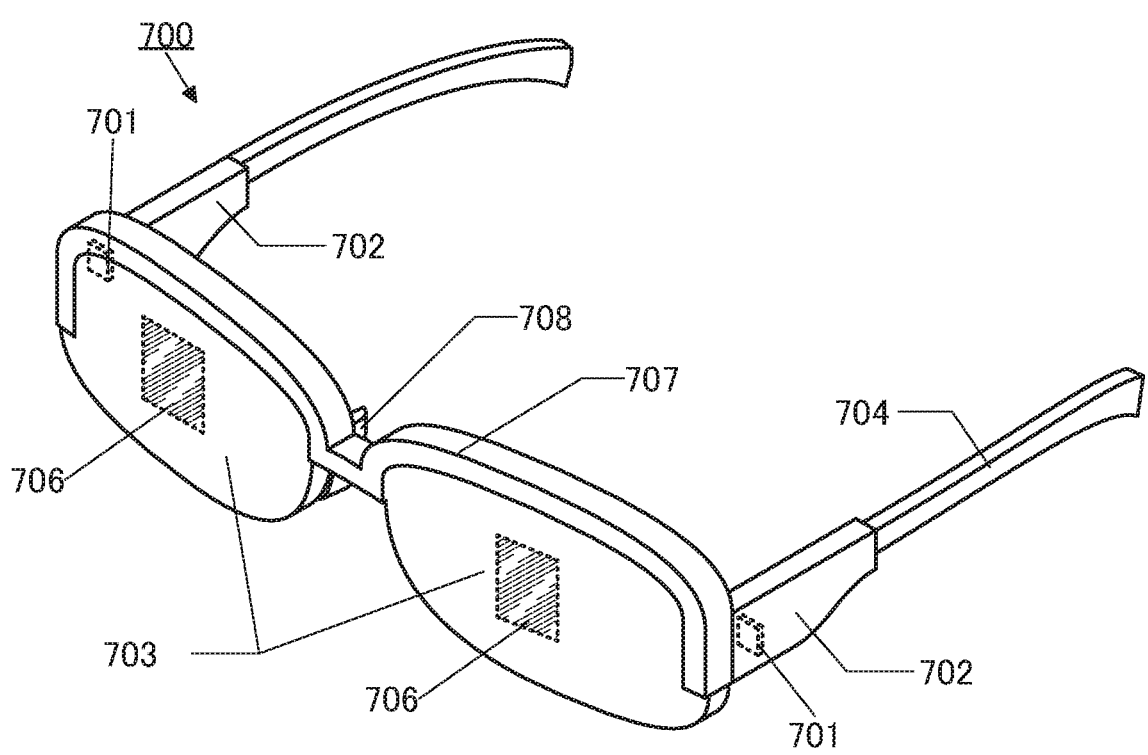
FIGS. 16A and 16B illustrate an example of an electronic device.

FIG. 16A is a perspective view of a glasses-type electronic device 700. The electronic device 700 includes a pair of display panels 701, a pair of housings 702, a pair of optical members 703, a pair of temples 704, a frame 707, a nose pad 708, and the like.

The electronic device 700 can project an image displayed on the display panel 701 onto a display region 706 of the optical member 703. Since the optical members 703 have a light-transmitting property, a user can see images displayed on the display regions 706, which are superimposed on transmission images seen through the optical members 703. Thus, the electronic device 700 is an electronic device capable of AR display.

One or each of the housings 702 may be provided with a camera capable of taking what lies in front thereof The housing 702 may have a wireless communication device, and a video signal or the like can be supplied to the housing 702 by the wireless communication device. Note that instead of or in addition to the wireless communication device, for example, a connector to which a cable for supplying a video signal or a power potential can be connected may be provided. Furthermore, when the housing 702 is provided with an acceleration sensor such as a gyroscope sensor, the orientation of the user's head can be detected and an image corresponding to the orientation can be displayed on the display region 706.

One or each of the housings 702 may be provided with a processor. The processor has a function of controlling the components of the electronic device 700, such as the camera, the wireless communication device, and the pair of display panels 701, a function of generating an image, and the like. The processor may have a function of generating a composite image for AR display.

Data communication with an external device can be performed by the wireless communication device. For example, data that is transmitted from the outside is output to the processor, and the processor can generate image data for AR display on the basis of the data. Examples of the data transmitted from the outside include image data and data having biological information transmitted from a biological sensor device or the like.

A method for projecting an image on the display region 706 of the electronic device 700 is described with reference to FIG. 16B. The display panel 701 is provided inside the housing 702. A reflective plate 712 is provided in the optical member 703, and a reflective surface 713 functioning as a half mirror is provided in a portion corresponding to the display region 706 of the optical member 703.

Light 715 emitted from the display panel 701 is reflected by the reflective plate 712 toward the optical member 703. In the optical member 703, the light 715 is fully reflected repeatedly by surfaces of an edge portion of the optical member 703 and reaches the reflective surface 713, whereby an image is projected on the reflective surface 713. Accordingly, the user can see both the light 715 reflected by the reflective surface 713 and transmitted light 716 that passes through the optical member 703 (including the reflective surface 713).

Figure 16B:
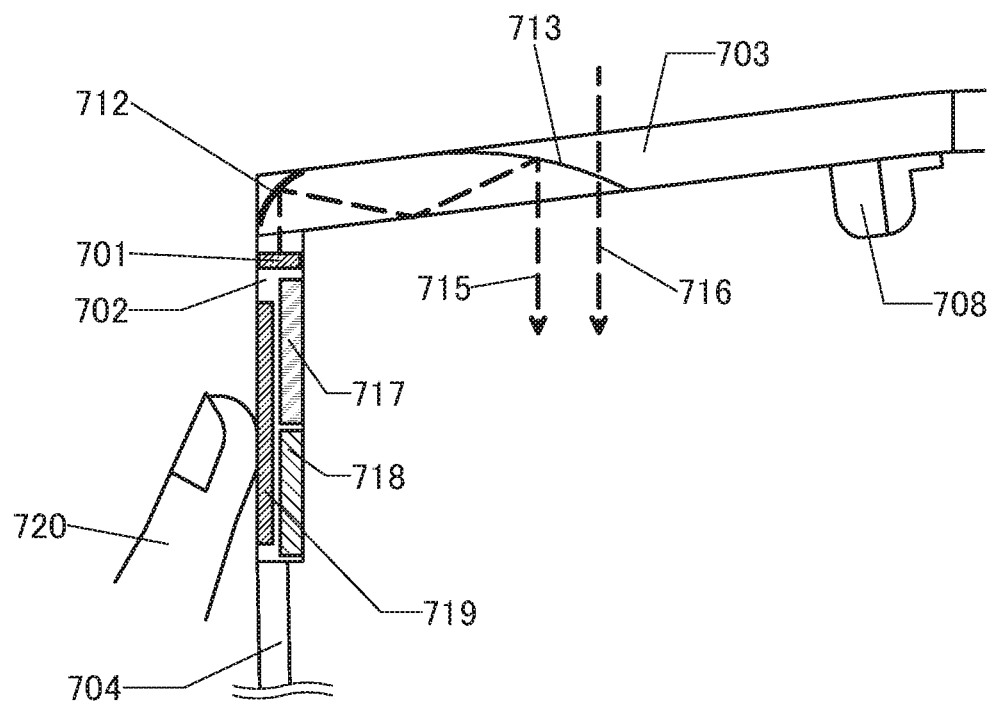

FIGS. 16A and 16B show an example in which the reflective plate 712 and the reflective surface 713 each have a curved surface. This structure can increase optical design flexibility and reduce the thickness of the optical member 703, compared to the case where the reflective plate 712 and the reflective surface 713 are flat. Note that the reflective plate 712 and the reflective surface 713 may be flat.

The reflective plate 712 can be a component having a mirror surface and preferably has high reflectivity. As the reflective surface 713, a half mirror utilizing reflection of a metal film may be used, but the use of a total-reflection prism or the like can increase the transmittance of the transmitted light 716.

Here, the housing 702 may include a lens between the display panel 701 and the reflective plate 712. Here, the housing 702 preferably includes a mechanism for adjusting the distance and angle between the lens and the display panel 701, in which case the focus can be adjusted and images can be zoomed in and out. At least one of the lens and the display panel 701 is preferably configured to be movable in the optical-axis direction, for example.

The housing 702 preferably includes a mechanism capable of adjusting the angle of the reflective plate 712. The position of the display region 706 where images are displayed can be changed by changing the angle of the reflective plate 712. Thus, the display region 706 can be placed at the most appropriate position in accordance with the position of the user's eye.

The housing 702 is preferably provided with a battery 717 and a wireless power supply module 718. With the battery 717, the electronic device 700 can be used without being connected to another battery, leading to high convenience. In addition, with the wireless power supply module 718, power can be charged wirelessly, leading to high convenience and high design property. Furthermore, a risk of failure such as contact failure can be reduced as compared to the case of charging with a wire such as a connector, so that the reliability of the electronic device 700 can be increased. The battery may be provided in the temple 704.

A touch sensor module 719 is provided in the housing 702. The touch sensor module 719 has a function of detecting whether an outer surface of the housing 702 is touched. In FIG. 16B, the surface of the housing 702 is touched with a finger 720. A tap operation, a slide operation, or the like by the user can be detected with the touch sensor module 719, whereby a variety of processing can be executed. For example, processing such as a pause or a restart of a moving image can be executed by a tap operation, and processing such as fast forward or fast rewind can be executed by a slide operation. The touch sensor module 719 is provided in each of the two housings 702, whereby the range of the operation can be increased.

Various touch sensors can be applied to the touch sensor module 719. Any of touch sensors of various types such as a capacitive type, a resistive type, an infrared type, an electromagnetic induction method, a surface acoustic wave type, and an optical type can be employed. In particular, a capacitive sensor or an optical sensor is preferably used for the touch sensor module 719.

In the case of using an optical touch sensor, a photoelectric conversion device (also referred to as a photoelectric conversion element) can be used as a light-receiving device (also referred to as a light-receiving element). Examples of the photoelectric conversion device include a photoelectric conversion device in which an inorganic semiconductor or an organic semiconductor is used in an active layer.

The display unit of one embodiment of the present invention can be used for the display panel 701. Thus, the electronic device 700 capable of extremely-high-resolution display can be provided.

Figure 17A:
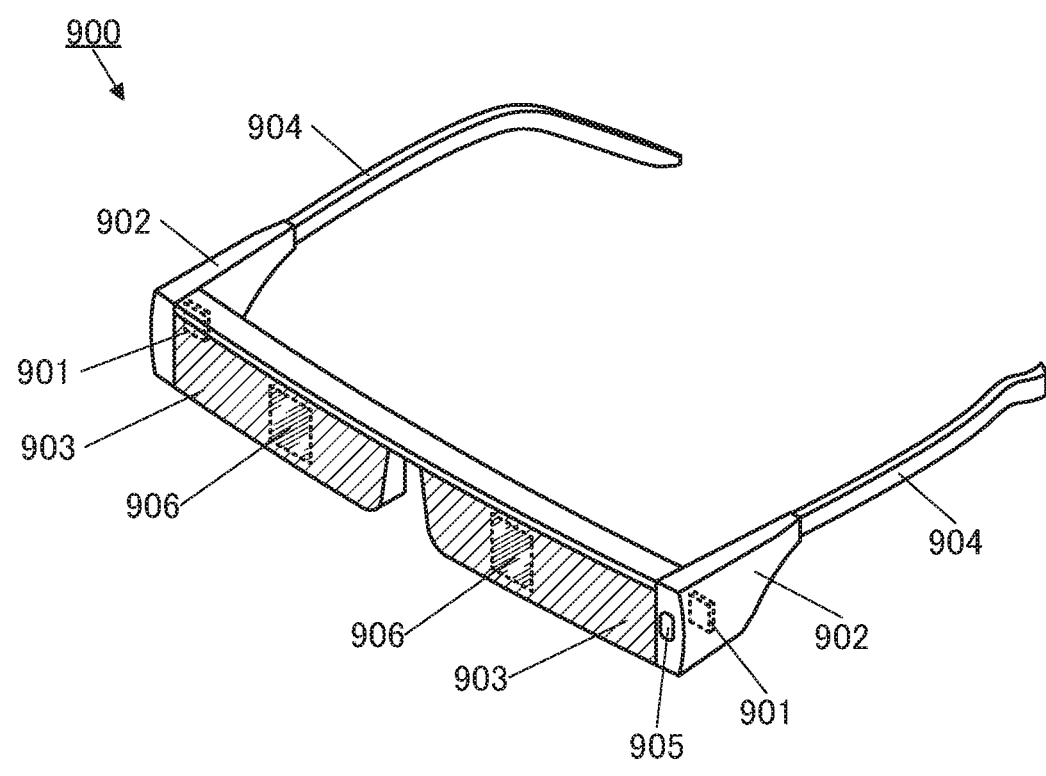
FIGS. 17A and 17B illustrate an example of an electronic device.

FIG. 17A is a perspective view of a glasses-type electronic device 900. The electronic device 900 includes a pair of display panels 901, a pair of housings 902, a pair of optical members 903, a pair of temples 904, and the like.

The electronic device 900 can project an image displayed on the display panel 901 onto a display region 906 of the optical member 903. Since the optical members 903 have a light-transmitting property, a user can see images displayed on the display regions 906, which are superimposed on transmission images seen through the optical members 903. Thus, the electronic device 900 is an electronic device capable of AR display.

The display panel 901 included in the electronic device 900 preferably has a function of taking an image in addition to a function of displaying an image. In that case, the electronic device 900 can receive light incident on the display panel 901 through the optical member 903, convert the light into an electric signal, and output the electric signal. Therefore, an image of the user's eye or the user's eye and the vicinity thereof can be taken and the image can be output to the outside or an arithmetic portion included in the electronic device 900 as image information.

The housings 902 each include a camera 905 capable of taking an image of what lies in front thereof. Although not illustrated, one of the housings 902 is provided with a wireless receiver or a connector to which a cable can be connected, whereby a video signal or the like can be supplied to the housing 902. Furthermore, when the housing 902 is provided with an acceleration sensor such as a gyroscope sensor, the orientation of the user's head can be detected and an image corresponding to the orientation can be displayed on the display region 906. Moreover, the housing 902 is preferably provided with a battery capable of being charged with or without a wire.

Next, a method for projecting an image on the display region 906 of the electronic device 900 is described with reference to FIG. 17B. The display panel 901, a lens 911, and a reflective plate 912 are provided in the housing 902. A reflective surface 913 functioning as a half mirror is provided as a portion corresponding to the display region 906 of the optical member 903.

Light 915 emitted from the display panel 901 passes through the lens 911 and is reflected by the reflective plate 912 toward the optical member 903. In the optical member 903, the light 915 is fully reflected repeatedly by surfaces of an edge portion of the optical member 903 and reaches the reflective surface 913, whereby an image is projected on the reflective surface 913. Accordingly, the user can see both the light 915 reflected by the reflective surface 913 and transmitted light 916 that passes through the optical member 903 (including the reflective surface 913).

Figure 17B:
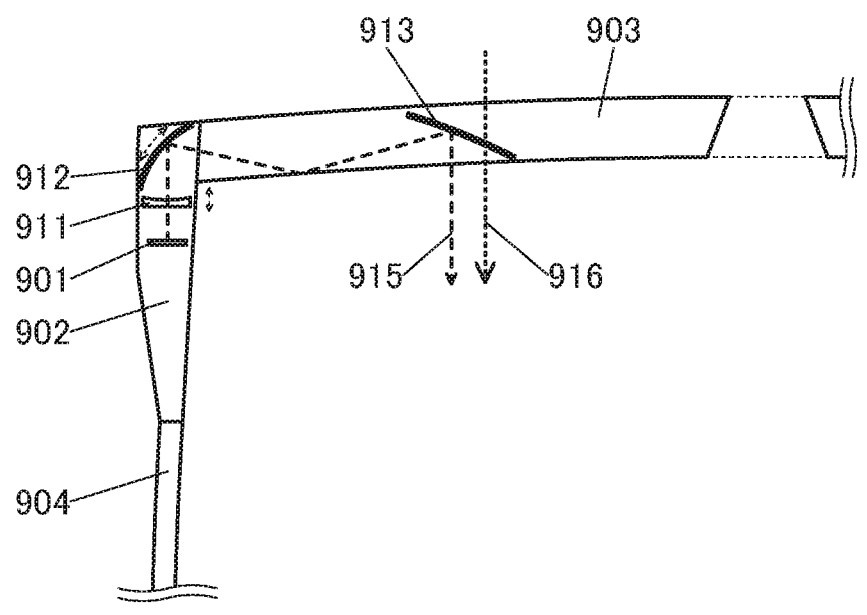

FIGS. 17A and 17B show an example in which the reflective plate 912 and the reflective surface 913 each have a curved surface. This structure can increase optical design flexibility and reduce the thickness of the optical member 903, compared to the case where the reflective plate 912 and the reflective surface 913 are flat. Note that the reflective plate 912 and the reflective surface 913 may be flat.

The reflective plate 912 can be a component having a mirror surface and preferably has high reflectivity. As the reflective surface 913, a half mirror utilizing reflection of a metal film may be used, but the use of a total-reflection prism or the like can increase the transmittance of the transmitted light 916.

Here, the electronic device 900 preferably includes a mechanism for adjusting the distance and/or angle between the lens 911 and the display panel 901, in which case the focus can be adjusted and images can be zoomed in and out, for example. At least one of the lens 911 and the display panel 901 is preferably configured to be movable in the optical-axis direction, for example.

The electronic device 900 preferably includes a mechanism capable of adjusting the angle of the reflective plate 912. The position of the display region 906 where images are displayed can be changed by changing the angle of the reflective plate 912. Thus, the display region 906 can be placed at the most appropriate position in accordance with the position of the user's eye.

The display unit of one embodiment of the present invention can be used for the display panel 901. Thus, the electronic device 900 capable of extremely-high-resolution display can be provided.

Figure 18A:
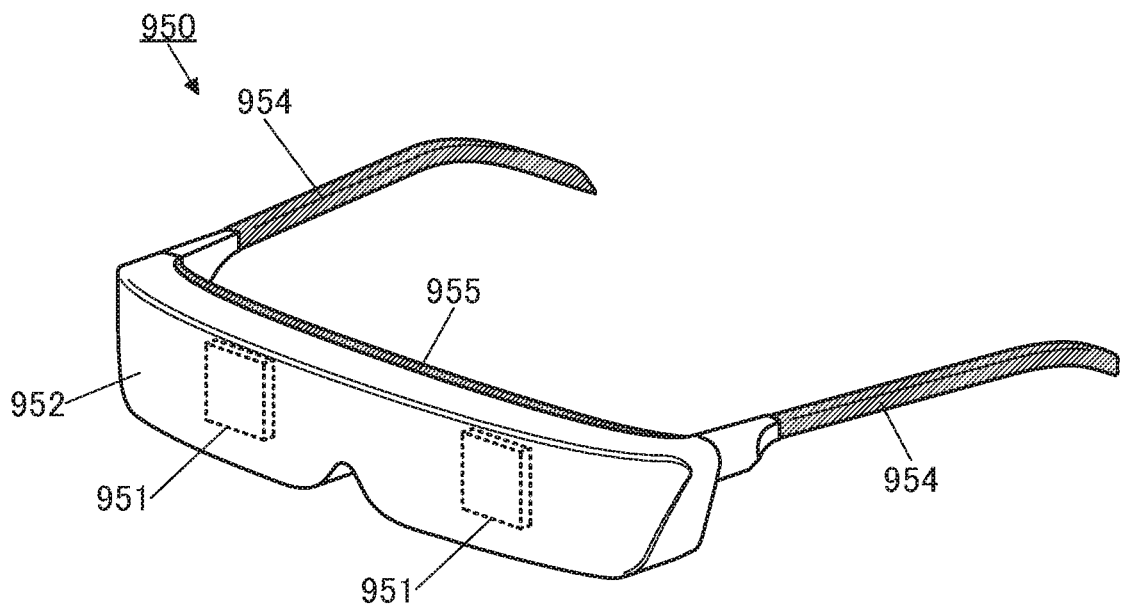
FIGS. 18A and 18B illustrate an example of an electronic device.
Figure 18B:
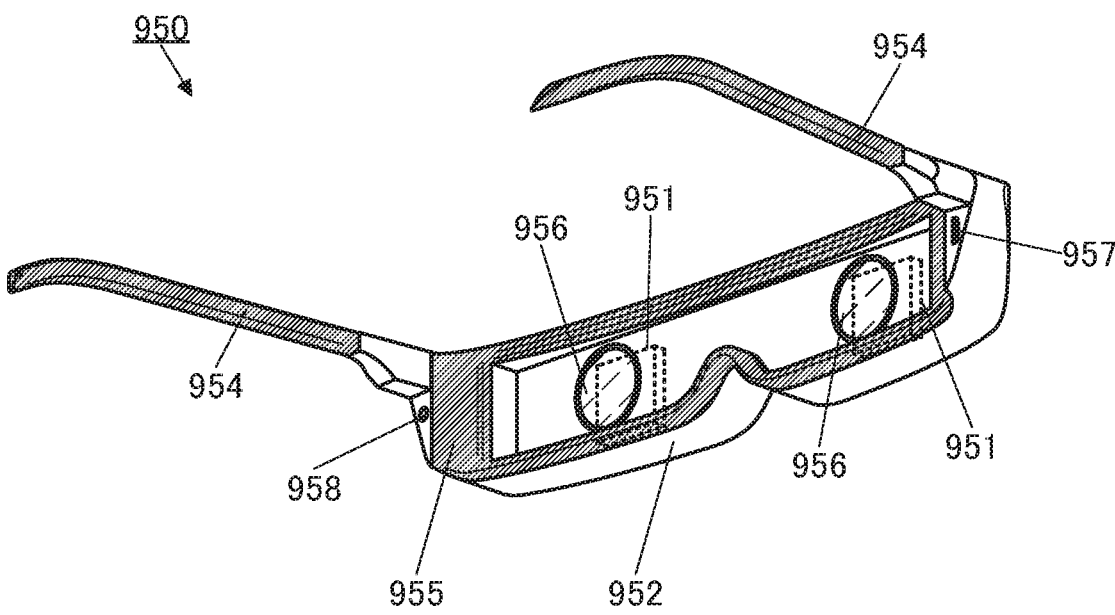

FIGS. 18A and 18B are perspective views of a goggle-type electronic device 950. FIG. 18A is a perspective view illustrating the front surface, the top surface, and the left side surface of the electronic device 950, and FIG. 18B is a perspective view illustrating the back surface, the bottom surface, and the right side surface of the electronic device 950.

The electronic device 950 includes a pair of display panels 951, a housing 952, a pair of temples 954, a cushion 955, a pair of lenses 956, and the like. The pair of display panels 951 is positioned to be seen through the lenses 956 inside the housing 952.

The electronic device 950 is a VR electronic device. A user wearing the electronic device 950 can see an image displayed on the display panel 951 through the lens 956. Furthermore, the pair of display panels 951 may display different images, whereby three-dimensional display using parallax can be performed.

An input terminal 957 and an output terminal 958 are provided on the back side of the housing 952. To the input terminal 957, a cable for supplying a video signal from a video output device or the like, power for charging a battery provided in the housing 952, or the like can be connected. The output terminal 958 can function as, for example, an audio output terminal to which earphones, headphones, or the like can be connected. Note that in the case where audio data can be output by wireless communication or sound is output from an external video output device, the audio output terminal is not necessarily provided.

The electronic device 950 preferably includes a mechanism by which the left and right positions of the lens 956 and the display panel 951 can be adjusted to the optimal positions in accordance with the position of the user's eye. In addition, the electronic device 950 preferably includes a mechanism for adjusting the focal point by changing the distance between the lens 956 and the display panel 951.

The display unit of one embodiment of the present invention can be used for the display panel 951. Thus, the electronic device 950 capable of extremely-high-resolution display can be provided. As a result, a user can obtain a high sense of immersion.

The cushion 955 is in contact with the user's face (forehead, cheek, or the like). The cushion 955 is in close contact with the user's face, so that light leakage can be prevented, which increases the sense of immersion. It is preferable that a soft material be used for the cushion 955 so that the cushion 955 is in close contact with the face of the user wearing the electronic device 950. For example, a material such as silicone rubber, urethane, or sponge can be used. Furthermore, when a sponge or the like whose surface is covered with cloth, leather (natural leather or synthetic leather), or the like is used as the cushion 955, a gap is less likely to be generated between the user's face and the cushion 955, whereby light leakage can be suitably prevented. The member in contact with user's skin, such as the cushion 955 or the temple 954, is preferably detachable, in which case cleaning or replacement can be easily performed.

Figure 19A:
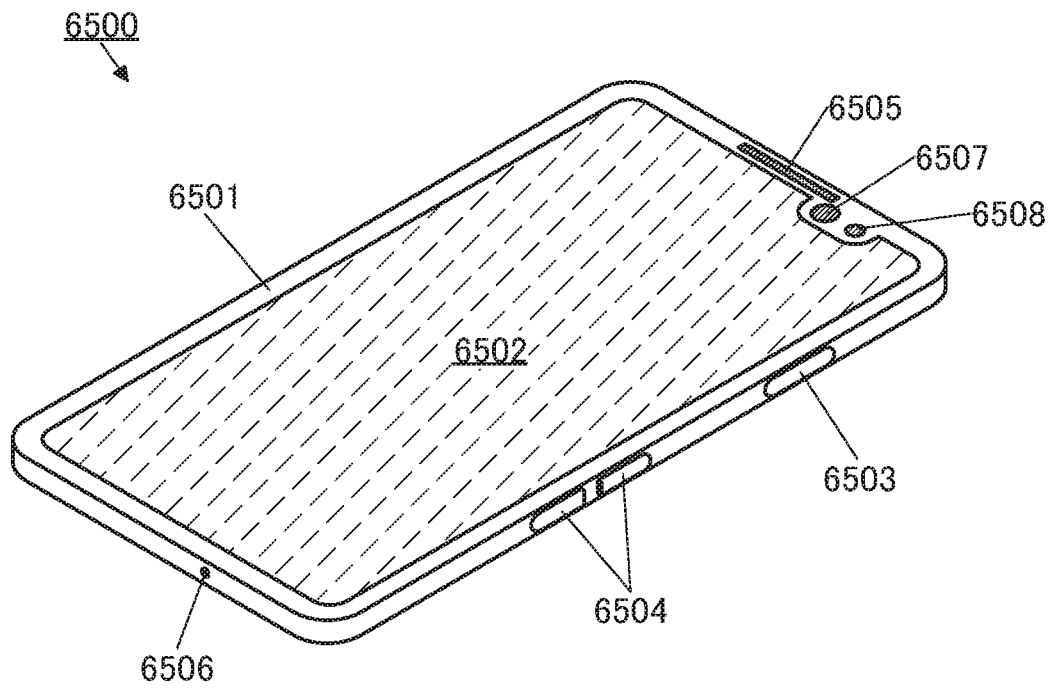
FIGS. 19A and 19B illustrate an example of an electronic device.

An electronic device 6500 illustrated in FIG. 19A is a portable information terminal that can be used as a smartphone.

The electronic device 6500 includes a housing 6501, a display portion 6502, a power button 6503, buttons 6504, a speaker 6505, a microphone 6506, a camera 6507, a light source 6508, and the like. The display portion 6502 has a touch panel function.

The display unit of one embodiment of the present invention can be used for the display portion 6502.

Figure 19B:
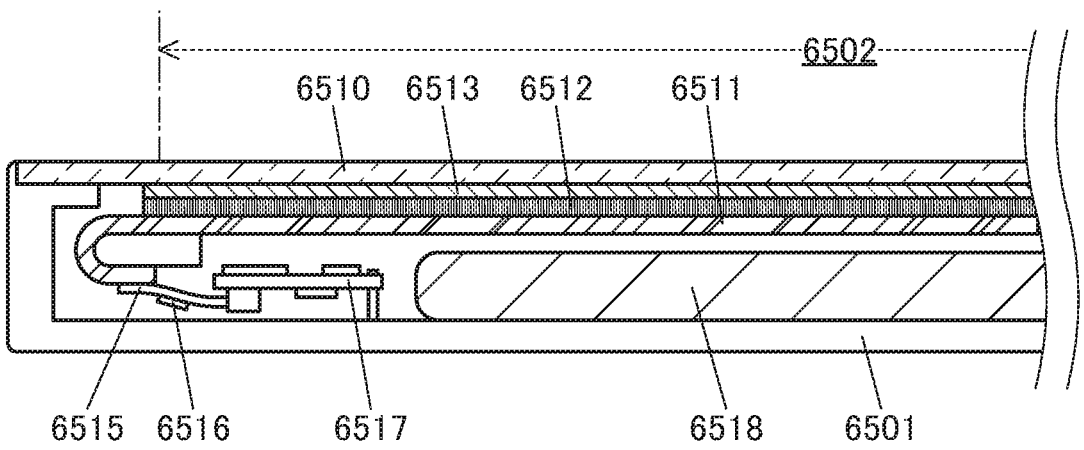

FIG. 19B is a schematic cross-sectional view including an end portion of the housing 6501 on the microphone 6506 side.

A protection member 6510 having a light-transmitting property is provided on a display surface side of the housing 6501, and a display panel 6511, an optical member 6512, a touch sensor panel 6513, a printed circuit board 6517, a battery 6518, and the like are provided in a space surrounded by the housing 6501 and the protection member 6510.

The display panel 6511, the optical member 6512, and the touch sensor panel 6513 are fixed to the protection member 6510 with an adhesive layer (not illustrated).

Part of the display panel 6511 is folded back in a region outside the display portion 6502, and an FPC 6515 is connected to the part that is folded back. An IC 6516 is mounted on the FPC 6515. The FPC 6515 is connected to a terminal provided on the printed circuit board 6517.

A flexible display of one embodiment of the present invention can be used as the display panel 6511. Thus, an extremely lightweight electronic device can be provided. Since the display panel 6511 is extremely thin, the battery 6518 with high capacity can be mounted with the thickness of the electronic device controlled. An electronic device with a narrow frame can be obtained when part of the display panel 6511 is folded back so that the portion connected to the FPC 6515 is positioned on the rear side of a pixel portion.

Figures 20A, 20B, 20C, 20D:
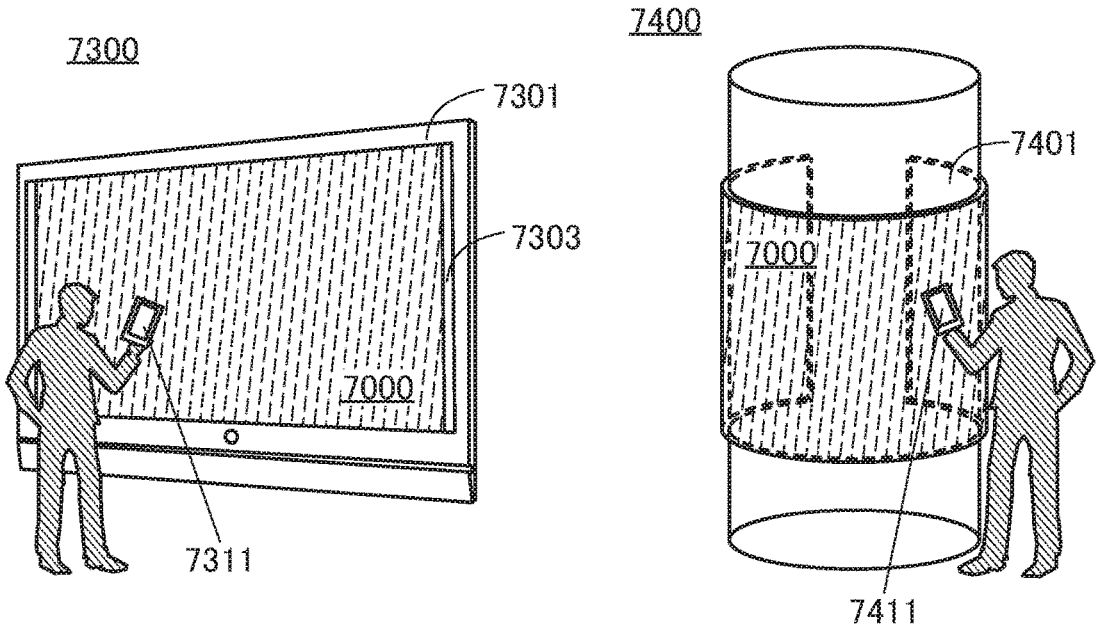
FIGS. 20A to 20D each illustrate an example of an electronic device.

FIG. 20A illustrates an example of a television device. In a television device 7100, a display portion 7000 is incorporated in a housing 7101. Here, a structure in which the housing 7101 is supported by a stand 7103 is illustrated.

The display unit of one embodiment of the present invention can be used for the display portion 7000.

Operation of the television device 7100 illustrated in FIG. 20A can be performed with an operation switch provided in the housing 7101 or a separate remote controller 7111. Alternatively, the display portion 7000 may include a touch sensor, and the television device 7100 may be operated by touch on the display portion 7000 with a finger or the like. The remote controller 7111 may be provided with a display portion for displaying data output from the remote controller 7111. With operation keys or a touch panel provided in the remote controller 7111, channels and volume can be operated and videos displayed on the display portion 7000 can be operated.

Note that the television device 7100 has a structure in which a receiver, a modem, and the like are provided. A general television broadcast can be received with the receiver. When the television device is connected to a communication network with or without wires via the modem, one-way (from a transmitter to a receiver) or two-way (between a transmitter and a receiver or between receivers, for example) data communication can be performed.

FIG. 20B illustrates an example of a laptop personal computer. A laptop personal computer 7200 includes a housing 7211, a keyboard 7212, a pointing device 7213, an external connection port 7214, and the like. In the housing 7211, the display portion 7000 is incorporated.

The display unit of one embodiment of the present invention can be used for the display portion 7000.

FIGS. 20C and 20D show examples of digital signage.

Digital signage 7300 illustrated in FIG. 20C includes a housing 7301, the display portion 7000, a speaker 7303, and the like. Furthermore, the digital signage can include an LED lamp, operation keys (including a power switch or an operation switch), a connection terminal, a variety of sensors, a microphone, and the like.

FIG. 20D is digital signage 7400 attached to a cylindrical pillar 7401. The digital signage 7400 includes the display portion 7000 provided along a curved surface of the pillar 7401.

The display unit of one embodiment of the present invention can be used for the display portion 7000 illustrated in each of FIGS. 20C and 20D.

A larger area of the display portion 7000 can increase the amount of data that can be provided at a time. The larger display portion 7000 attracts more attention, so that the effectiveness of the advertisement can be increased, for example.

The use of a touch panel in the display portion 7000 is preferable because in addition to display of a still image or a moving image on the display portion 7000, intuitive operation by a user is possible. Moreover, for an application for providing information such as route information or traffic information, usability can be enhanced by intuitive operation.

As illustrated in FIGS. 20C and 20D, it is preferable that the digital signage 7300 or the digital signage 7400 can work with an information terminal 7311 or an information terminal 7411 such as a smartphone that a user has through wireless communication. For example, information of an advertisement displayed on the display portion 7000 can be displayed on a screen of the information terminal 7311 or the information terminal 7411. By operation of the information terminal 7311 or the information terminal 7411, display on the display portion 7000 can be switched.

It is possible to make the digital signage 7300 or the digital signage 7400 execute a game with the use of the screen of the information terminal 7311 or the information terminal 7411 as an operation means (controller). Thus, an unspecified number of users can join in and enjoy the game concurrently.

Electronic devices illustrated in FIGS. 21A to 21F include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays), a microphone 9008, and the like.

The electronic devices illustrated in FIGS. 21A to 21F have a variety of functions. For example, the electronic devices can have a function of displaying a variety of data (a still image, a moving image, a text image, and the like) on the display portion, a touch panel function, a function of displaying a calendar, date, time, and the like, a function of controlling processing with the use of a variety of software (programs), a wireless communication function, and a function of reading out and processing a program or data stored in a recording medium. Note that the functions of the electronic devices are not limited thereto, and the electronic devices can have a variety of functions. The electronic devices may include a plurality of display portions. The electronic devices may each include a camera or the like and have a function of taking a still image or a moving image and storing the taken image in a recording medium (an external recording medium or a recording medium incorporated in the camera), a function of displaying the taken image on the display portion, or the like.

The details of the electronic devices illustrated in FIGS. 21A to 21F will be described below.

FIG. 21A is a perspective view showing a portable information terminal 9101. For example, the portable information terminal 9101 can be used as a smartphone. Note that the portable information terminal 9101 may be provided with the speaker 9003, the connection terminal 9006, the sensor 9007, or the like. The portable information terminal 9101 can display characters and image information on its plurality of surfaces. FIG. 21A illustrates an example in which three icons 9050 are displayed. Information 9051 indicated by dashed rectangles can be displayed on another surface of the display portion 9001. Examples of the information 9051 include notification of reception of an e-mail, an SNS message, or an incoming call, the title and sender of an e-mail, an SNS message, or the like, the date, the time, remaining battery, and the radio field intensity. Alternatively, the icon 9050 or the like may be displayed in the position where the information 9051 is displayed.

FIG. 21B is a perspective view showing a portable information terminal 9102. The portable information terminal 9102 has a function of displaying information on three or more surfaces of the display portion 9001. Here, an example in which information 9052, information 9053, and information 9054 are displayed on different surfaces is shown. For example, the user can check the information 9053 displayed in a position that can be observed from above the portable information terminal 9102, with the portable information terminal 9102 put in a breast pocket of his/her clothes. The user can see the display without taking out the portable information terminal 9102 from the pocket and decide whether to answer the call, for example.

FIG. 21C is a perspective view illustrating a watch-type portable information terminal 9200. For example, the portable information terminal 9200 can be used as a smart watch. The display surface of the display portion 9001 is curved and provided, and display can be performed along the curved display surface. Mutual communication between the portable information terminal 9200 and, for example, a headset capable of wireless communication enables hands-free calling. With the connection terminal 9006, the portable information terminal 9200 can perform mutual data transmission with another information terminal and charging. Note that the charging operation may be performed by wireless power feeding.

FIGS. 21D to 21F are perspective views illustrating a foldable portable information terminal 9201. FIG. 21D is a perspective view of an opened state of the portable information terminal 9201, FIG. 21F is a perspective view of a folded state thereof, and FIG. 21E is a perspective view of a state in the middle of change from one of FIG. 21D and FIG. 21F to the other. The portable information terminal 9201 is highly portable in the folded state and is highly browsable in the opened state because of a seamless large display region. The display portion 9001 of the portable information terminal 9201 is supported by three housings 9000 joined by hinges 9055. For example, the display portion 9001 can be folded with a radius of curvature of greater than or equal to 0.1 mm and less than or equal to 150 mm.

This embodiment can be combined with the other embodiments as appropriate.

REFERENCE NUMERALS

ANODE: wiring; CCMG: color conversion layer; CCMR: color conversion layer; CFB: coloring layer; CFG: coloring layer; CFR: coloring layer; COM: wiring; PIX: pixel; SL: signal line; SW21: switch; SW22: switch; 100A: display unit; 100B: display unit; 100C: display unit; 100D: display unit; 100E: display unit; 100F: display unit; 100G: display unit; 100H: display unit; 101: substrate; 102: insulating layer; 103: insulating layer; 104: insulating layer; 105: light-blocking layer; 106: light-blocking layer; 109: base film; 110$a$: light-emitting diode; 110$b$: light-emitting diode; 110$c$: light-emitting diode; 110: light-emitting device; 113$a$: semiconductor layer; 113$b$: semiconductor layer; 113: semiconductor layer; 114$a$: light-emitting layer; 114$b$: light-emitting layer; 114: light-emitting layer; 115$a$: semiconductor layer; 115$b$: semiconductor layer; 115: semiconductor layer; 116$a$: conductive layer; 116$b$: conductive layer; 116$c$: conductive layer; 116$d$: conductive layer; 116$e$: conductive layer; 116$f$: conductive layer; 117$a$: electrode; 117$b$: electrode; 117*c*: electrode; 117*d*: electrode; 117*e*: electrode; 117*f*: electrode; 117: electrode; 120*a*: transistor; 120*b*: transistor; 120*c*: transistor; 130*a*: transistor; 130*b*: transistor; 130*c*: transistor; 131: substrate; 132: element isolation layer; 133: low-resistance region; 134: insulating layer; 135: conductive layer; 136: insulating layer; 137: conductive layer; 138: conductive layer; 139: insulating layer; 141: insulating layer; 142: conductive layer; 143: insulating layer; 150A: LED substrate; 150B: circuit board; 150C: LED substrate; 150D: circuit board; 151: substrate; 152: insulating layer; 161: conductive layer; 162: insulating layer; 163: insulating layer; 164: insulating layer; 165: metal oxide layer; 166: conductive layer; 167: insulating layer; 168: conductive layer; 171: substrate; 172: wiring; 173: insulating layer; 174: electrode; 175: conductive layer; 176: connector; 177: electrode; 178: electrode; 179: adhesive layer; 181: insulating layer; 182: insulating layer; 183: insulating layer; 184*a*: conductive layer; 184*b*: conductive layer; 185: insulating layer; 186: insulating layer; 187: insulating layer; 188: insulating layer; 189*a*: conductive layer; 189*b*: conductive layer; 189*c*: conductive layer; 189*d*: conductive layer; 190*a*: conductive layer; 190*b*: conductive layer; 190*c*: conductive layer; 190*d*: conductive layer; 190*e*: conductive layer; 190*f*: conductive layer; 190: conductive layer; 191: substrate; 192: adhesive layer; 195: conductor; 200: transistor; 205*a*: conductor; 205*b*: conductor; 205*c*: conductor; 205: conductor; 212: insulator; 214: insulator; 216: insulator; 222: insulator; 224: insulator; 230*a*: oxide; 230*b*: oxide; 230: oxide; 240*a*: conductor; 240*b*: conductor; 240: conductor; 241*a*: insulator; 241*b*: insulator; 241: insulator; 242*a*: conductor; 242*b*: conductor; 242: conductor; 243*a*: oxide; 243*b*: oxide; 243: oxide; 246*a*: conductor; 246*b*: conductor; 246: conductor; 250*a*: insulator; 250*b*: insulator; 250: insulator; 260*a*: conductor; 260*b*: conductor; 260: conductor; 271*a*: insulator; 271*b*: insulator; 271: insulator; 275: insulator; 280: insulator; 282: insulator; 283: insulator; 285: insulator; 700: electronic device; 701: display panel; 702: housing; 703: optical member; 704: temple; 706: display region; 707: frame; 708: nose pad; 712: reflective plate; 713: reflective surface; 715: light; 716: transmitted light; 717: battery; 718: wireless power supply module; 719: touch sensor module; 720: finger; 900: electronic device; 901: display panel; 902: housing; 903: optical member; 904: temple; 905: camera; 906: display region; 911: lens; 912: reflective plate; 913: reflective surface; 915: light; 916: transmitted light; 950: electronic device; 951: display panel; 952: housing; 954: temple; 955: cushion; 956: lens; 957: input terminal; 958: output terminal; 6500: electronic device; 6501: housing; 6502: display portion; 6503: power button; 6504: button; 6505: speaker; 6506: microphone; 6507: camera; 6508: light source; 6510: protection member; 6511: display panel; 6512: optical member; 6513 touch sensor panel; 6515: FPC; 6516: IC; 6517: printed circuit board; 6518: battery; 7000: display portion; 7100: television device; 7101: housing; 7103: stand; 7111: remote controller; 7200: laptop personal computer; 7211: housing; 7212: keyboard; 7213: pointing device; 7214: external connection port; 7300: digital signage; 7301: housing; 7303: speaker; 7311: information terminal; 7400: digital signage; 7401: pillar; 7411: information terminal; 9000: housing; 9001: display portion; 9003: speaker; 9005: operation key; 9006: connection terminal; 9007: sensor; 9008: microphone; 9050: icon; 9051: information; 9052: information; 9053: information; 9054: information; 9055: hinge; 9101: portable information terminal; 9102: portable information terminal; 9200: portable information terminal; 9201: portable information terminal.

This application is based on Japanese Patent Application Serial No. 2019-205030 filed with Japan Patent Office on Nov. 12, 2019 and Japanese Patent Application Serial No. 2019-220314 filed with Japan Patent Office on Dec. 5, 2019, the entire contents of which are hereby incorporated by reference.

The invention claimed is:

1. A method for manufacturing a display unit, comprising the steps of:

forming a plurality of transistors in a matrix over a first substrate;

forming a plurality of first conductive layers each of which is electrically connected to at least one of the plurality of transistors, over the plurality of transistors;

forming a plurality of light-emitting diodes in a matrix over a second substrate;

forming a plurality of second conductive layers each of which is electrically connected to at least one of the plurality of light-emitting diodes, over the plurality of light-emitting diodes;

bonding the first substrate and the second substrate by directly bonding each of the plurality of first conductive layers to at least one of the plurality of second conductive layers so that each of the plurality of transistors is electrically connected to at least one of the plurality of light-emitting diodes;

forming a coloring layer over a third substrate;

bonding the first substrate and the second substrate and then separating the second substrate; and bonding the third substrate to a surface exposed by the separation of the second substrate, wherein the plurality of light-emitting diodes do not overlap with the plurality of transistors before bonding the first substrate and the second substrate, and wherein the plurality of light-emitting diodes overlap with the plurality of transistors after bonding the first substrate and the second substrate.

2. The method for manufacturing a display unit, according to claim 1, wherein planarization treatment is performed at least once in the step of forming the plurality of transistors.

3. The method for manufacturing a display unit, according to claim 1, wherein at least one of the plurality of transistors comprises metal oxide in a channel formation region.

4. The method for manufacturing a display unit, according to claim 1, wherein at least one of the plurality of light-emitting diodes is a micro light-emitting diode.

5. A method for manufacturing a display unit, comprising the steps of:

forming a plurality of transistors in a matrix over a first substrate;

forming a plurality of first conductive layers each of which is electrically connected to at least one of the plurality of transistors, over the plurality of transistors;

forming a plurality of light-emitting diodes in a matrix over a second substrate;

forming a plurality of second conductive layers each of which is electrically connected to at least one of the plurality of light-emitting diodes, over the plurality of light-emitting diodes;

bonding the first substrate and the second substrate by directly bonding each of the plurality of first conductive layers to at least one of the plurality of second conductive layers so that each of the plurality of transistors is electrically connected to at least one of the plurality of light-emitting diodes;

forming at least one of a coloring layer, a color conversion layer, and a touch sensor over a third substrate;

bonding the first substrate and the second substrate and then separating the second substrate; and bonding the third substrate to a surface exposed by the separation of the second substrate.

6. A method for manufacturing a display unit, comprising the steps of:

forming a plurality of transistors in a matrix over a first substrate;

forming a plurality of first conductive layers each of which is electrically connected to at least one of the plurality of transistors, over the plurality of transistors;

forming a plurality of light-emitting diodes in a matrix over a second substrate;

forming a plurality of second conductive layers each of which is electrically connected to at least one of the plurality of light-emitting diodes, over the plurality of light-emitting diodes;

bonding the first substrate and the second substrate by directly bonding each of the plurality of first conductive layers to at least one of the plurality of second conductive layers so that each of the plurality of transistors is electrically connected to at least one of the plurality of light-emitting diodes;

forming at least one of a coloring layer, a color conversion layer, and a touch sensor over a third substrate;

polishing the second substrate to reduce a thickness of the second substrate after the first substrate and the second substrate are bonded to each other; and bonding the third substrate to a polished surface of the second substrate.

\* \* \* \* \*